US009853050B2

(12) United States Patent
Kikutani

(10) Patent No.: US 9,853,050 B2
(45) Date of Patent: Dec. 26, 2017

(54) SEMICONDUCTOR MEMORY DEVICE AND METHOD FOR MANUFACTURING THE SAME

(71) Applicant: TOSHIBA MEMORY CORPORATION, Minato-ku (JP)

(72) Inventor: Keisuke Kikutani, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/242,763

(22) Filed: Aug. 22, 2016

(65) Prior Publication Data

US 2017/0263625 A1 Sep. 14, 2017

Related U.S. Application Data

(60) Provisional application No. 62/307,965, filed on Mar. 14, 2016.

(51) Int. Cl.

| | |
|---|---|
| ***H01L 27/115*** | (2017.01) |
| ***H01L 27/11582*** | (2017.01) |
| ***H01L 27/11565*** | (2017.01) |
| ***H01L 23/528*** | (2006.01) |
| ***H01L 27/11556*** | (2017.01) |

(52) U.S. Cl.

CPC .... *H01L 27/11582* (2013.01); *H01L 23/5283* (2013.01); *H01L 27/11556* (2013.01); *H01L 27/11565* (2013.01)

(58) Field of Classification Search

None

See application file for complete search history.

(56) References Cited

U.S. PATENT DOCUMENTS

| | | | | |
|---|---|---|---|---|
| 7,855,457 B2 | 12/2010 | Mizukami et al. | | |
| 8,592,890 B2 | 11/2013 | Watanabe et al. | | |
| 9,397,115 B1 * | 7/2016 | Nozawa | H01L 27/11582 | |
| 2010/0133599 A1 * | 6/2010 | Chae | H01L 27/11578 | 257/315 |
| 2010/0207186 A1 * | 8/2010 | Higashi | H01L 27/11582 | 257/314 |

(Continued)

FOREIGN PATENT DOCUMENTS

| | | |
|---|---|---|
| JP | 2009-16400 | 1/2009 |
| JP | 2012-59966 | 3/2012 |
| JP | 2015-95596 | 5/2015 |

*Primary Examiner* — Benjamin Sandvik

(74) *Attorney, Agent, or Firm* — Oblon, McClelland, Maier & Neusatdt, L.L.P.

(57) ABSTRACT

According to an embodiment, a semiconductor memory device includes a substrate, at least one stacked body, and a first insulating film. The stacked body includes a first end portion positioned at an end in at least one of a first direction and a second direction that crosses the first direction along a surface of the substrate, the plurality of electrode layers being formed into stairs in the first end portion, each of the plurality of electrode layers having a step in the first end portion. The first insulating film is provided on the substrate and includes first and second surfaces, the first and second surfaces surrounding the first end portion, the first surface being crossing a direction that the steps are formed, the second surface being positioned along the direction that the steps are formed.

7 Claims, 49 Drawing Sheets

(56) References Cited

U.S. PATENT DOCUMENTS

| | | | | |
|---|---|---|---|---|
| 2012/0280299 | A1* | 11/2012 | Yun | H01L 27/1157 257/314 |
| 2013/0062683 | A1* | 3/2013 | Fukuzumi | H01L 29/66833 257/324 |
| 2013/0154055 | A1* | 6/2013 | Park | H01L 27/0805 257/532 |
| 2015/0255484 | A1* | 9/2015 | Imamura | H01L 27/11582 257/314 |
| 2016/0148946 | A1* | 5/2016 | Hironaga | H01L 27/11556 257/324 |

* cited by examiner

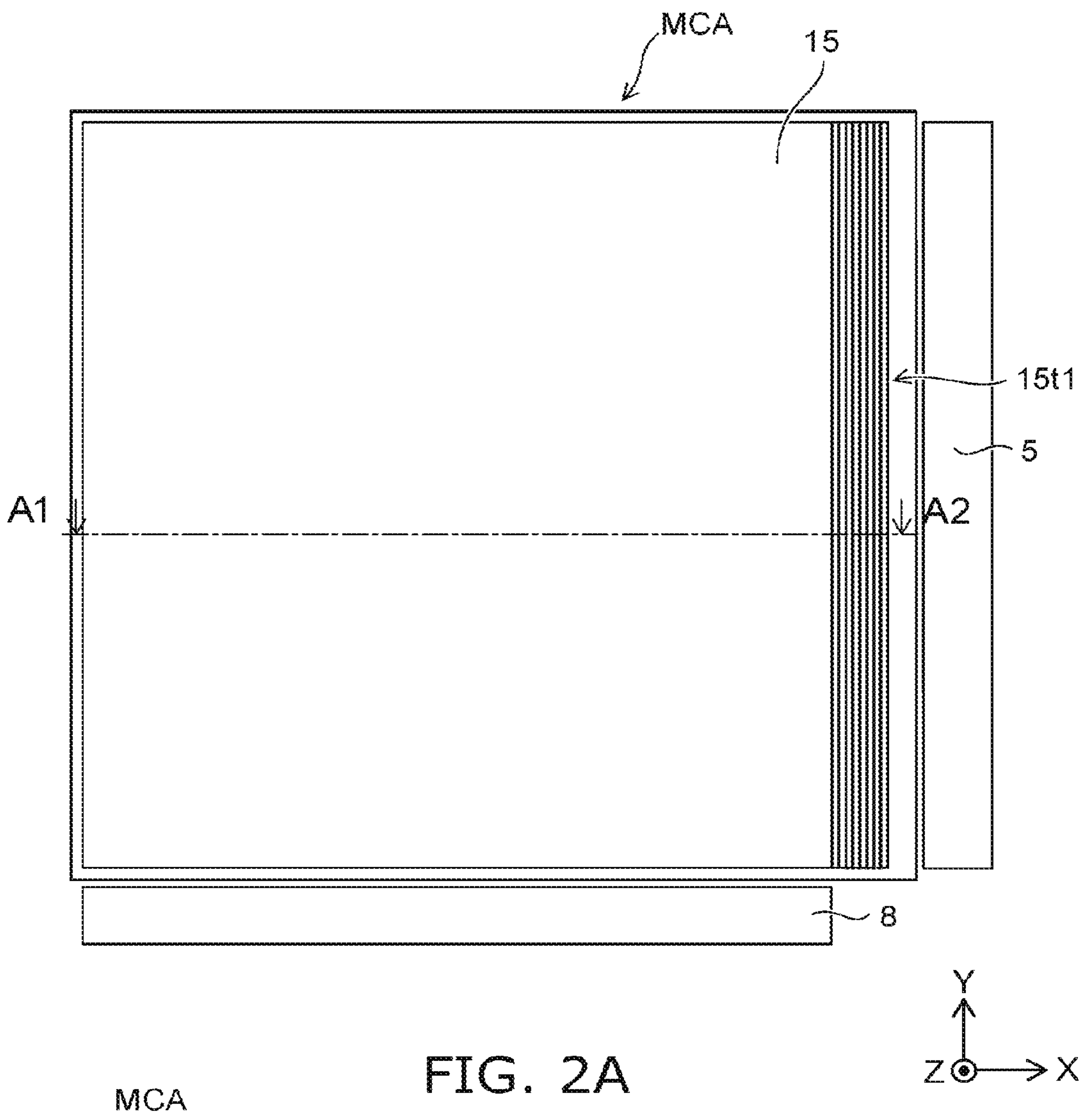
FIG. 2A
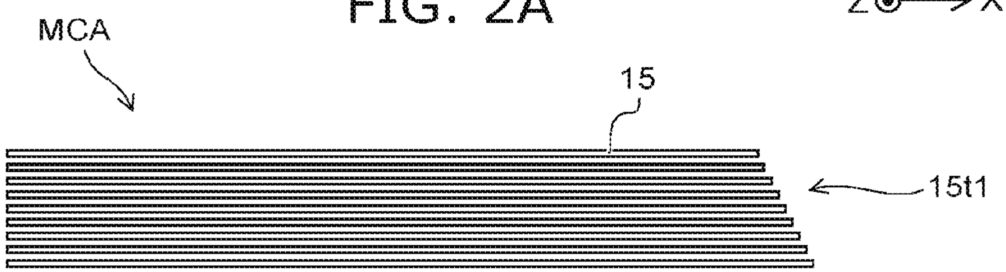
FIG. 2B
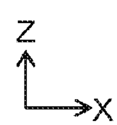

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/307,965 filed on Mar. 14, 2016; the entire contents of which are incorporated herein by reference.

FIELD

Embodiments are generally related to a semiconductor memory device and a method for manufacturing the same.

BACKGROUND

A semiconductor memory device having a three dimensional structure comprises an integrated structure of a memory cell array including a plurality of memory cells and a peripheral circuit. The memory cell array includes a stacked body that includes a plurality of electrode layer each stacked via an insulating layer. Memory holes are formed in the stacked body, and the memory cells are provided in the memory holes. The stacked body has an end portion formed into stairs, and each of the plurality of electrode layers is electrically extracted outward through the end portion. The end portion formed into stairs extends around the stacked body, making a chip surface enlarged. Thus, it is desired to suppress such an enlargement of the chip surface.

BRIEF DESCRIPTION OF THE DRAWINGS

FIGS. 2A and 2B are a plan view and a cross-sectional view showing the semiconductor memory device according to the first embodiment;

FIGS. 5A and 5B to FIGS. 6A and 6B are plan views and cross-sectional views each showing another semiconductor memory device according to the first embodiment;

FIGS. 7A and 7B to FIGS. 23A and 23B are views showing a manufacturing method of the semiconductor memory device according to the first embodiment;

DETAILED DESCRIPTION

According to an embodiment, a semiconductor memory device includes a substrate, at least one stacked body provided on the substrate, and a first insulating film. The stacked body includes a plurality of electrode layers extending in a first direction along a surface of the substrate, the plurality of electrode layers being stacked and separated from each other. The stacked body includes a first end portion positioned at an end in at least one of the first direction and a second direction that crosses the first direction along the surface of the substrate. The plurality of electrode layers are formed into stairs in the first end portion. Each of the plurality of electrode layers has a step in the first end portion. The first insulating film is provided on the substrate and includes first and second surfaces, the first and second surfaces surrounding the first end portion, the first surface being crossing a direction that the steps are formed, the second surface being positioned along the direction that the steps are formed.

Hereinafter, embodiments are described with reference to the drawings. It should be noted that the common elements are denoted with the same numerals in each drawing.

First Embodiment

Figure 1:
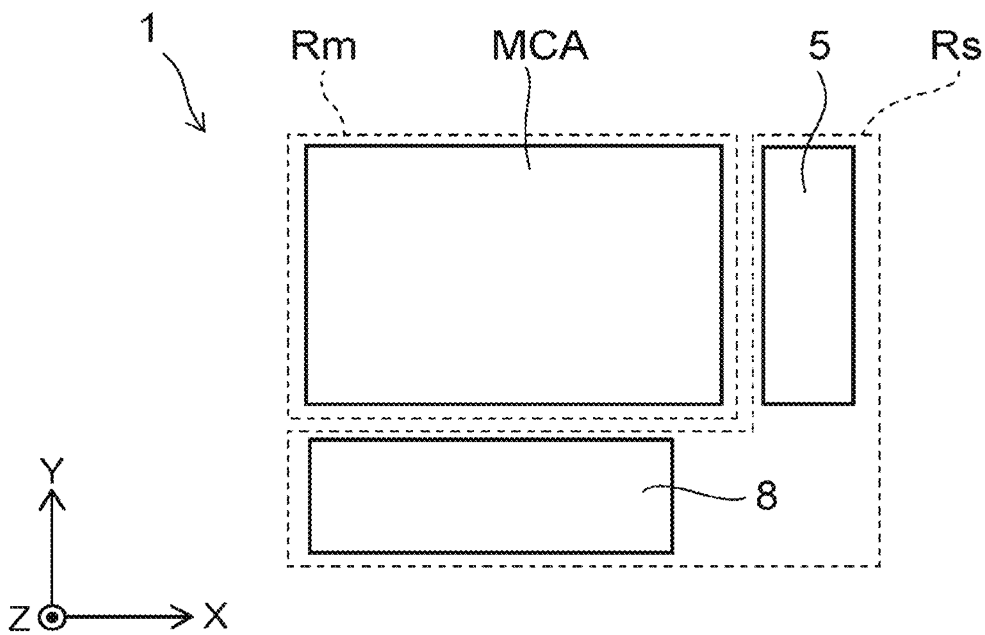
FIG. 1 is a plan view showing a semiconductor memory device according to a first embodiment.

FIG. 1 shows a plan view of a semiconductor memory device 1 according to a first embodiment. FIGS. 2A and 2B show respectively a plan view and a cross-sectional view of the semiconductor memory device 1. FIG. 2A is an enlarged view of a plane shown in FIG. 1. FIG. 2B is a cross-sectional view (the X-Z cross-section) taken along the A1-A2 line in FIG. 2A.

In this specification, a XYZ orthogonal coordinate system is used in the descriptions for convenience. A X-direction and a Y-direction are identified as two directions that are in parallel with a top surface 10*a* of a substrate 10 and orthogonal to each other, and a Z-direction is identified as a direction orthogonal to the X-direction and the Y-direction.

In this specification, "downward" is identified as a direction (e.g. a −Z-direction) toward the substrate 10, and "upward" is identified as a direction (e.g. the Z-direction) away from the substrate 10. A lateral direction is identified as a direction away from a portion of a trench TR. For example, the lateral direction is identified as any one of the X-direction, a reverse direction (a −X-direction) of the X-direction, the Y-direction, and a reverse direction (a −Y-direction) of the Y-direction.

As shown in FIGS. 1 and 2A, a memory region Rm and a peripheral region Rs are provided in the semiconductor memory device 1.

The peripheral region Rs is provided around the memory region Rm. Peripheral circuits such as a low decoder 5 and a sense amplifier 8 are provided in the peripheral region Rs. The low decoder 5 includes a circuit for driving word lines (not shown), which selects a word line WL corresponding to a memory cell MC and supplies a bias to each of the word lines WL. The sense amplifier 8 amplifies a bias of a bit line BL that is connected to the memory cell MC.

A memory cell array MCA is provided in the memory region Rm. As shown in FIGS. 2A and 2B, the memory cell array MCA includes a stacked body 15. The stacked body 15 includes electrode layers 40, which are formed into stairs in an end portion 15*t*1 of the stacked body 15. In the embodiment, the end portion 15*t*1 is positioned at an end in the X-direction.

Figure 3:
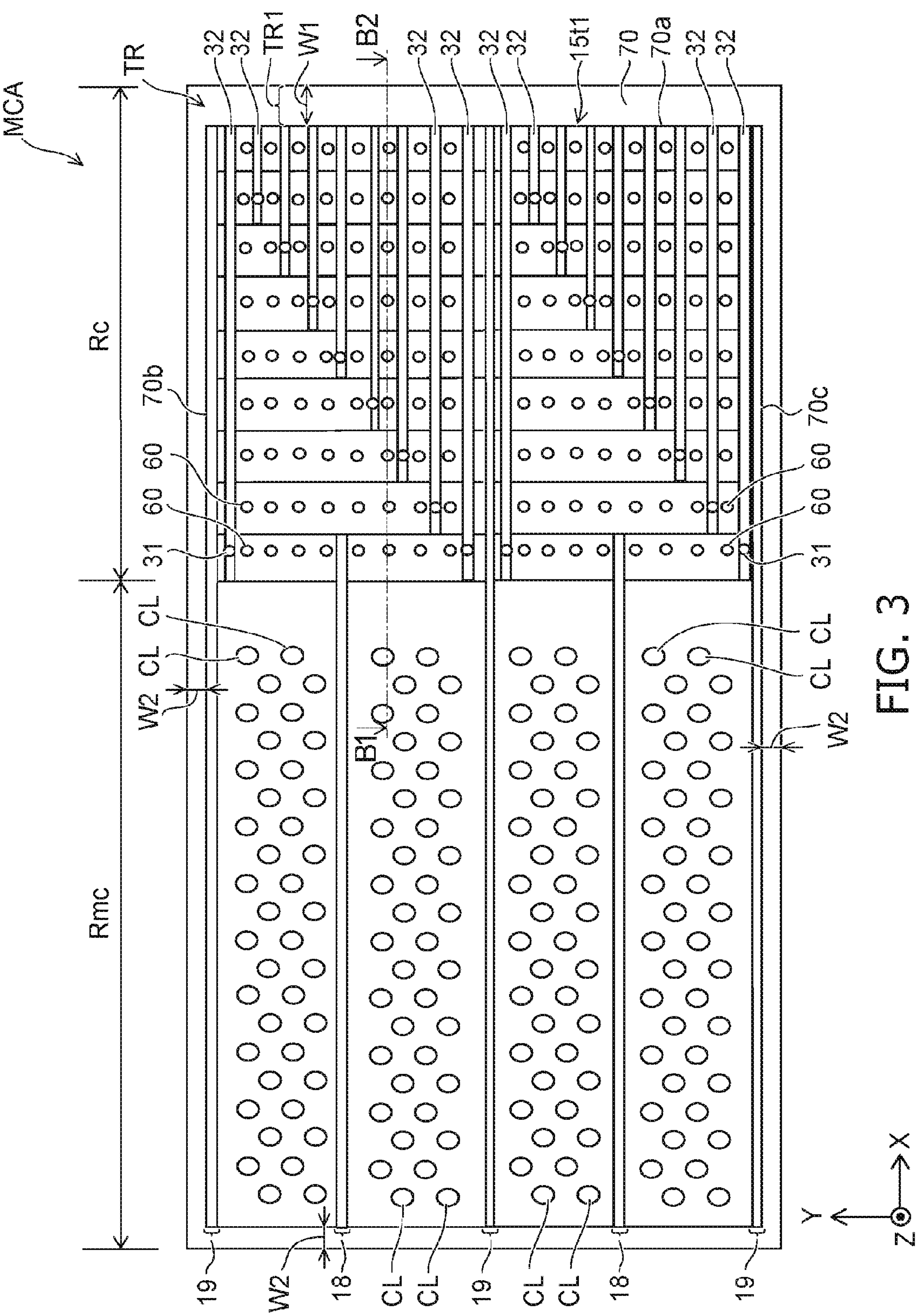
FIG. 3 is a plan view showing a part of the semiconductor memory device according to the first embodiment.
Figure 4:
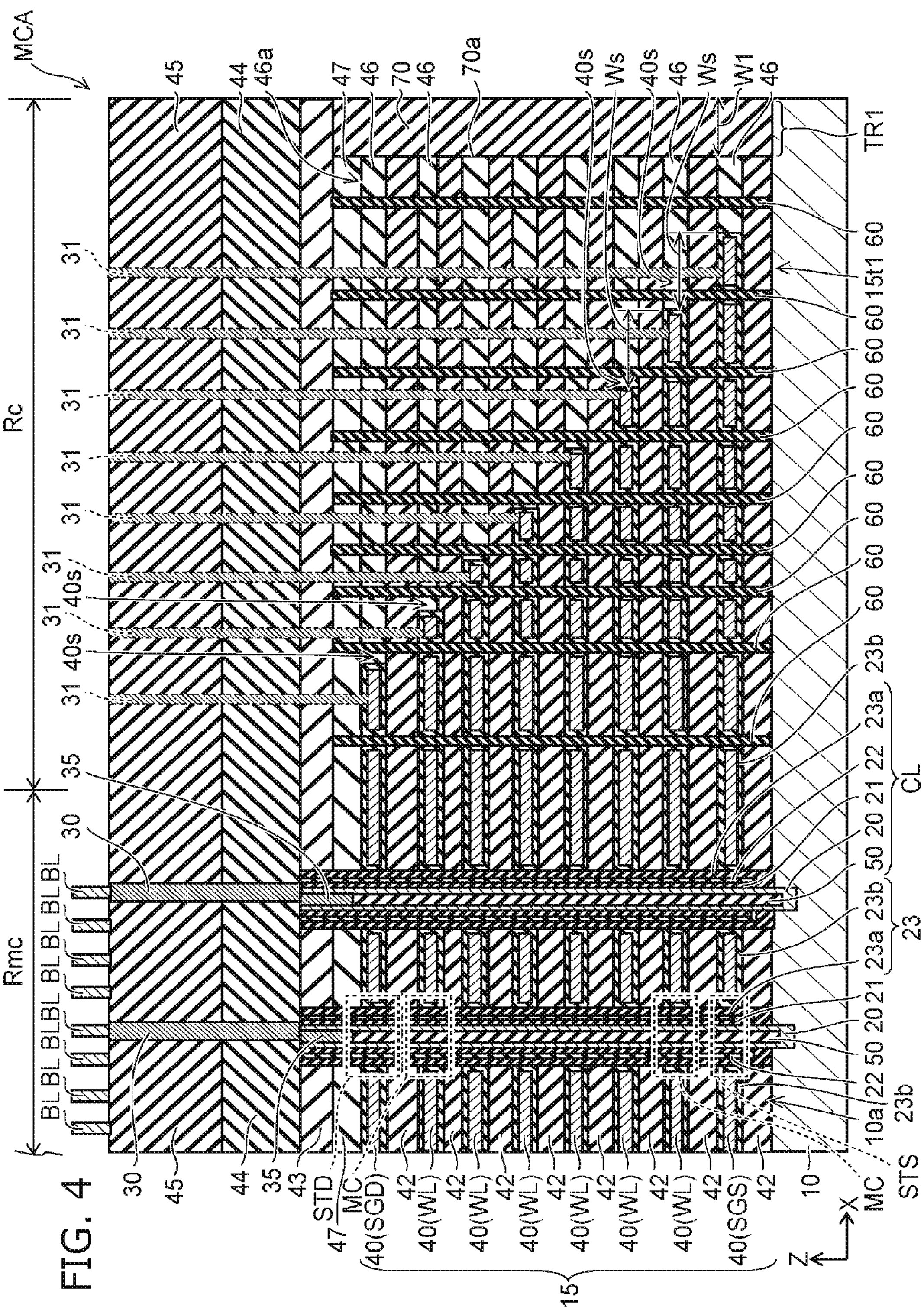
FIG. 4 is a cross-sectional view showing the part of the semiconductor memory device according to the first embodiment.

FIG. 3 shows a plan view of the memory cell array MCA. FIG. 4 is an X-Z cross-sectional view taken along a B1-B2 line in FIG. 3. It should be noted that illustrating bit lines BL is omitted in FIG. 3, and illustrating upper interconnections 32 is omitted in FIG. 4.

As shown in FIGS. 3 and 4, a memory cell region Rmc and a contact region Rc are provided in the memory cell array MCA. The memory cell region Rmc and the contact region Rc are disposed in the X-direction.

A stacked body 15 and columnar bodies CL are provided in the memory cell region Rmc.

The stacked body 15 is provided on the substrate 10 such as a silicon substrate and the like. A plurality of insulating layers 42 and a plurality of electrode layers 40 are stacked alternately on a layer to layer base in the Z-direction. The insulating layer 42 includes silicon oxide ($SiO_2$), for example. The electrode layer 40 includes a metal such as tungsten (W) and like.

The uppermost electrode layer 40 is a selection gate SGD on a drain side, and the lowermost electrode layer 40 is a selection gate SGS on a source side. The electrode layer 40 positioned between the uppermost electrode layer 40 and the lowermost electrode layer 40 is a word line WL. In addition, the number of stacked electrode layers 40 is defined arbitrarily.

An insulating layer 47 is provided on the stacked body 15. An insulating layer 43 is provided on the insulating layer 47. The insulating layers 43 and 47 include, for example, silicon oxide.

A plurality of columnar bodies CL are provided in the stacked body 15. The columnar body CL extends in the Z-direction in the stacked body 15. The columnar body CL is formed into a shape like a circular cylinder or an elliptic cylinder. The plurality of columnar bodies CL are disposed in a grid arrangement or a staggered arrangement in the X-Y plane.

As shown in FIG. 4, the columnar body CL includes a core 50, a semiconductor body 20, a tunneling insulator film 21, a charge storage film 22, and an oxide film 23*a*. For example, the core 50 includes silicon oxide ($SiO_2$), and has a shape like a circular cylinder.

The semiconductor body 20 is provided around the core 50. The semiconductor body 20 includes silicon, for example, polycrystalline silicon made by the crystallization of amorphous silicon.

A plug portion 35 is provided on the top end of the core 50. The plug portion 35 is positioned in the insulating layers 43 and 47, and is surrounded by the semiconductor body 20. For example, the plug portion 35 is made of the same material as the semiconductor body 20.

The tunneling insulator film 21 is provided around the semiconductor body 20. The tunneling insulator film 21 includes, for example, silicon oxide. The tunneling insulator film 21 has a shape like a circular cylinder, for example.

The charge storage film 22 is provided around the tunneling insulator film 21. The charge storage film 22 includes, for example, silicon nitride ($Si_3N_4$). The charge storage film 22 has a shape like a circular cylinder, for example. The memory cell MC that includes the charge storage film 22 is provided at an intersection portion of the semiconductor body 20 and the word line WL.

The tunneling insulator film 21 acts as a potential barrier between the semiconductor body 20 and the charge storage film 22. Electric charges tunnel through the tunneling insulator film 21, when the electric charges move from the semiconductor body 20 to the charge storage film 22 (i.e. Data writing) and move from the charge storage film 22 to the semiconductor body 20 (i.e. Data erasing).

The charge storage film 22 includes trapping sites that capture the electric charges. A threshold value of the memory cell MC changes depending on the presence or absence of the electric charges captured in the trapping sites, and on the amount of the electric charges captured in the trapping sites. Thereby, information is stored in the memory cell MC.

The oxide film 23*a* is provided around the charge storage film 22. The oxide film 23*a* includes, for example, silicon oxide. The oxide film 23*a* protects the charge storage film 22 from an etching for forming the electrode layers 40.

An oxide film 23*b* is provided around the oxide film 23*a*. The oxide film 23*b* is also provided between the electrode layer 40 and the insulating layer 42. The oxide film 23*b* includes, for example, aluminum oxide ($Al_2O_3$). The oxide film 23*a* and the oxide film 23*b* make up a blocking insulator film 23.

An insulating layer 44 is provided on the columnar body CL and the insulating layer 43. The insulating layer 45 is provided on the insulating layer 44. The insulating layers 44 and 45 include, for example, silicon oxide. The contact plug 30 is positioned in the insulating layers 44 and 45.

A plurality of bit lines BL, which extend in the Y-direction, are provided on the insulating layer 45. A top end of the contact plug 30 is connected to the bit line BL, and a bottom end thereof is connected to the plug portion 35. Thereby, a top end of the columnar body CL is connected via the contact plug 30 to one of the plurality of bit lines BL.

A selection transistor STD on the drain side is provided at an intersection portion of the selection gate SGD on the drain side and the columnar body CL, and a selection transistor STS on the source side is provided at an intersection portion of the selection gate SGS on the source side and the columnar body CL. The memory cell MC is provided at an intersection portion of the word line WL and the columnar body CL.

The selection gate SGD on the drain side acts as a gate of the selection transistor STD on the drain side, and the selection gate SGS on the source side acts as a gate of the selection transistor STS on the source side. The word line WL acts as a gate of the memory cell MC, and a part of the columnar body CL acts as a channel of the memory cell MC. A plurality of memory cells MC are connected in series via the columnar body CL between the selection transistor STD on the drain side and the selection transistor STS on the source side.

As shown in FIG. 3, a plurality of slits 19 are provided in the stacked body 15. The slit 19 extends in the Z-direction and the X-direction, and include, for example, a metal such as tungsten or the like. The bottom end of the slit 19 contacts the substrate 10. An insulating film (not shown), which extends along the Z-direction and the X-direction, is provided on the side wall of the slit 19, and insulates each electrode layer 40 of the stacked body 15 from the slit 19.

A plurality of slits 18 are provided in the stacked body 15. The slit 18 extends in the Z-direction and the X-direction. The slit 18 divides only the selection gate SGD on the drain side that is the uppermost layer.

An insulating layer (not shown) is provided in the slit 18.

For example, the slit 19 and the slit 18 are alternately disposed along the Y-direction.

The plurality of electrode layers 40 of the stacked body 15 are formed into stairs in the contact region Rc. A step 40*s* is formed in each of the plurality of electrodes 40. Each step 40*s* has almost the same width Ws in the X-direction. Insulating layers 46 and insulating layers 42 are alternately stacked on a layer to layer base to cover the stairs of the plurality of electrode 40. The uppermost insulating layer 46 is almost in plane with the uppermost electrode layer 40 (i.e.

the selection gate SGD on the drain side), and the top surface 46*a* thereof is plat. The insulating layer 46 includes, for example, silicon oxide.

A plurality of columnar members 60 are in the stacked body 15, and are disposed along the X-direction and the Y-direction, for example. Some of the columnar members 60 are provided on each step 40*s*, and are disposed along the Y-direction. In the example shown in FIG. 3, eight columnar members 60 are disposed along the Y-direction in each step 40*s*. The columnar member 60 pierces the stacked body 15 and the insulating layers 42, 46, 47 in the Z-direction; and the bottom end thereof is provided in the substrate 10. The columnar member 60 is formed into a shape like a circular cylinder or an elliptic cylinder. The columnar member 60 includes, for example, silicon oxide.

The insulating layer 47 is provided on the stacked body 15 and the uppermost insulating layer 46, and the insulating layer 43 is provided on the insulating layer 47.

A contact plug 31 is provided on the step 40*s*. The contact plug 31 extends in the Z-direction and pierces the insulating layers 42, 43, 44, 45, 46 and 47. The contact plug 31 is provided in the vicinity of the columnar member 60. The bottom end of the contact plug 31 is connected to the electrode layer 40. A plurality of contact plugs 31, each of which is connected to the different electrode layer 40, are disposed at a different position from each other in the Y-direction.

As shown in FIG. 3, a plurality of upper interconnections 32 extending in the X-direction are provided on the insulating layer 45. The top end of the contact plug 31 is connected to the upper interconnection 32. The electrode layer 40 is connected via the contact plug 31 to the upper interconnection 32. Thereby, it becomes possible to supply the prescribed bias to the electrode layer 40.

The upper interconnection 32 is connected to the low decoder 5 (see FIG. 1) in the peripheral region Rc. In the contact region Rc, the electrode layer 40 is electrically extracted from the memory cell region Rmc. The electrode layer 40 is connected via the contact plug 31 and the upper interconnection 32 to the low decoder 5 in the peripheral region Rs.

As shown in FIGS. 3 and 4, a trench TR is provided in a periphery of the memory cell array MCA. The trench TR includes a wide part TR1 extending in the Y-direction in the vicinity of the end portion 15*t*1 of the stacked body 15. The end portion 15*t*1 is equivalent to a portion of the stacked body 15 in which the electrode layers 40 are formed into the stairs. In the trench TR, a width W1 of the wide part TR1 is larger than a width W2 of a portion other than the wide part TR1. It is enough for the trench TR to surround the end portion 15*t*1.

An insulating film 70 is provided in the trench TR. The insulating film 70 includes, for example, silicon oxide. In the example shown in FIGS. 3 and 4, the insulating film 70 includes the lateral surfaces 70*a*, 70*b* and 70*c*. The lateral surfaces 70*a*, 70*b* and 70*c* of the insulating film 70 surround the end portion 15*t*1 of the stacked body 15.

Hereinafter, a variation of the first embodiment is described.

Figure 5A:
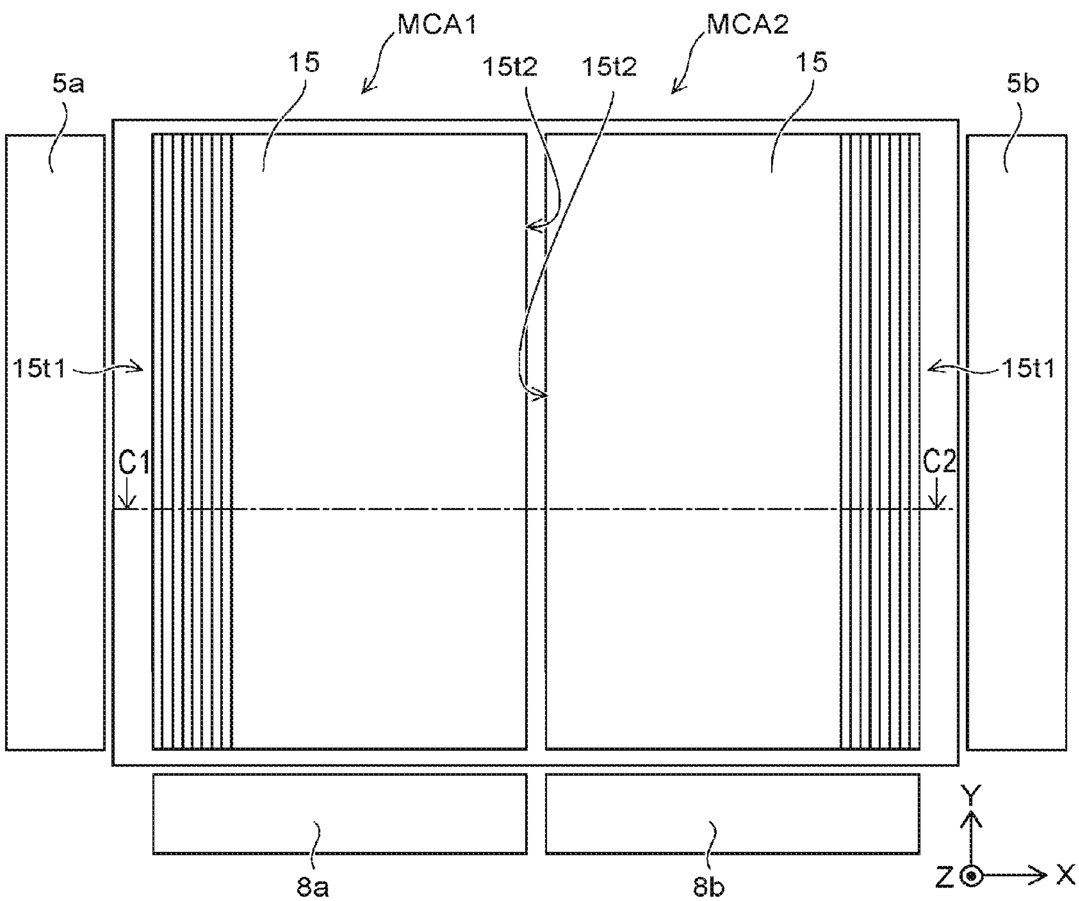
Figure 5B:
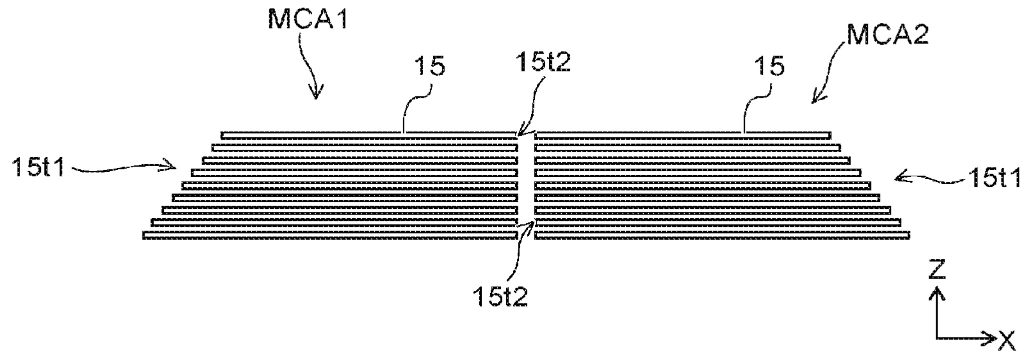
Figure 6A:
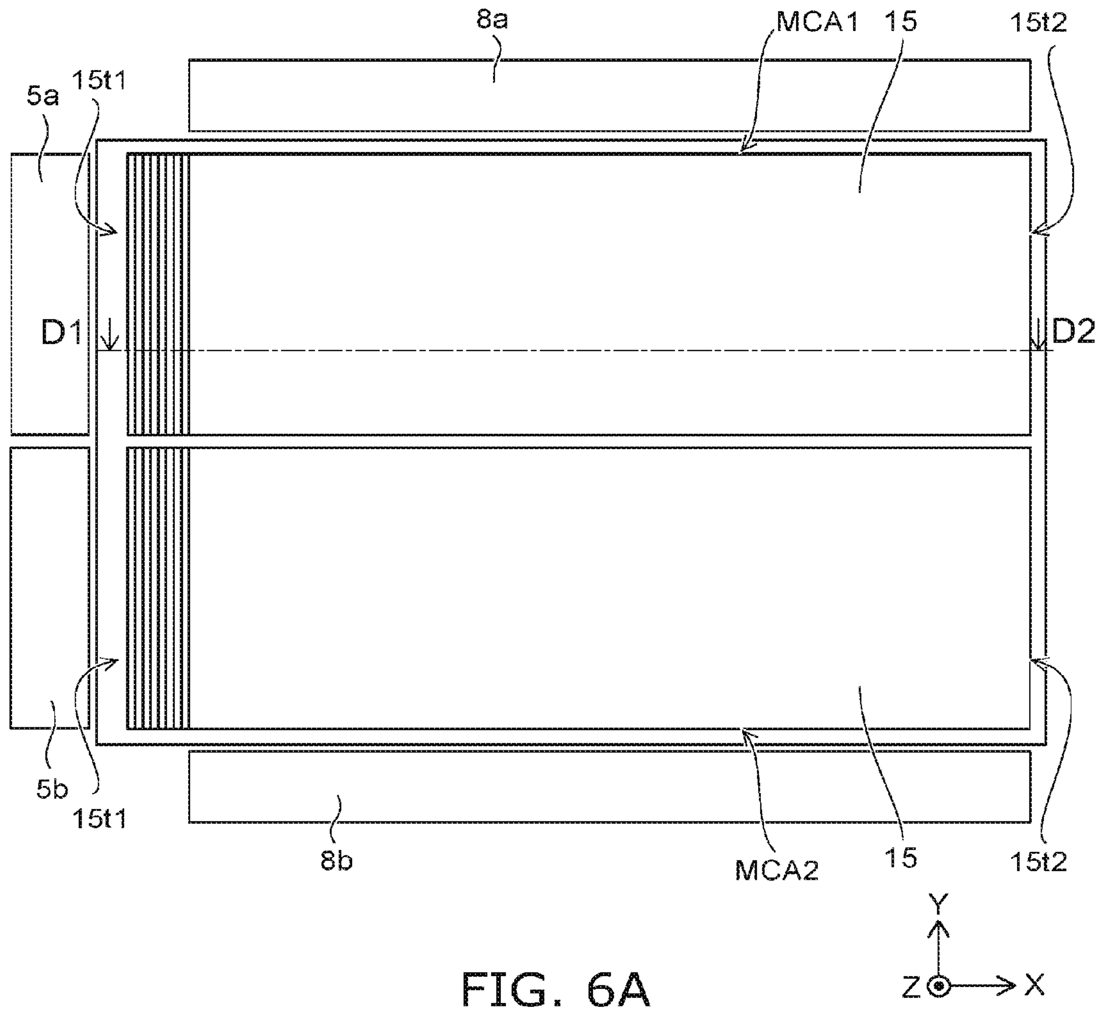

FIGS. 5A and 5B to FIGS. 6A and 6B are plan views and cross-sectional views each showing another semiconductor memory device 1 according to the first embodiment. FIGS. 5A and 6A are plan views of the region shown in FIG. 2A. In FIG. 5B, a cross-sectional view (the X-Z cross-section) taken along C1-C2 line in FIG. 5A is shown; and in FIG. 6B, a cross-sectional view (the X-Z cross-section) taken along D1-D2 line in FIG. 6A is shown.

As shown in FIGS. 5A and 5B, memory cell arrays MCA1 and MCA2 are provided in the memory region. Low decoders 5*a* and 5*b*, and, sense amplifiers 8*a* and 8*b* are provided in the peripheral region. The low decoder 5*a* and the sense amplifier 8*a* are electrically connected to the memory cell array MCA1; and the low decoder 5*b* and sense amplifier 8*b* are electrically connected to the memory cell array MCA2.

The memory cell array MCA1 includes a stacked body 15. Electrode layers 40 are formed into stairs in the end portion 15*t*1 of the stacked body 15. In this example, the end portion 15*t*1 is positioned at an end in a reverse direction of the X-direction. An end portion 15*t*2 of the stacked body 15 is positioned at an end in the X-direction, and the electrode layers 40 are not formed into stairs in the end portion 15*t*2.

The memory cell array MCA2 includes a stacked body 15. Electrode layers 40 are formed into stairs in the end portion 15*t*1 of the stacked body 15. In this example, the end portion 15*t*1 is positioned at an end in the X-direction. An end portion 15*t*2 of the stacked body 15 is positioned at an end in the reverse direction of the X-direction, and the electrode layers 40 are not formed into stairs in the end portion 15*t*2.

The end portion 15*t*2 of the stacked body 15 in the memory cell array MCA1 faces the end portion 15*t*2 of the stacked body 15 in the memory cell array MCA2.

Figure 6B:
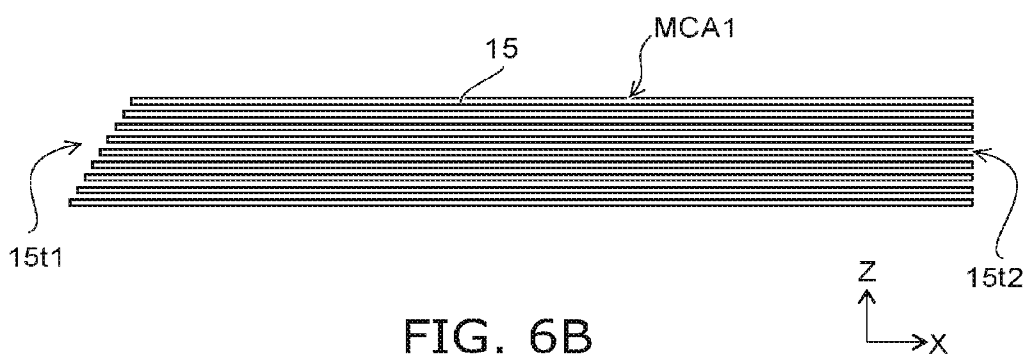

As shown in FIGS. 6A and 6B, memory cell arrays MCA1 and MCA2 are provided in the memory region. Low decoders 5*a*, 5*b*, and, sense amplifiers 8*a* and 8*b* are provided in the peripheral region. The low decoder 5*a* and the sense amplifier 8*a* are electrically connected to the memory cell array MCA1; and the low decoder 5*b* and sense amplifier 8*b* are electrically connected to the memory cell array MCA2.

The memory cell arrays MCA1 and MCA2 each include the stacked body 15. The electrode layers 40 are formed into stairs in the end portion 15*t*1 of each of the stacked bodies 15. In this example, the end portion 15*t*1 is positioned at an end in the reverse direction of the X-direction. The end portion 15*t*2 of each stacked body 15 is positioned at an end in the X-direction; and the electrodes 40 are not formed into stairs in the end portion 15*t*2.

Hereinafter, a manufacturing method of the semiconductor memory device according to the first embodiment is described.

FIGS. 7A and 7B to FIGS. 23A and 23B are views showing the manufacturing method of the semiconductor memory device according to the first embodiment.

In FIGS. 7A to 23A and FIGS. 7B to 23B, plan views and cross-sectional views are shown respectively, which show the manufacturing method of the memory cell array MCA of the semiconductor memory device 1. Planes in FIG. 7A to 23A are equivalent to the plane shown in FIG. 3; and cross-sections in FIGS. 7B to 23B are equivalent to the cross-section shown in FIG. 4.

Figure 7A:
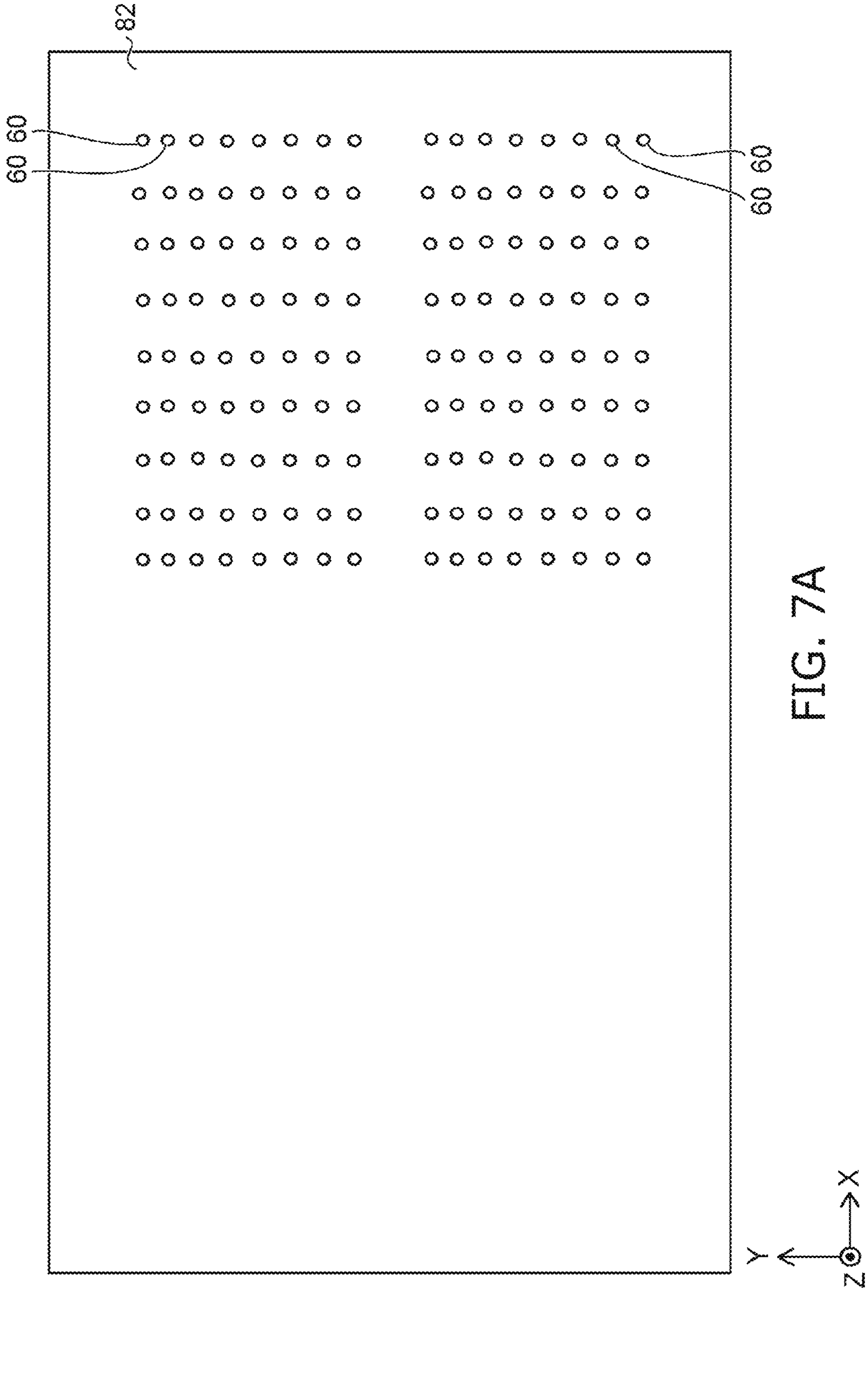
Figure 7B:
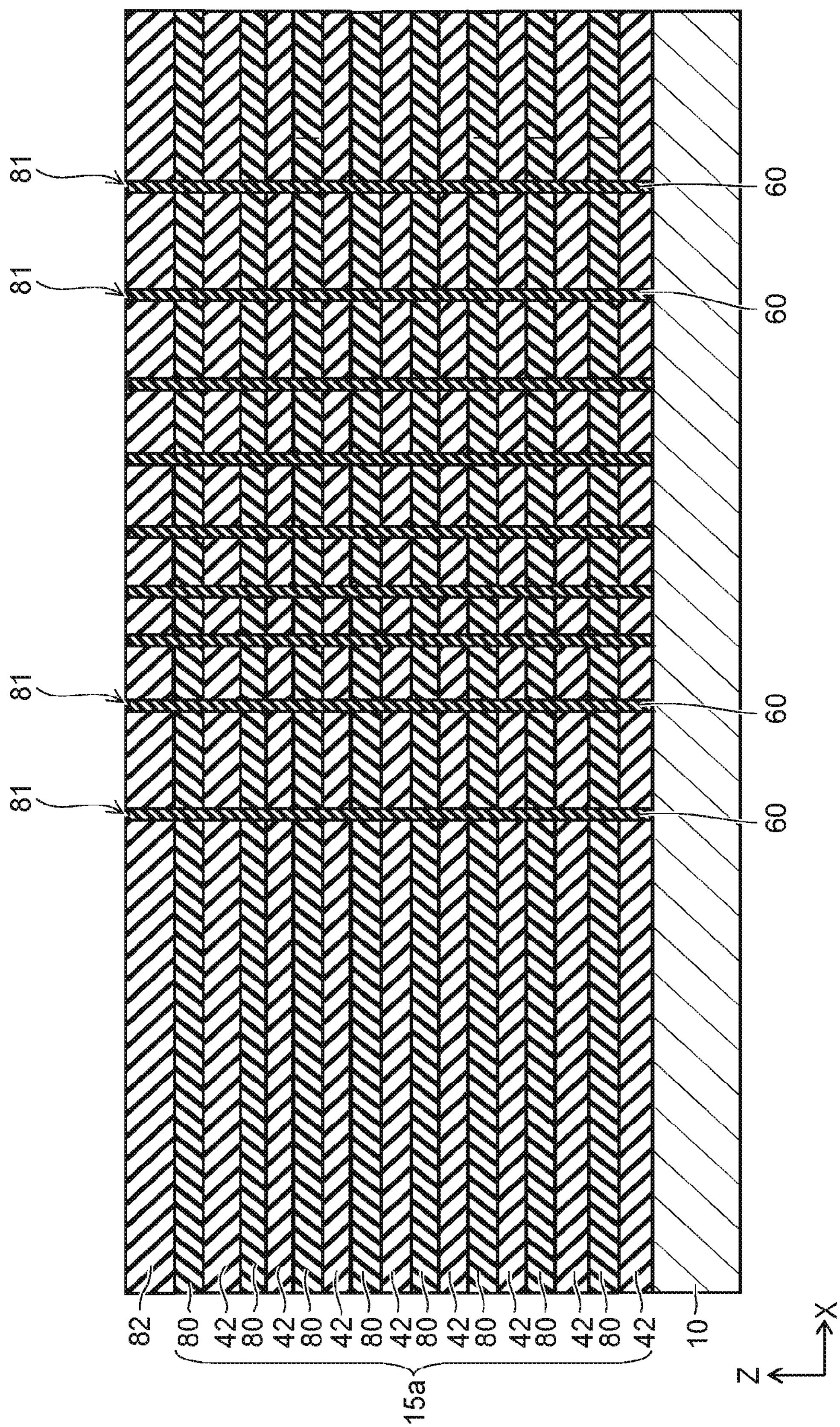

As shown in FIGS. 7A and 7B, a stacked body 15*a* is formed on a substrate 10 by alternately stacking an insulating layer 42 and a sacrifice layer 80 in the Z-direction, for example, using a CVD (Chemical Vapor Deposition) method. The insulating layer 42 includes, for example, silicon oxide. The sacrifice layer 80 is made of material, for example, silicon nitride, which is selectively removable under the prescribed etching selectivity with respect to the insulating layer 42. The insulating layer 42 and the sacrifice layer 80 have a thickness of 30 nanometers, for example. In the embodiment, the stacking number of the insulating layer 42 and the stacking number of the sacrifice layer 80 are 8 respectively. Then, an insulating layer 82 is formed by depositing silicon oxide on the stacked body 15*a*.

Subsequently, a plurality of holes 81 are formed in the stacked body 15*a* and the insulating layer 82, for example, using RIE (Reactive Ion Etching). The hole 81 extends in the Z-direction and pierces the stacked body 15*a* and the insulating layer 82. The hole 81 pierces a part of the substrate 10. Then, a columnar member 60 is formed by depositing silicon oxide on the inner surface of the hole 81, for example, using the CVD method. A plurality of columnar members 60 are formed in the contact region Rc of the memory cell array MCA.

Figure 8A:
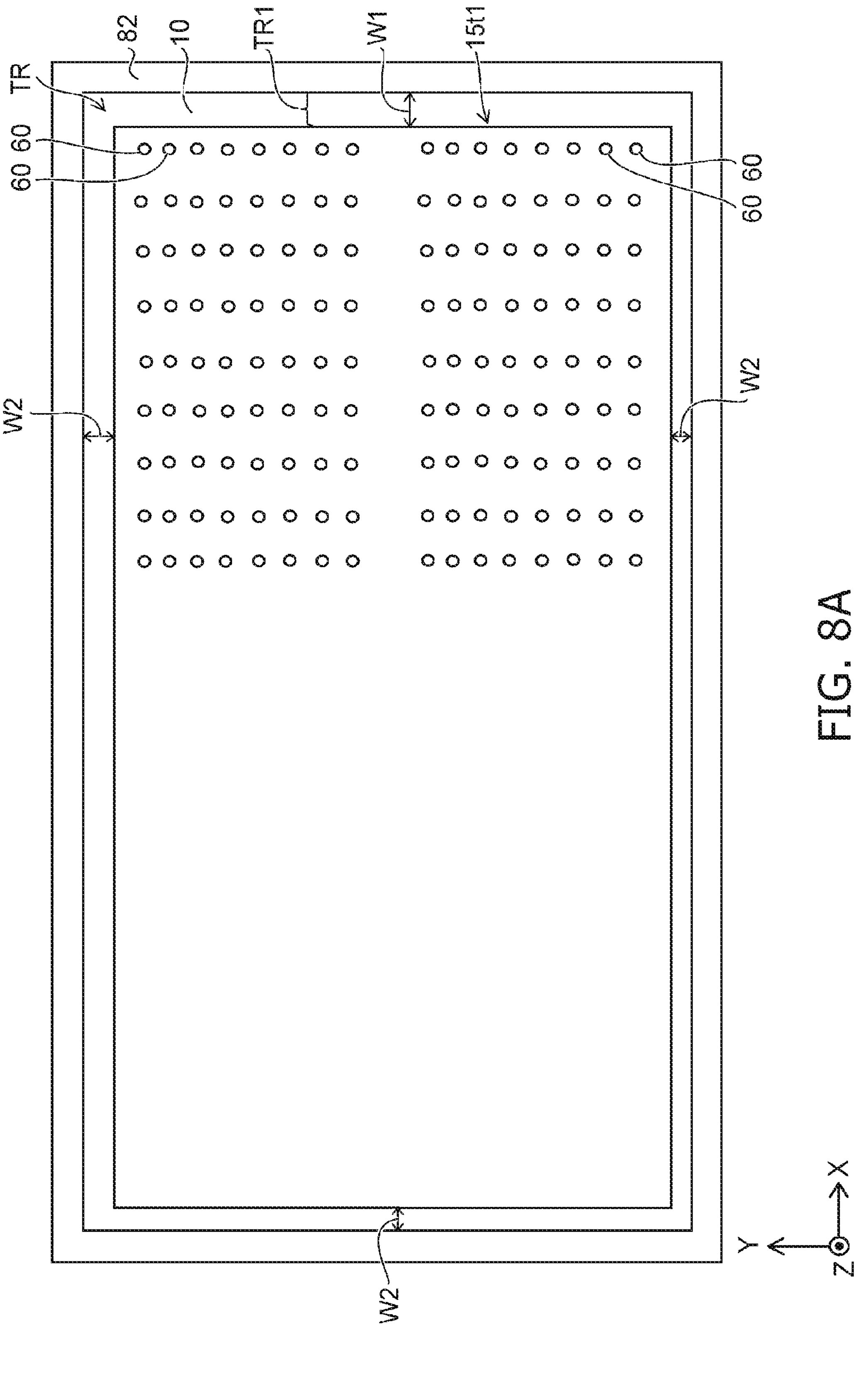
Figure 8B:
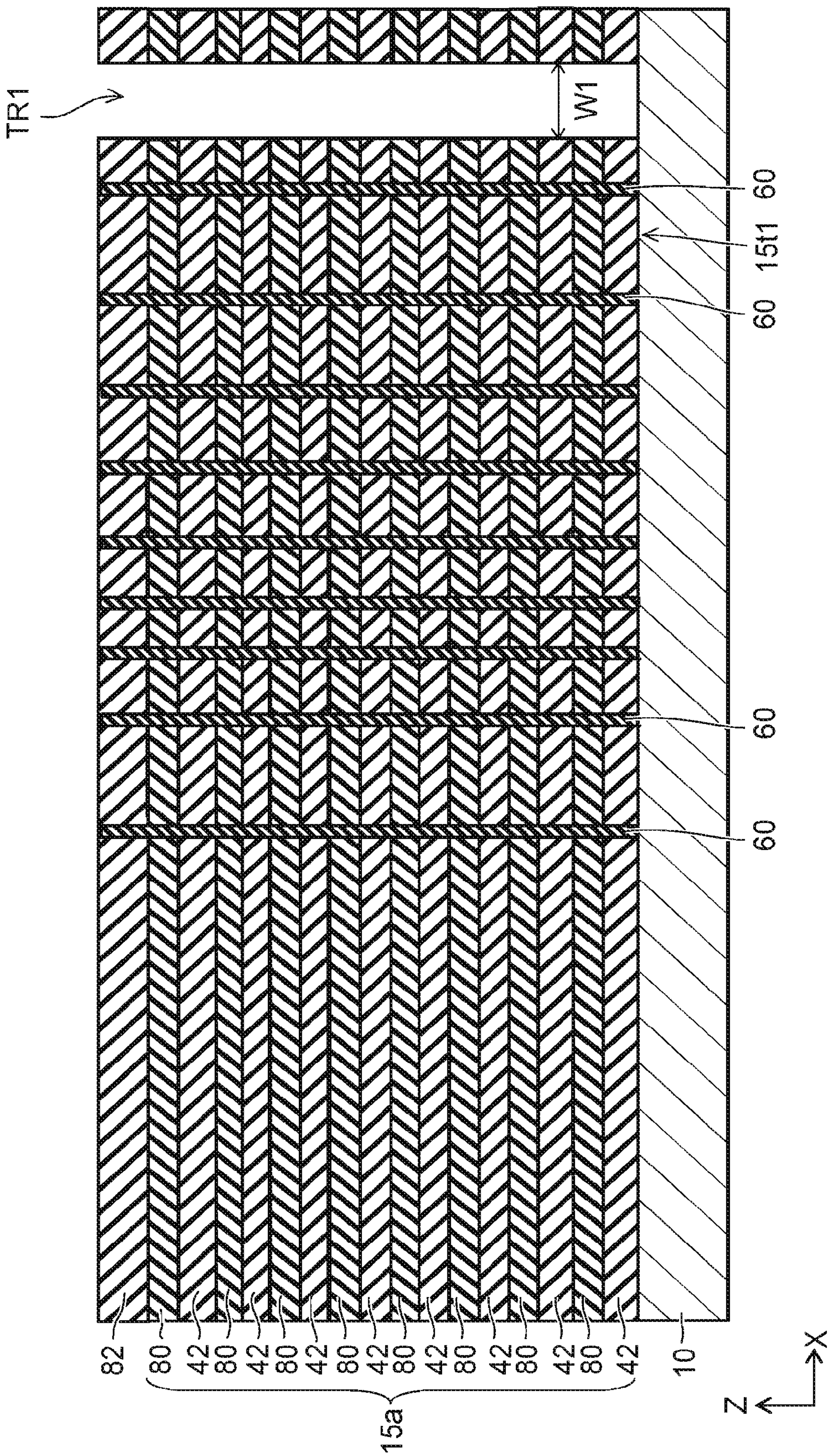

As shown in FIGS. 8A and 8B, a frame-shaped trench TR is formed in the stacked body 15*a* using photolithography and RIE. For example, the frame-shaped trench TR is formed by forming resist on a part of the insulating layer 82 using the photolithography, and then, by etching the insulating layer 82 and the stacked body 15*a*. In the case where the insulating layers 42 and 82 are made of silicon oxide, and the sacrifice layer 80 is made of silicon nitride, the insulating layers 42, 82 and the sacrifice layer 80 are etched using an etching gas containing carbon tetrafluoride ($CF_4$). The trench TR is formed to reach the substrate 10 through such an etching process.

The trench TR includes a wide part TR1 extending in the Y-direction in the vicinity of the end portion 15*t*1 of the stacked body 15*a*. A width W1 of the wide part TR1 is larger than a width W2 of a part other than the wide part TR1.

Figure 9A:
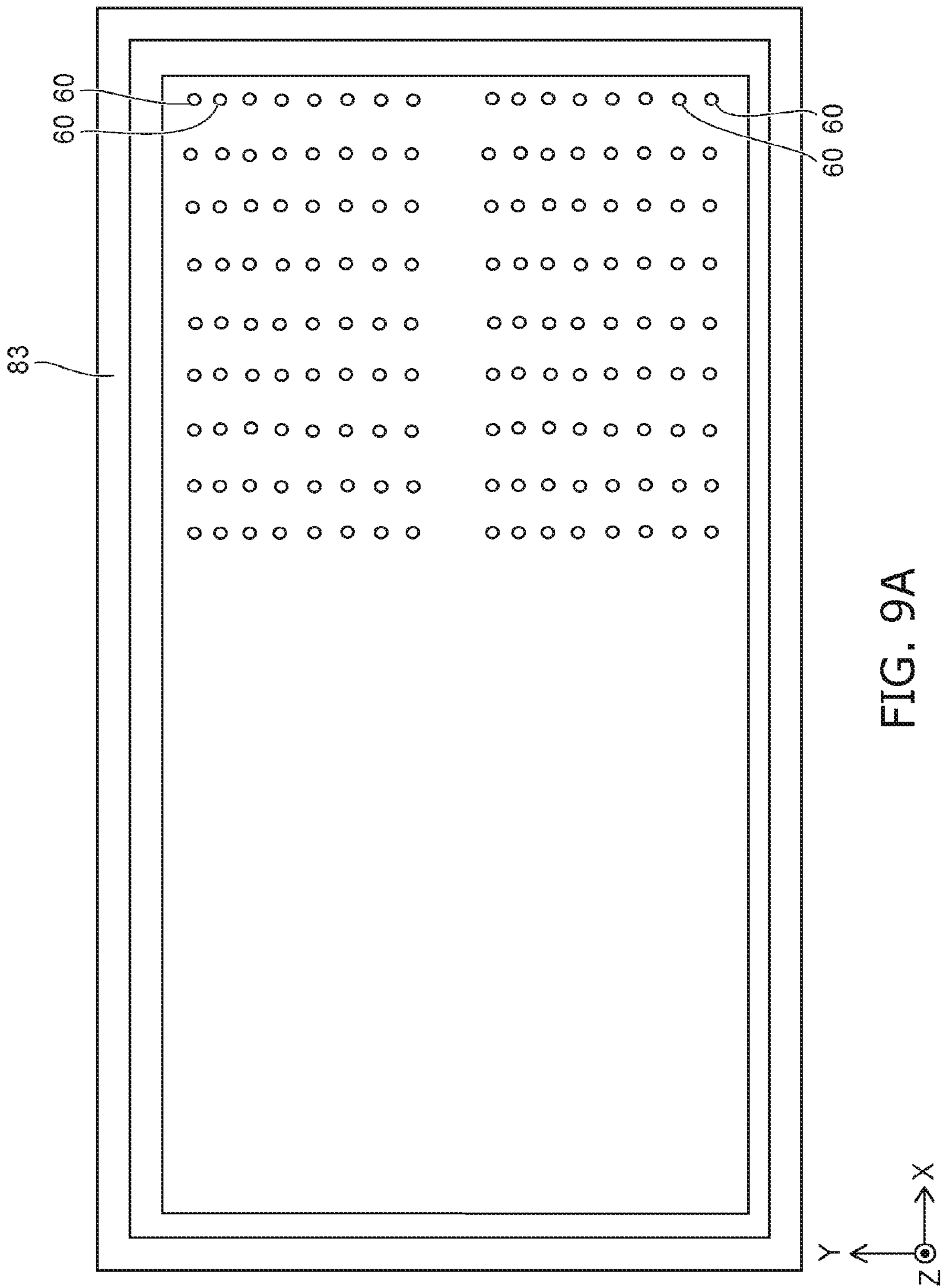
Figure 9B:
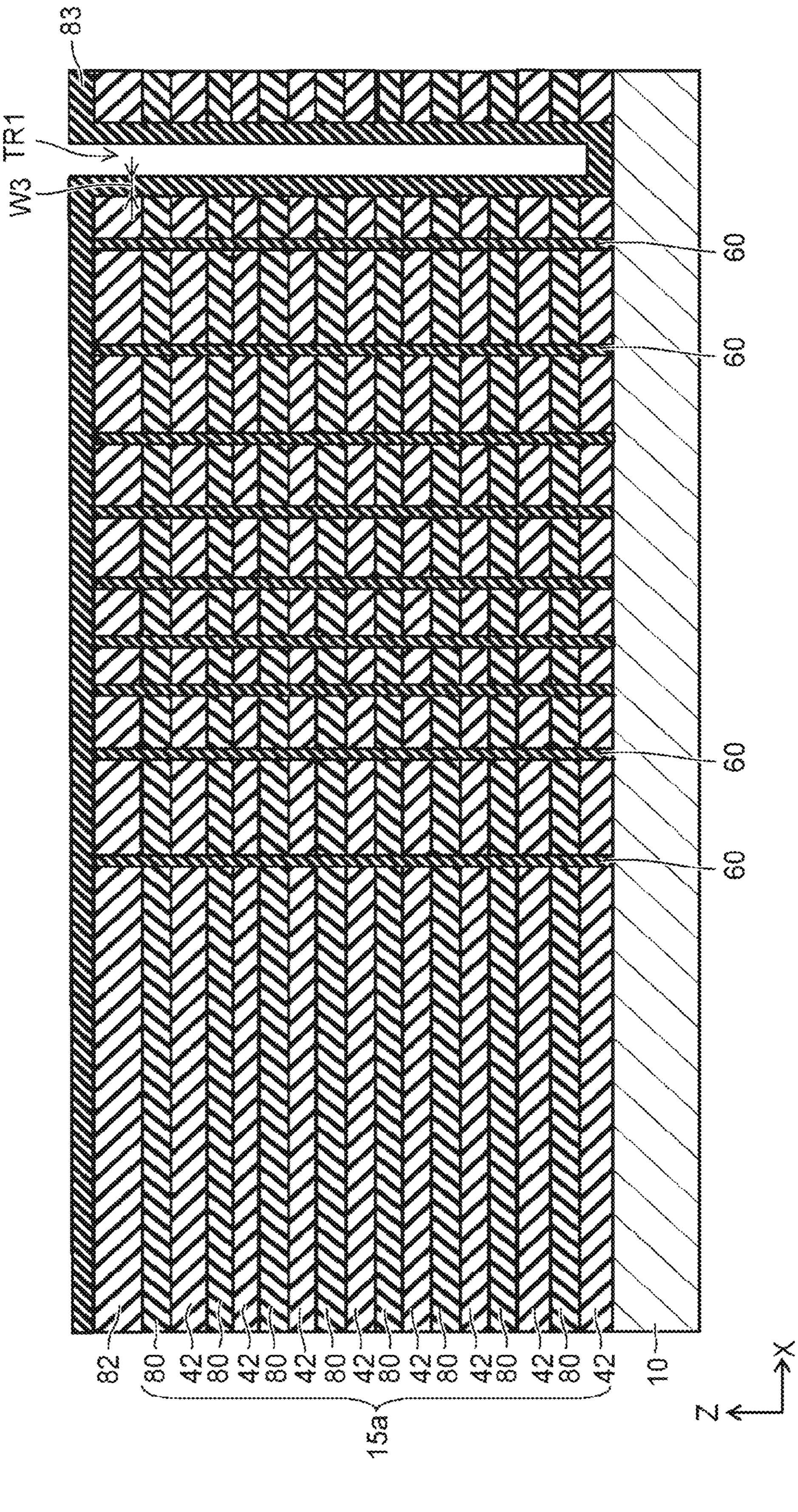

As shown in FIGS. 9A and 9B, a protection film 83 is formed on the whole surface, for example, using an ALD (Atomic Layer Deposition) method. The protection film 83 includes, for example, silicon oxide. The protection film 83 is formed on the insulating layer 82 and on the inner wall and the bottom surface of the wide part TR1 of the trench TR under the condition of film growth that provide superior coverage.

The width W1 of the wide part TR1 is not less than three times the thickness W3 of the protection film 83. The width W2 of the part other than the wide part TR1 is not more than two times the thickness W3 of the protection film 83. The thickness of the protection film 83 is 20 nanometers, for example. Under such a relationship of the width and the film thickness, it becomes possible to form the protection film 83 on the inner wall and the bottom surface of the wide part TR1.

Figure 10A:
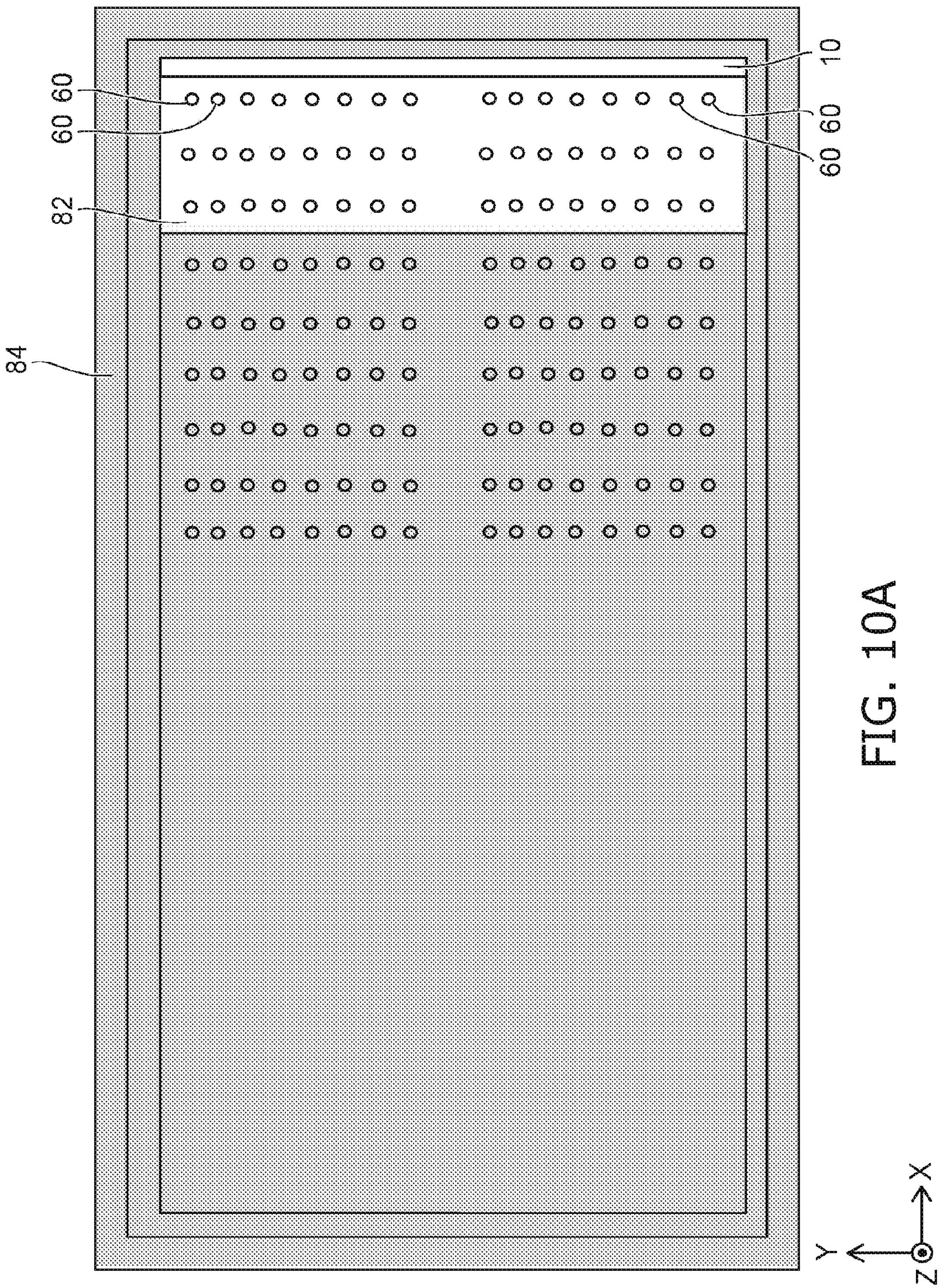
Figure 10B:
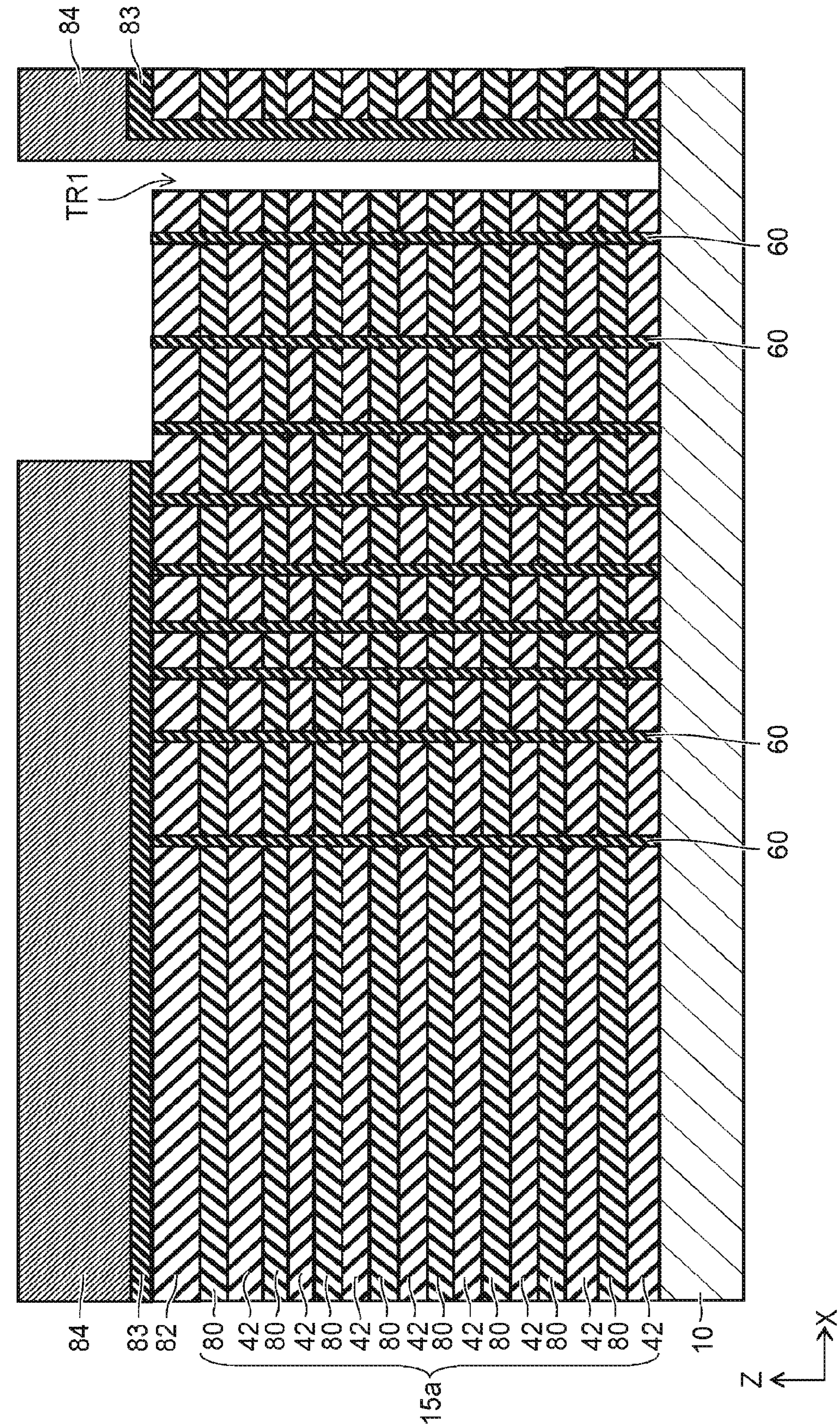

As shown in FIGS. 10A and 10B, a resist 84 is formed on a part of the protection film 83, for example, using photolithography; and then, other part of the protection film 83 not covered with the resist 84 is removed using RIE. In the case where the protection film 83 is made of silicon oxide, the protection film 83 is removed using isotropic etching such as wet etching using solution containing hydrogen fluoride (HF), CDE (Chemical Dry Etching) using etching gas containing carbon tetrafluoride, or the like.

The other part of the protection film 83 is provided on a part of the insulating layer 82 and on a part of the inner wall and a part of the bottom surface in the wide part TR1 of the trench TR. It should be noted in FIG. 10A that the part on which the resist 84 is formed is shown darkly compared with the other part on which the resist 84 is not formed. The resist 84 covers a part of the stacked body 15*a* that is formed outside the trench TR.

Figure 11A:
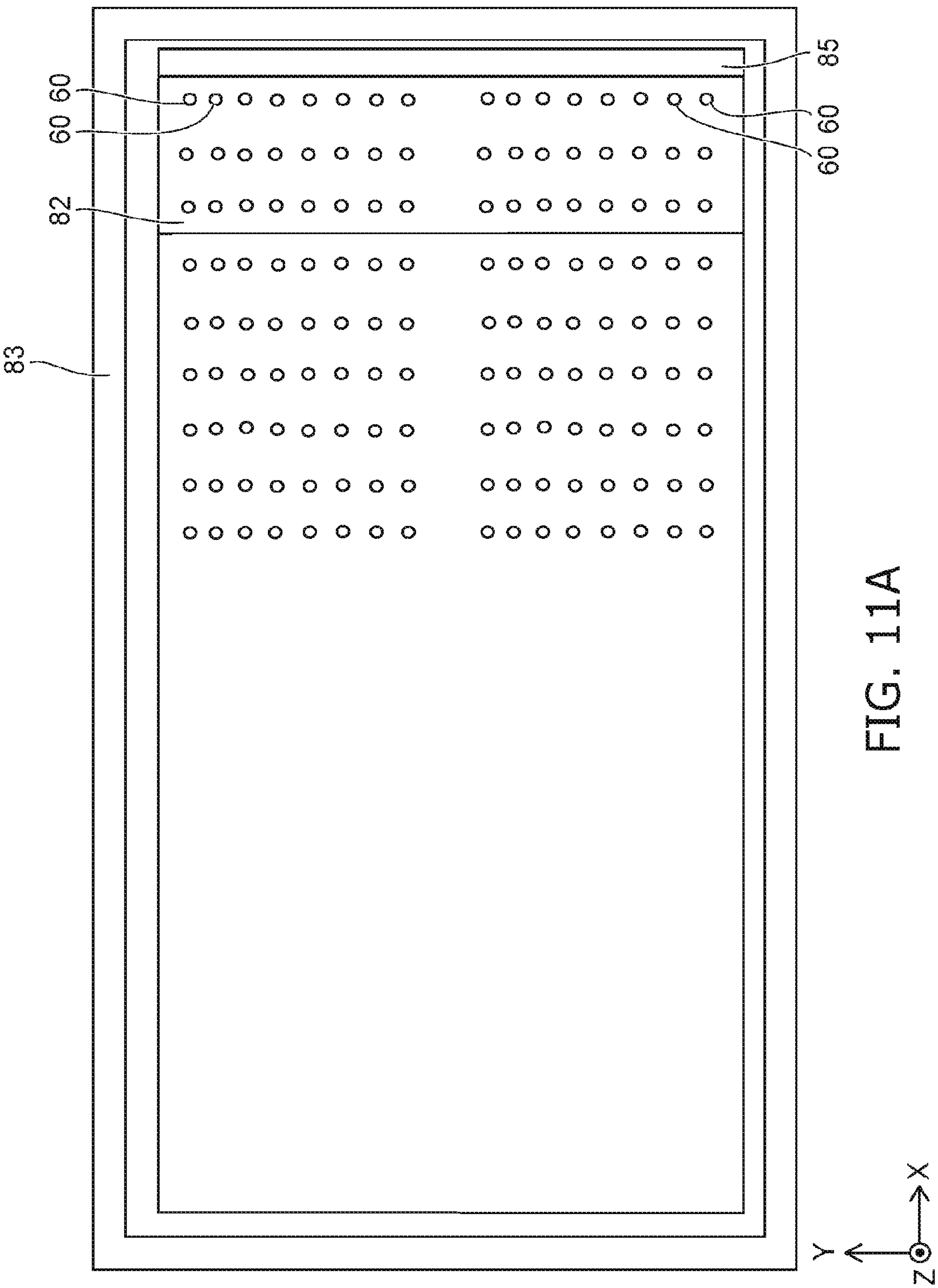
Figure 11B:
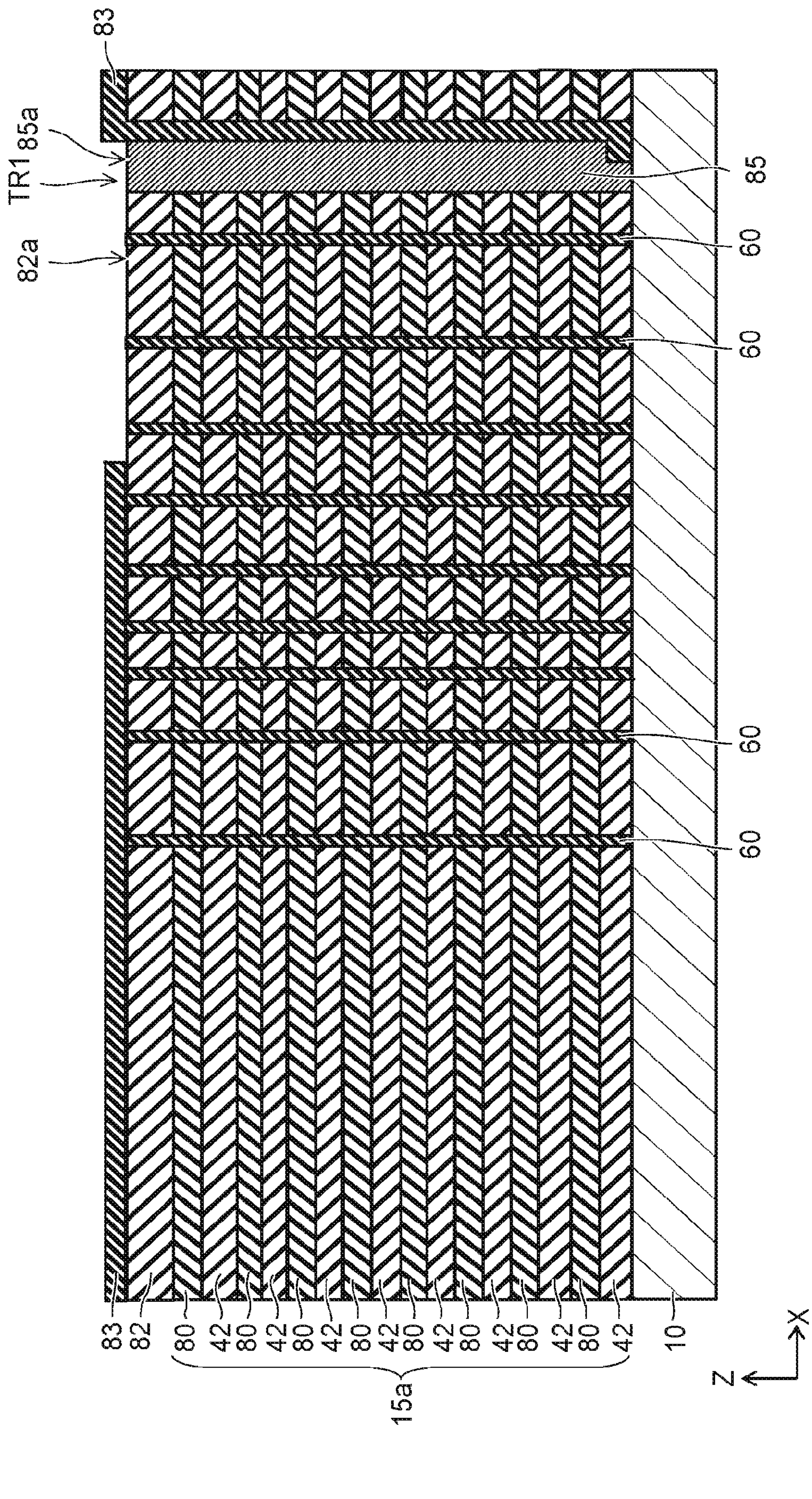

As shown in FIGS. 11A and 11B, the resist 84 is removed by an ashing treatment and rinsing treatment. Subsequently, a film 85 is formed, for example, using the CVD method so as to fill the wide part TR1 of the trench TR. The film 85 is made of material that is selectively removable under the prescribed etching selectivity with respect to the insulating layer 42 and sacrifice layer 80. In the case where the insulating layer 42 and the sacrifice layer 80 are made of silicon oxide and silicon nitride respectively, the film 85 is, for example, a carbon film that contains carbon (C) as a main constituent. Alternatively, the film 85 may be a film that contains silicon such as amorphous silicon. Then, the film 85 is set back downward by etching so that a top surface 85*a* of the film 85 is almost in plane with a top surface 82*a* of the insulating layer 82. The film 85 is etched back, for example, using CDE or RIE.

Figure 12A:
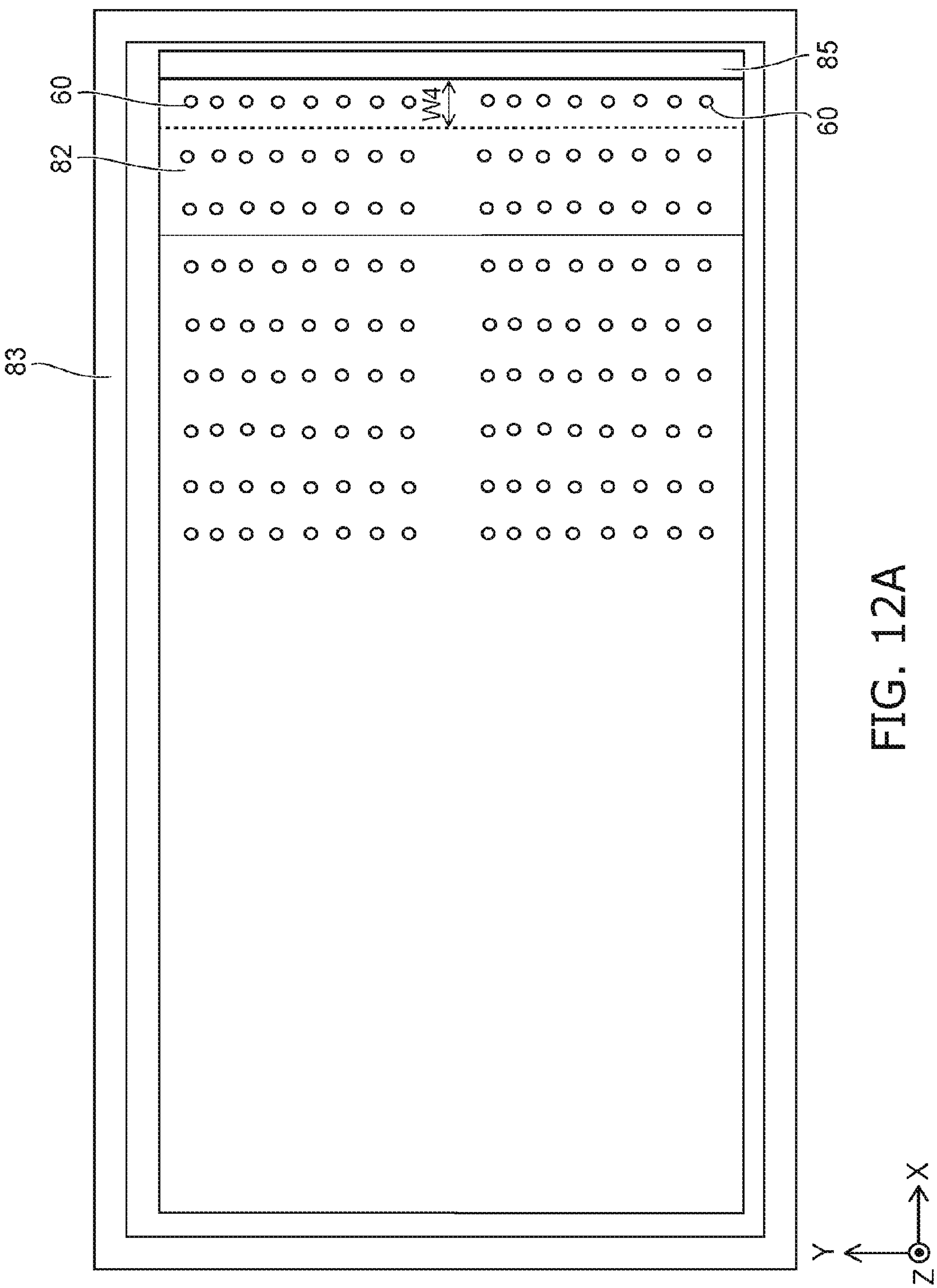
Figure 12B:
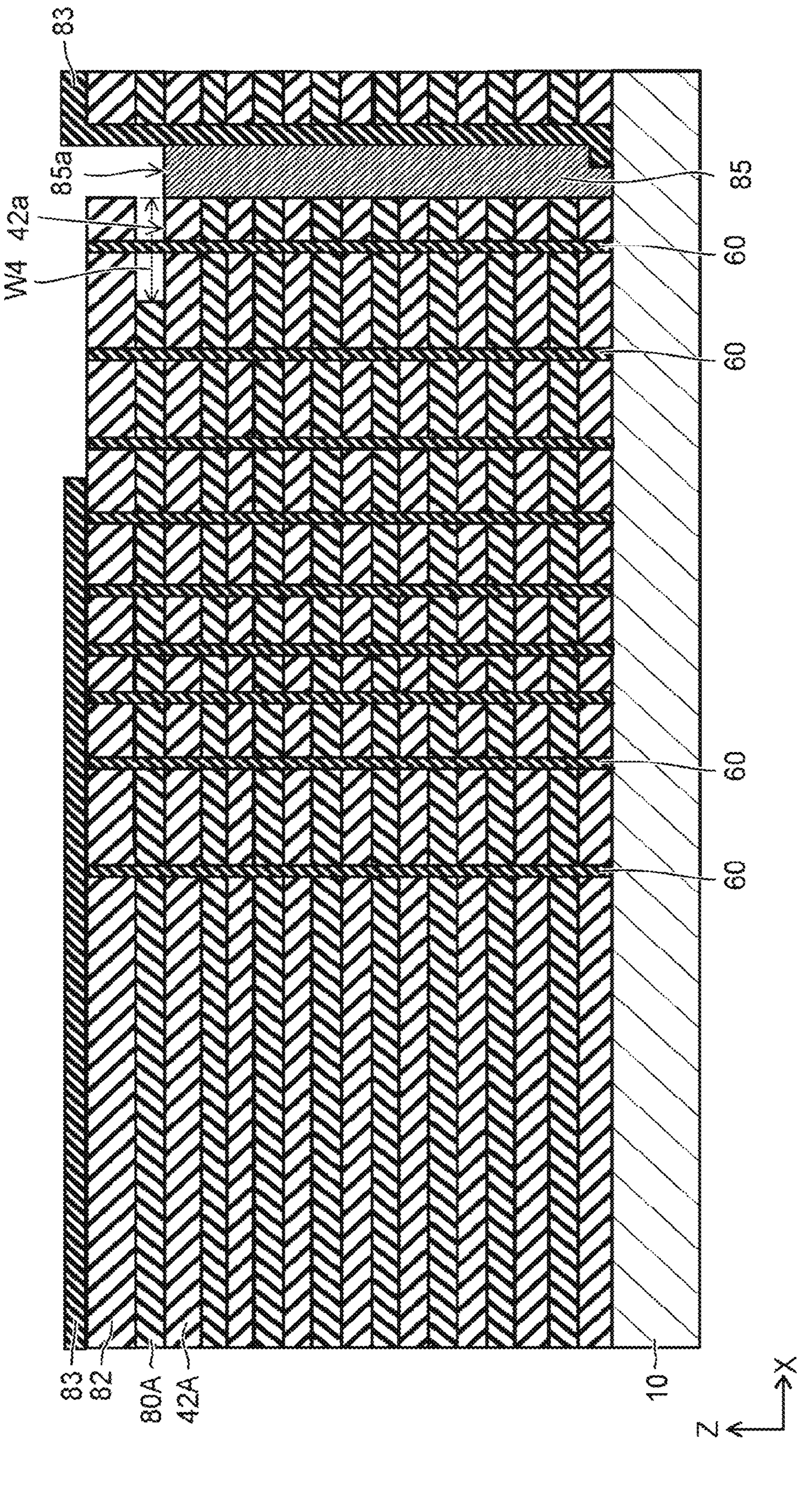

As shown in FIGS. 12A and 12B, the film 85 is set back downward by etching so that the top surface 85*a* of the film 85 is almost in plane with a top surface 42*a* of an insulating layer 42A. After or during the etching of the film 85, a sacrifice layer 80A, which is exposed by the etching of the film 85, is set back in the lateral direction by etching. The insulating layer 42A is the uppermost insulating layer of the insulating layers 42 in the stacked body 15*a*, and the sacrifice layer 80A is the uppermost sacrifice layer of the sacrifice layers 80 in the stacked body 15*a*. The sacrifice layer 80A is removed by the etching, and is set back in the lateral direction by a width W4 as shown by a dot line in FIG. 12A.

In the case where the insulating layer 42, the sacrifice layer 80 and the film 85 are made of silicon oxide, silicon nitride and carbon (C) respectively, an etching gas is used, which contains, for example, difluoromethane ($CH_2F_2$). By use of CDE using such an etching gas, it is possible to expose the lateral surface of the silicon nitride layer and to etch the silicon nitride layer, while etching the carbon film. When the etching selectivity of the silicon nitride layer is 10 times the etching selectivity of the carbon film, the silicon nitride layer having the exposed lateral surface is set back 300 nanometers in the lateral direction, while the carbon film is set back 30 nanometers downward.

In the case where the insulating layer 42, the sacrifice layer 80 and the film 85 are made of silicon oxide, silicon nitride and amorphous silicon respectively, by use of CDE using the etching gas that contains, for example, bromine (Br), it is possible to expose the lateral surface of the silicon nitride layer and to etch the silicon nitride layer, while etching the amorphous film.

Figure 13A:
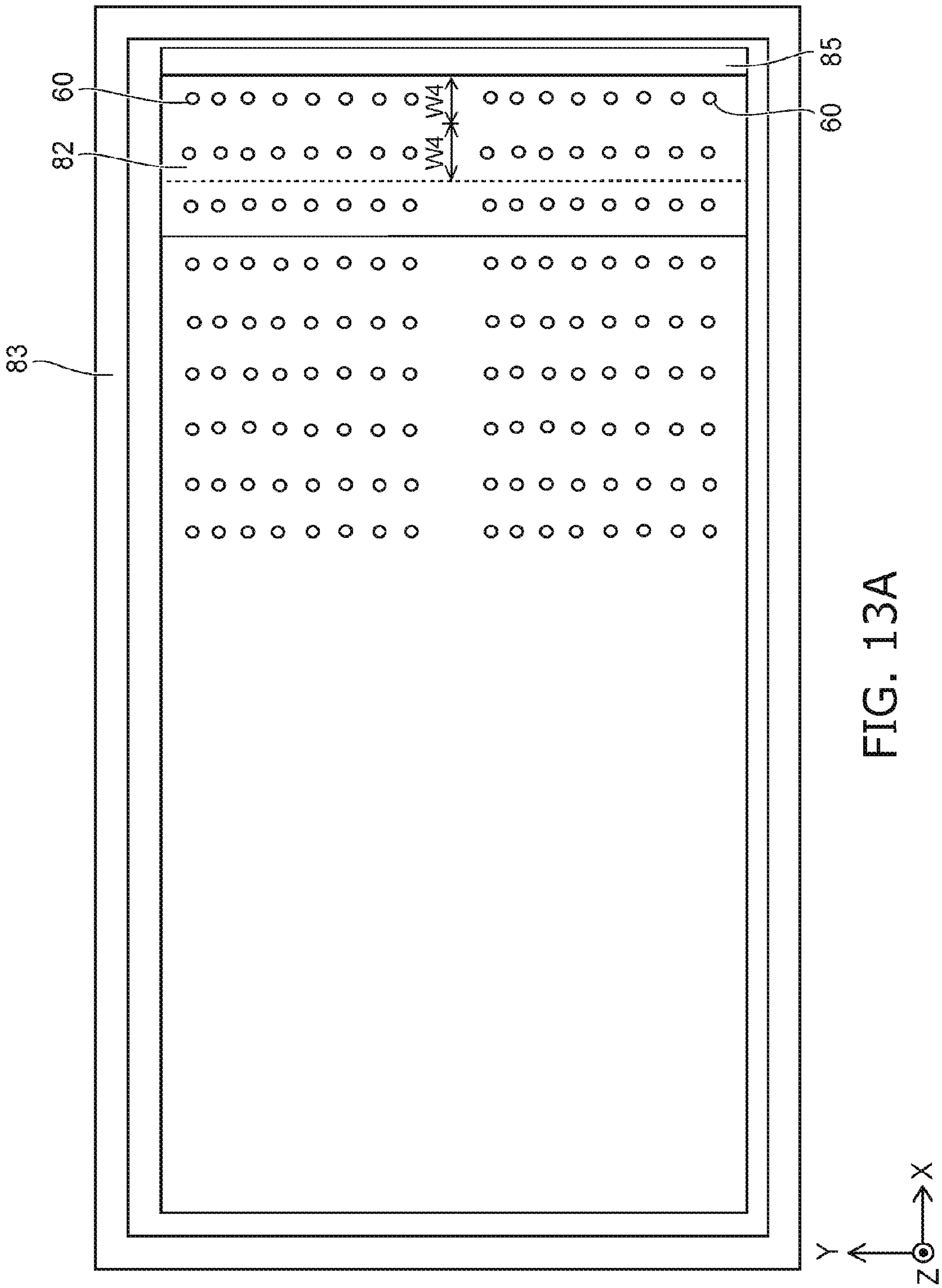
Figure 13B:
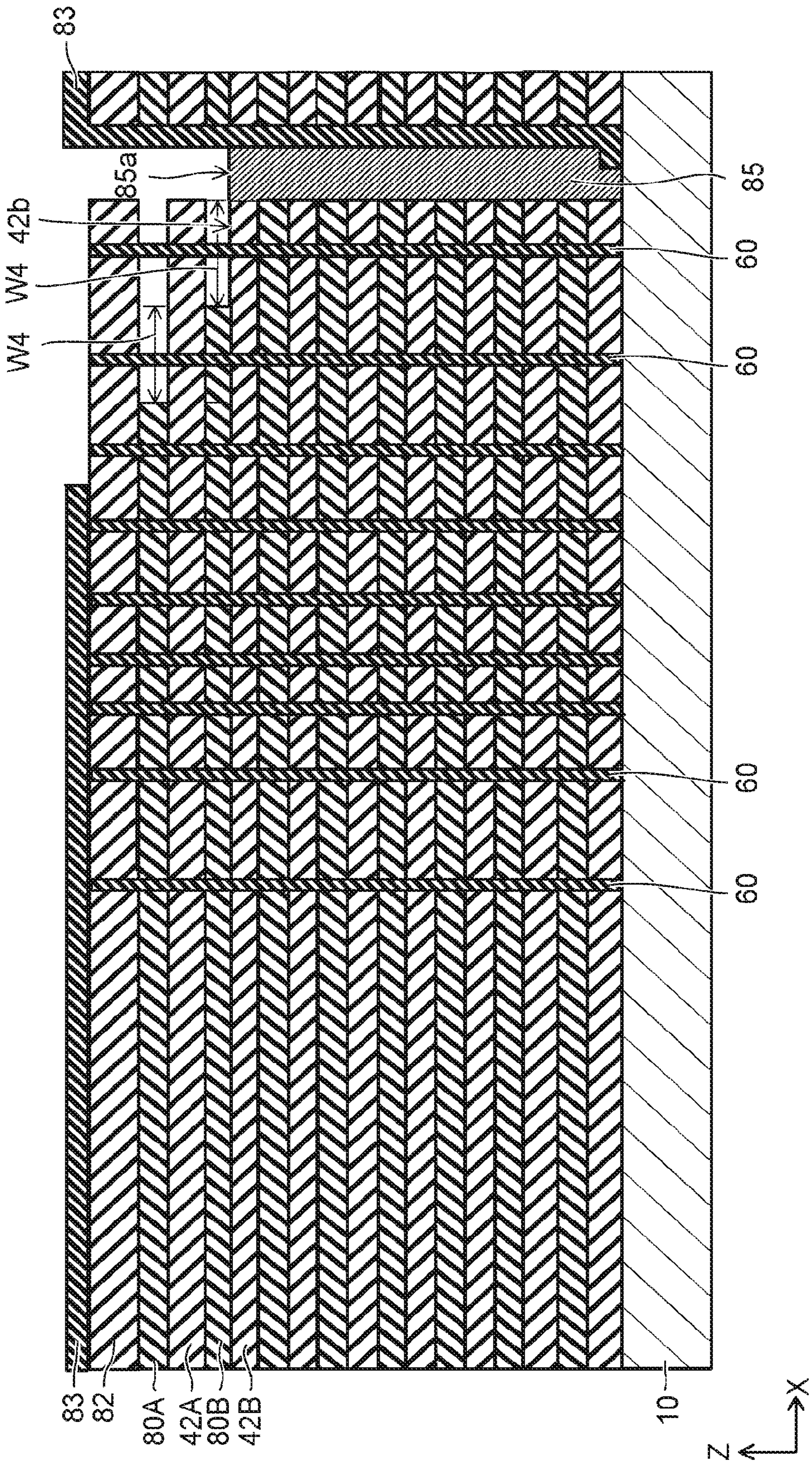

As shown in FIGS. 13A and 13B, the film 85 is set back downward by etching so that the top surface 85*a* of the film 85 is almost in plane with a top surface 42*b* of the insulating layer 42B. The sacrifice layer 80A is set back in the lateral direction by etching, and a sacrifice layer 80B, which is exposed by the etching of the film 85, is set back in the lateral direction by etching. The insulating layer 42B is positioned at the second level downward from the uppermost insulating layer of the insulating layers 42 in the stacked body 15*a*; and the sacrifice layer 80B is positioned at the second level downward from the uppermost sacrifice layer of the sacrifice layers 80 in the stacked body 15*a*. The sacrifice layer 80A is removed by the etching, and is further set back by a width W4 in the lateral direction as shown by a dot line in FIG. 13A. The sacrifice layer 80B is removed by the etching, and is set back by a width W4 in the lateral direction.

Figure 14A:
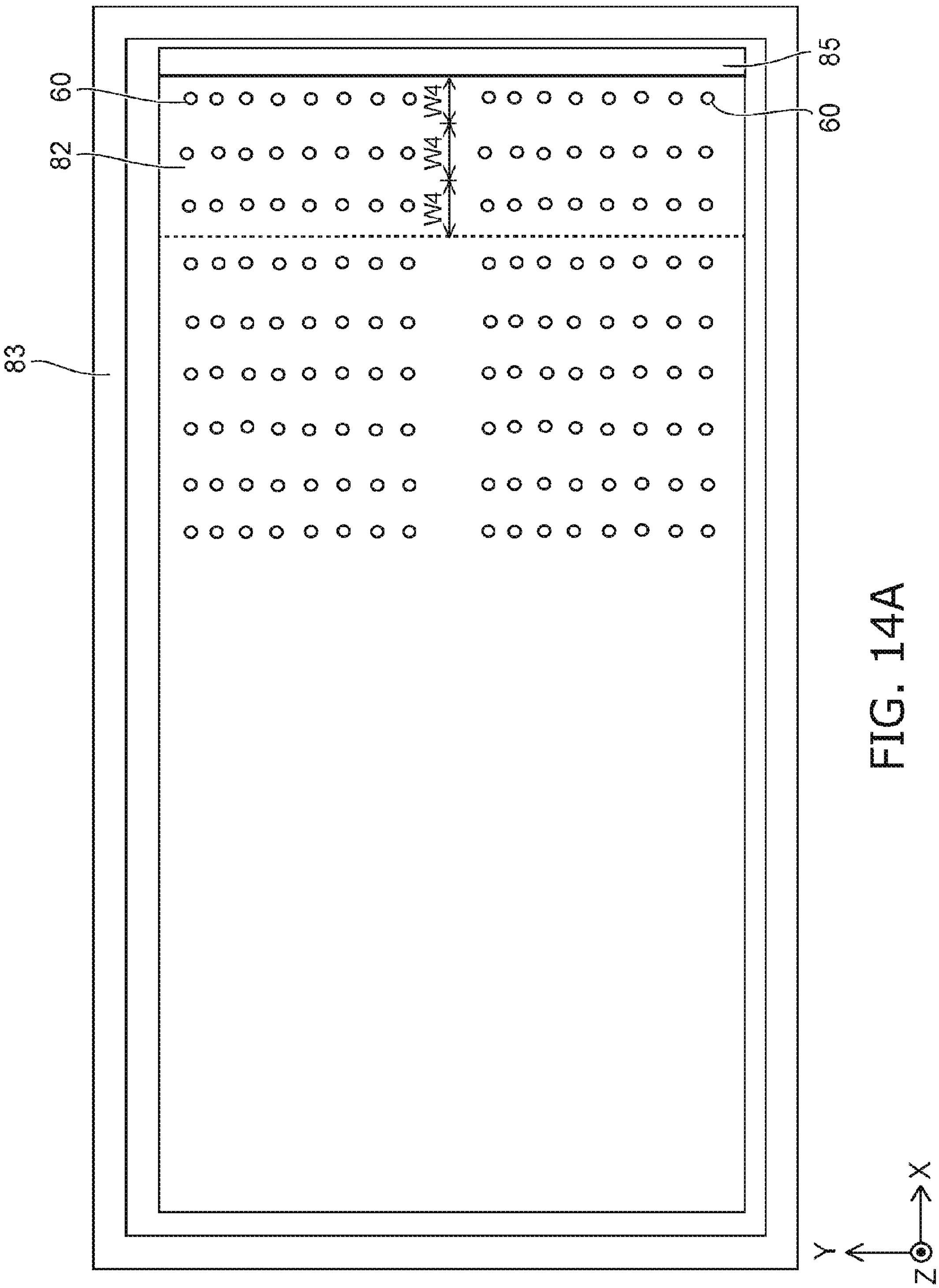
Figure 14B:
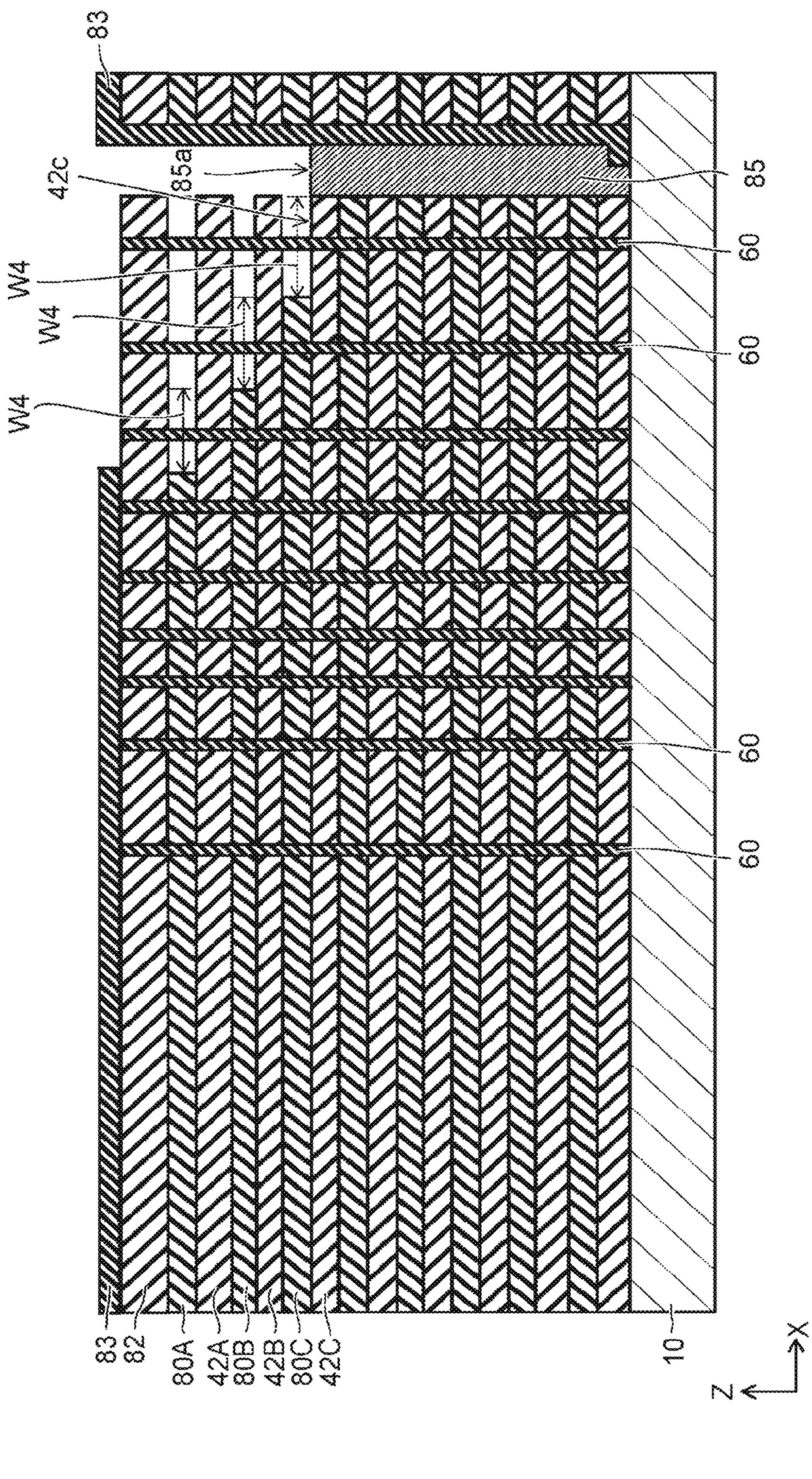

As shown in FIGS. 14A and 14B, the film 85 is set back downward so that the top surface 85*a* of the film 85 is almost in plane with a top surface 42*c* of the insulating layer 42C. The sacrifice layer 80A and 80B are set back in the lateral direction by etching, and a sacrifice layer 80C, which is exposed by the etching of the film 85, is set back in the lateral direction by etching. The insulating layer 42C is positioned at the third level downward from the uppermost insulating layer of the insulating layers 42 in the stacked body 15*a*; and the sacrifice layer 80C is positioned at the third level downward from the uppermost sacrifice layer of the sacrifice layers 80 in the stacked body 15*a*. The sacrifice layer 80A is removed by the etching, and is further set back by a width W4 in the lateral direction as shown by a dot line in FIG. 14A. The sacrifice layer 80B is removed by the etching, and is further set back by a width W4 in the lateral direction. The sacrifice layer 80C is removed by the etching, and is set back by a width W4 in the lateral direction.

Thereafter, such etching processes are implemented three times.

Figure 15A:
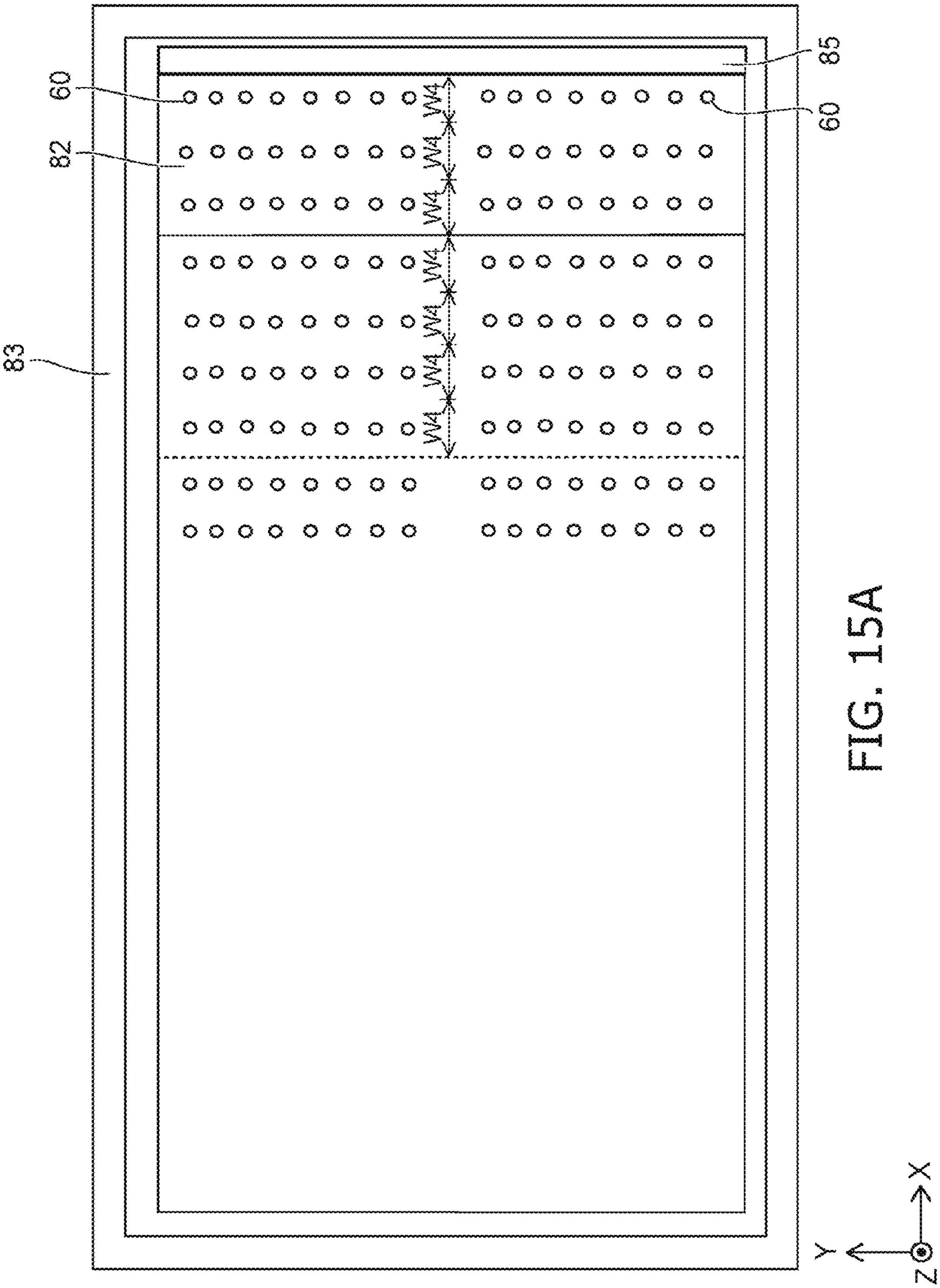
Figure 15B:
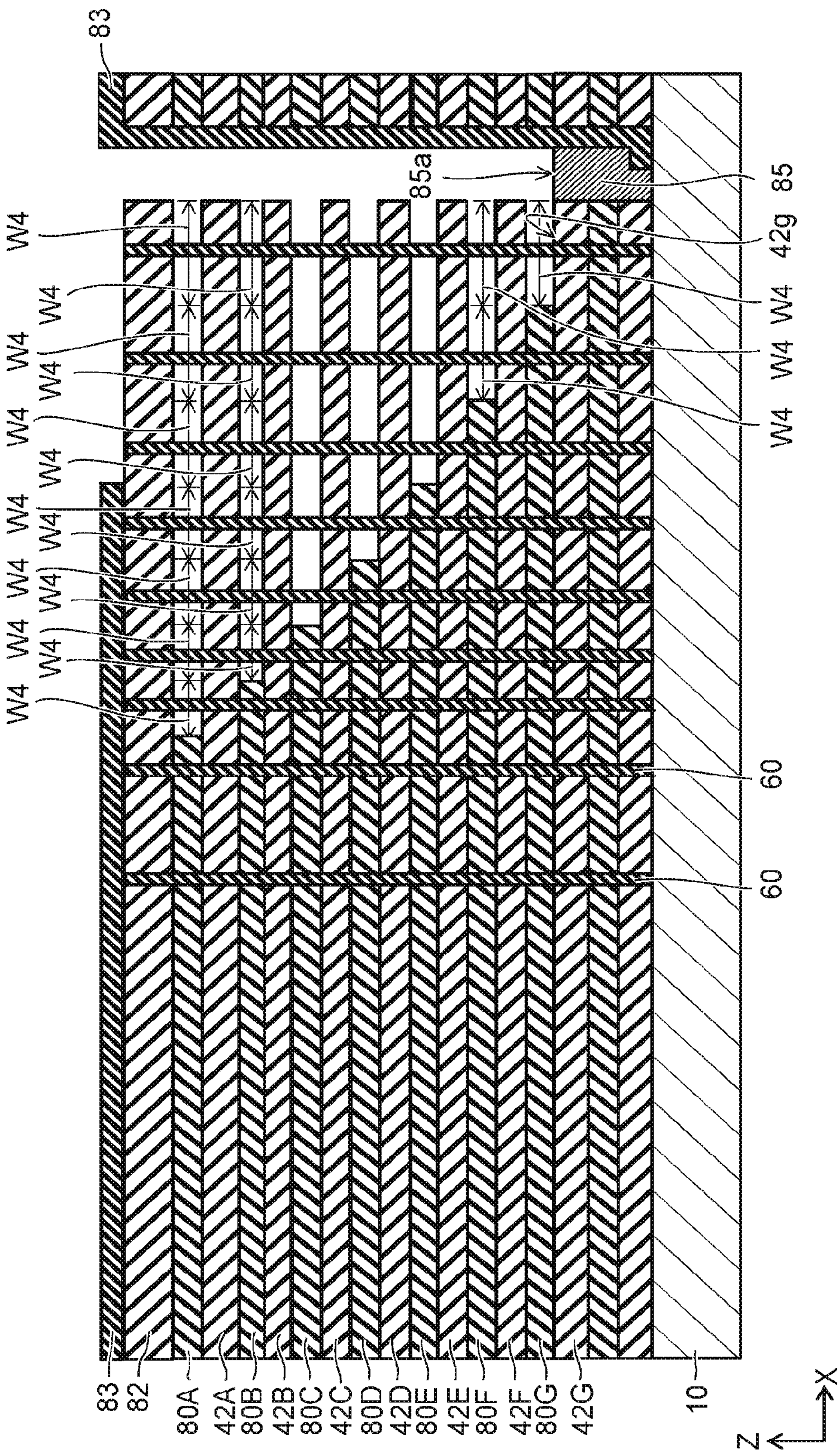

Then, the film 85 is etched and set back downward after the three times implementations of the etching processes so that the top surface 85*a* of the film 85 is almost in plane with a top surface 42*g* of an insulating layer 42G as shown in FIGS. 15A and 15B. The sacrifice layers 80A to 80F are etched and set back in the lateral direction; and a sacrifice layer 80G, which is exposed by the etching of the film 85, is etched and set back in the lateral direction. The insulating layer 42G is positioned at the seventh level downward from the uppermost insulating layer of the insulating layers 42 in the stacked body 15*a*; and the sacrifice layer 80G is positioned at the seventh level downward from the uppermost sacrifice layer of the sacrifice layers 80 in the stacked body 15*a*. The sacrifice layer 80A is removed by etching, and is further set back by a width W4 as shown by a dot line in FIG. 15A. The sacrifice layers 80B to 80F are removed by etching, and are further set back by a width W4 in the lateral direction. The sacrifice layer 80G is removed by etching, and is set back by a width W4 in the lateral direction.

Figure 16A:
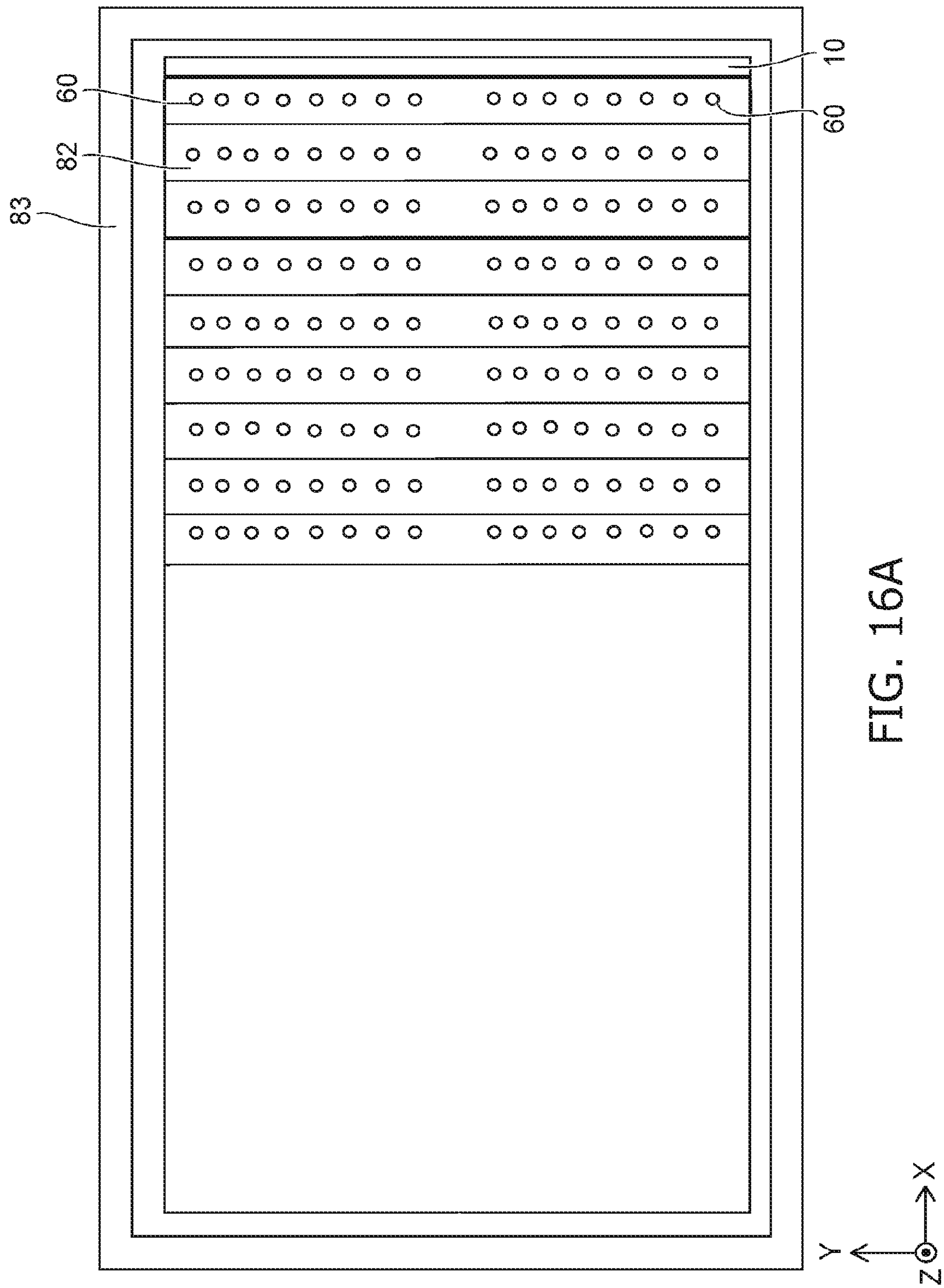
Figure 16B:
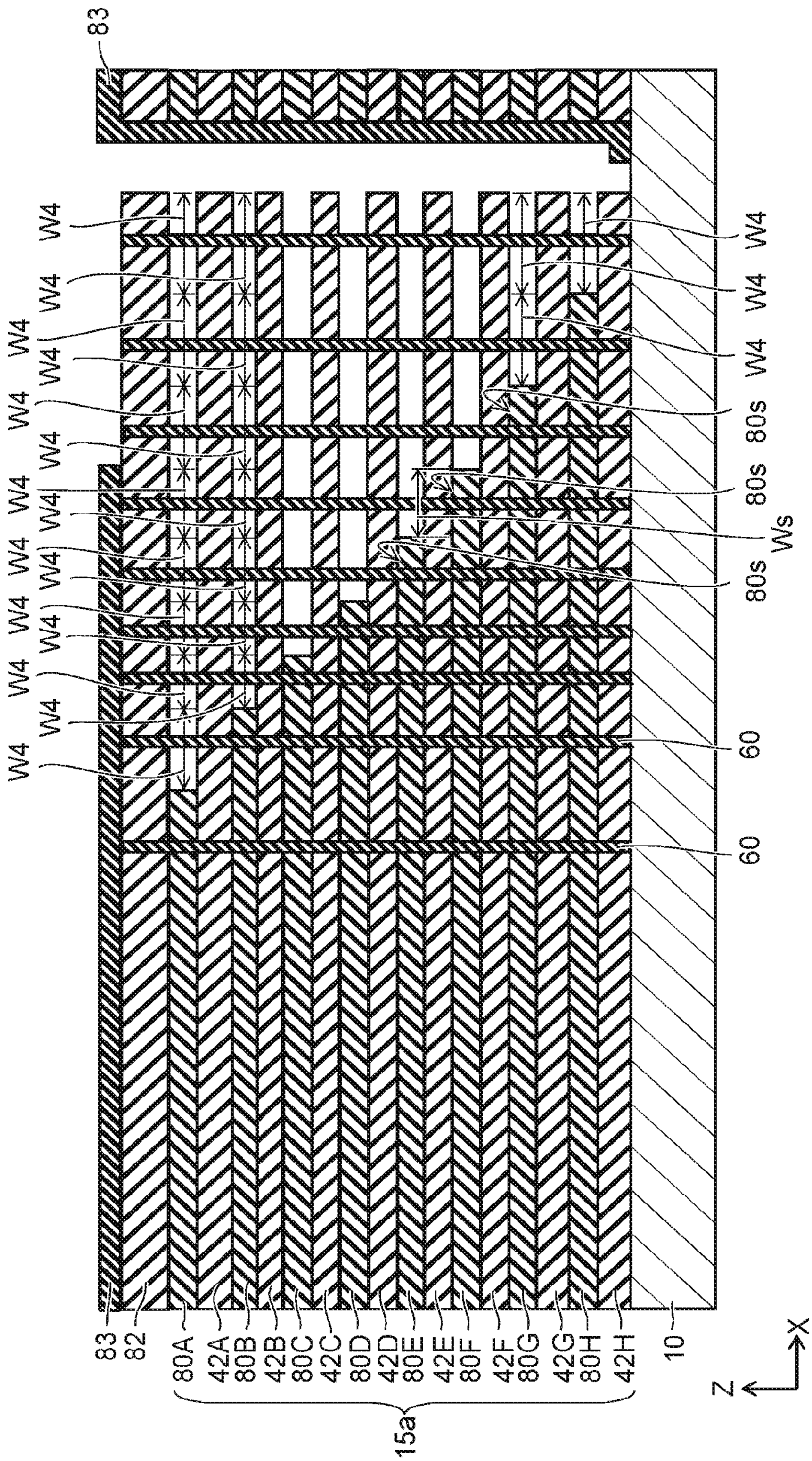

As shown in FIGS. 16A and 16B, the film 85 is removed by etching. The sacrifice layers 80A to 80G are etched and set back in the lateral direction; and a sacrifice layer 80H, which is exposed by the etching of the film 85, is etched and set back in the lateral direction. The sacrifice layer 80H is the lowermost layer of the sacrifice layers 80 in the stacked body 15*a*. As shown in FIG. 16B, the sacrifice layers 80A to 80G are removed by etching, and are further set back by a width W4 in the lateral direction. The sacrifice layer 80H is removed by the etching, and is set back by a width W4 in the lateral direction. Thereby, the sacrifice layers 80 in the stacked body 15*a* are formed into stairs; and a step 80*s* is formed at each of the sacrifice layers 80.

The width W4 is equivalent to a width Ws of the step 80*s*. For example, the width Ws in the X-direction of each step 80*s* is almost the same. It is possible to make the width Ws of the step 80*s* uniform by adjusting the etching amount of the sacrifice layer 80 based on the etching time.

Figure 17A:
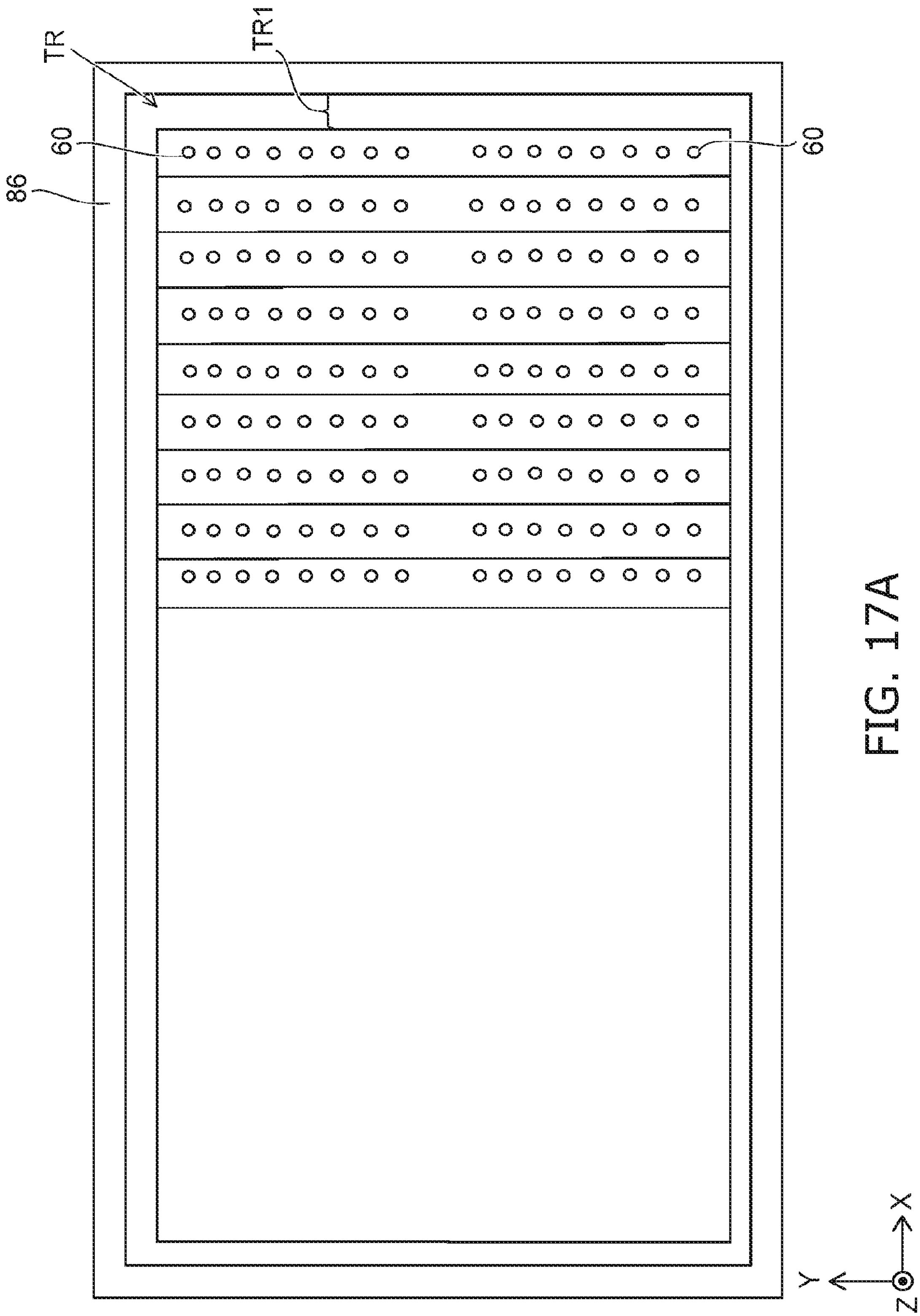
Figure 17B:
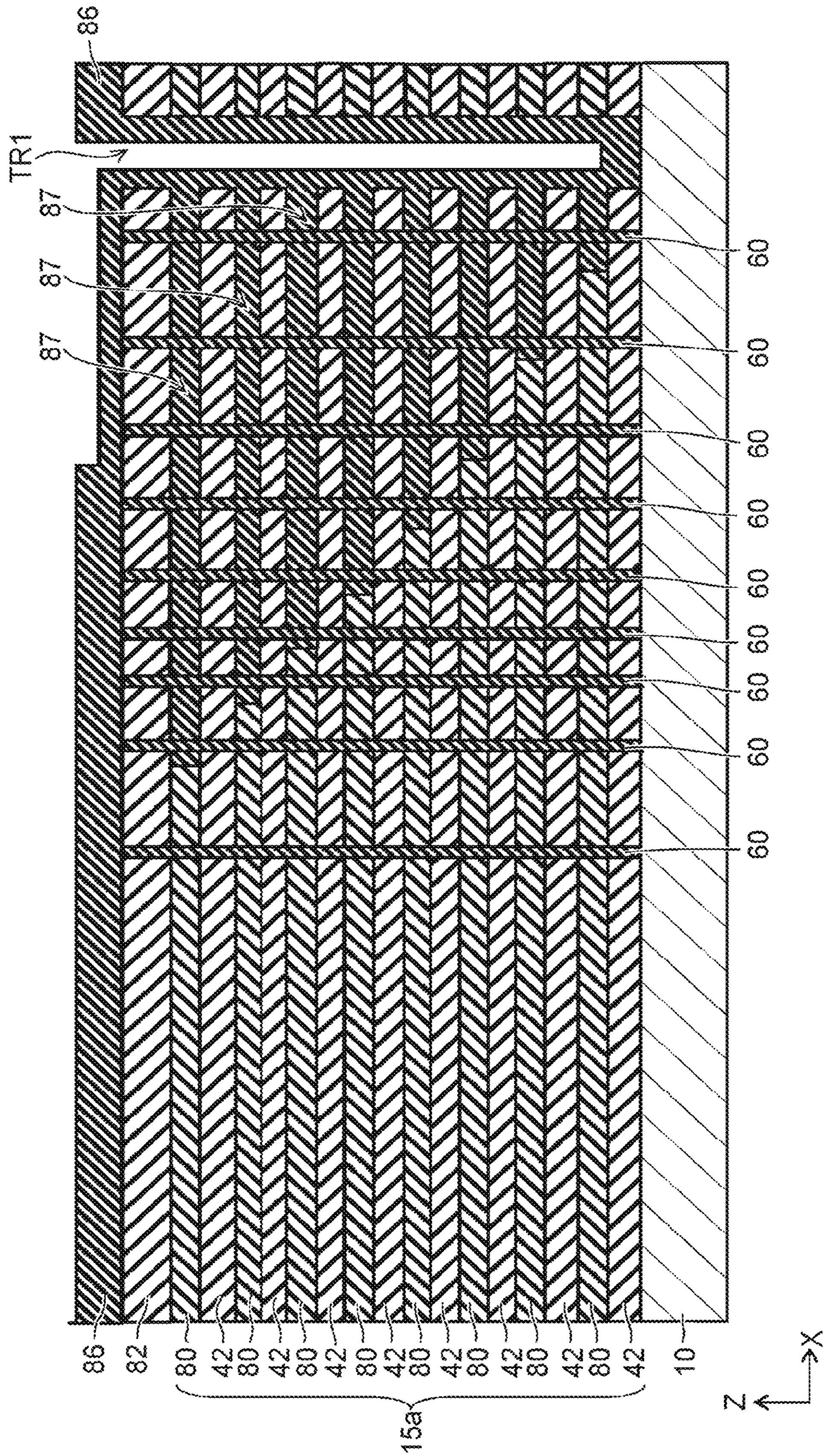

As shown in FIGS. 17A and 17B, an insulating layer 86 is formed on the whole surface, for example, by using the ALD method. The insulating layer 86 includes, for example, silicon oxide. The insulating layer 86 is formed on the inner wall and the bottom surface of the wide part TR1 of the trench TR, and is embedded in hollow spaces formed by the sacrifice layers 80 being removed.

Figure 18A:
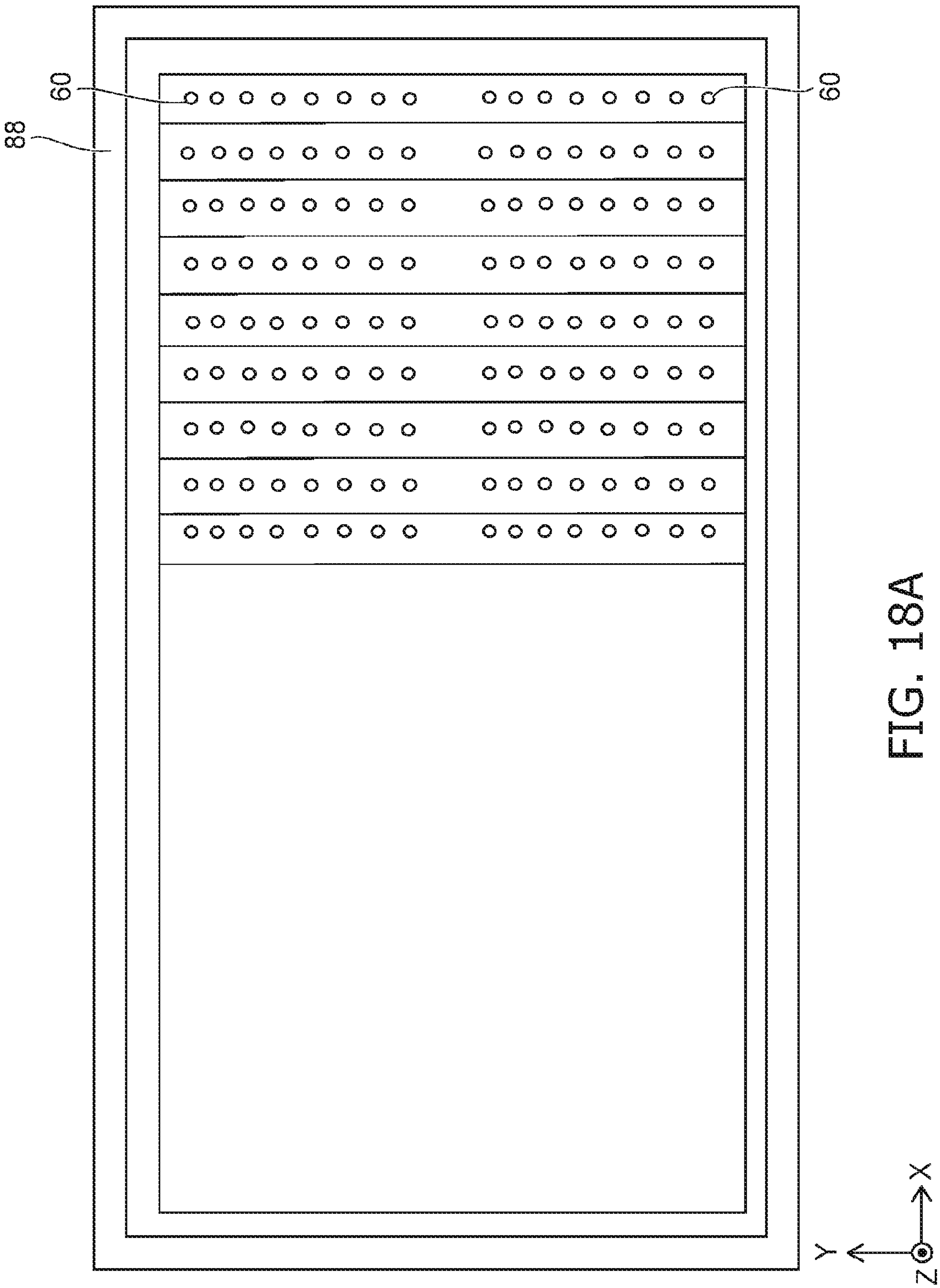
Figure 18B:
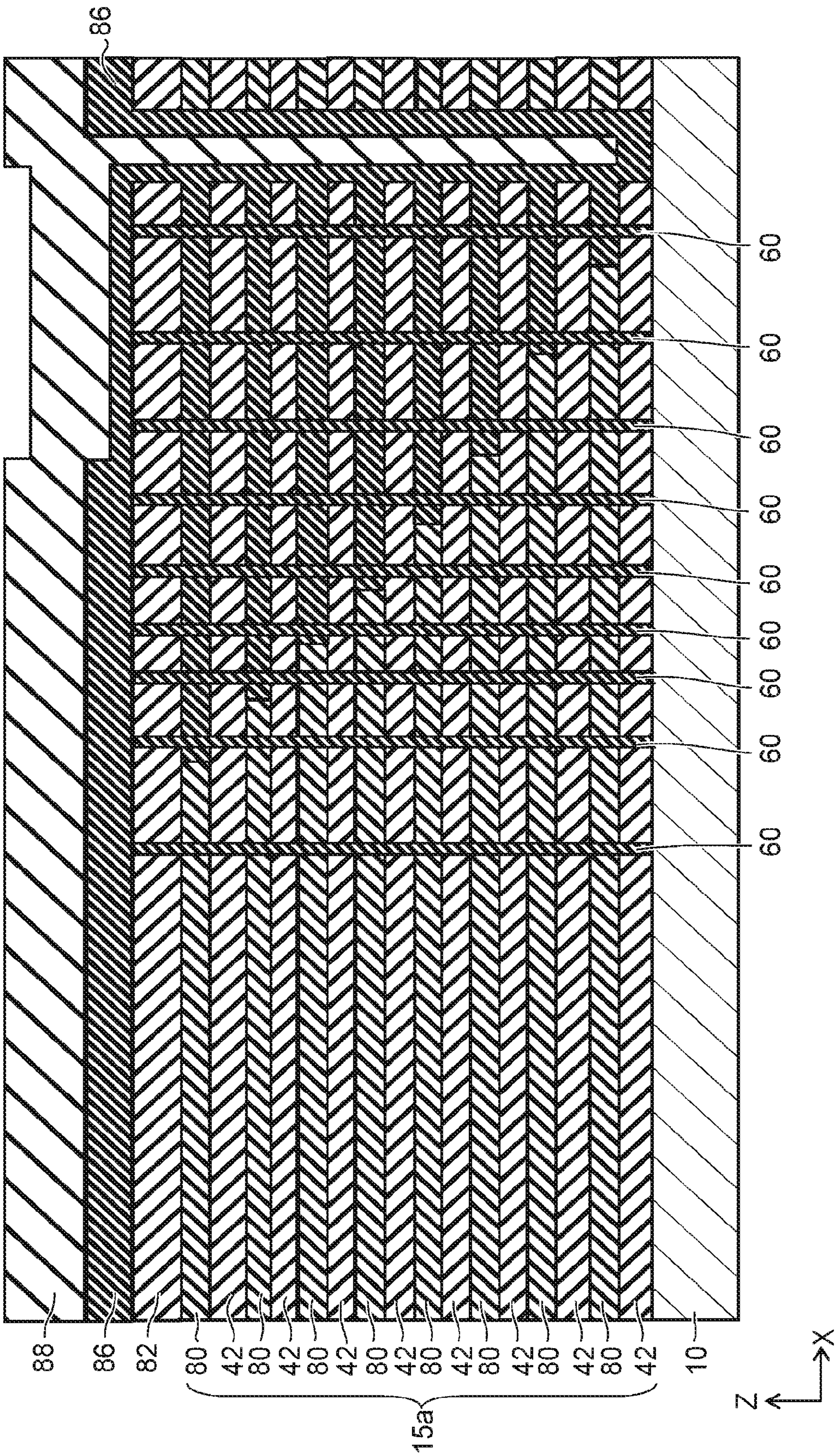

As shown in FIGS. 18A and 18B, an insulating layer 88 is formed on the whole surface, for example, by using the CVD method. The insulating layer 88 includes, for example, silicon oxide. The insulating layer 88 is embedded in the wide part TR1 of the trench TR. Since the film growth at this time occurs on both side walls and the wide part TR1 is occluded, it may be embedded with a film thin enough.

Figure 19A:
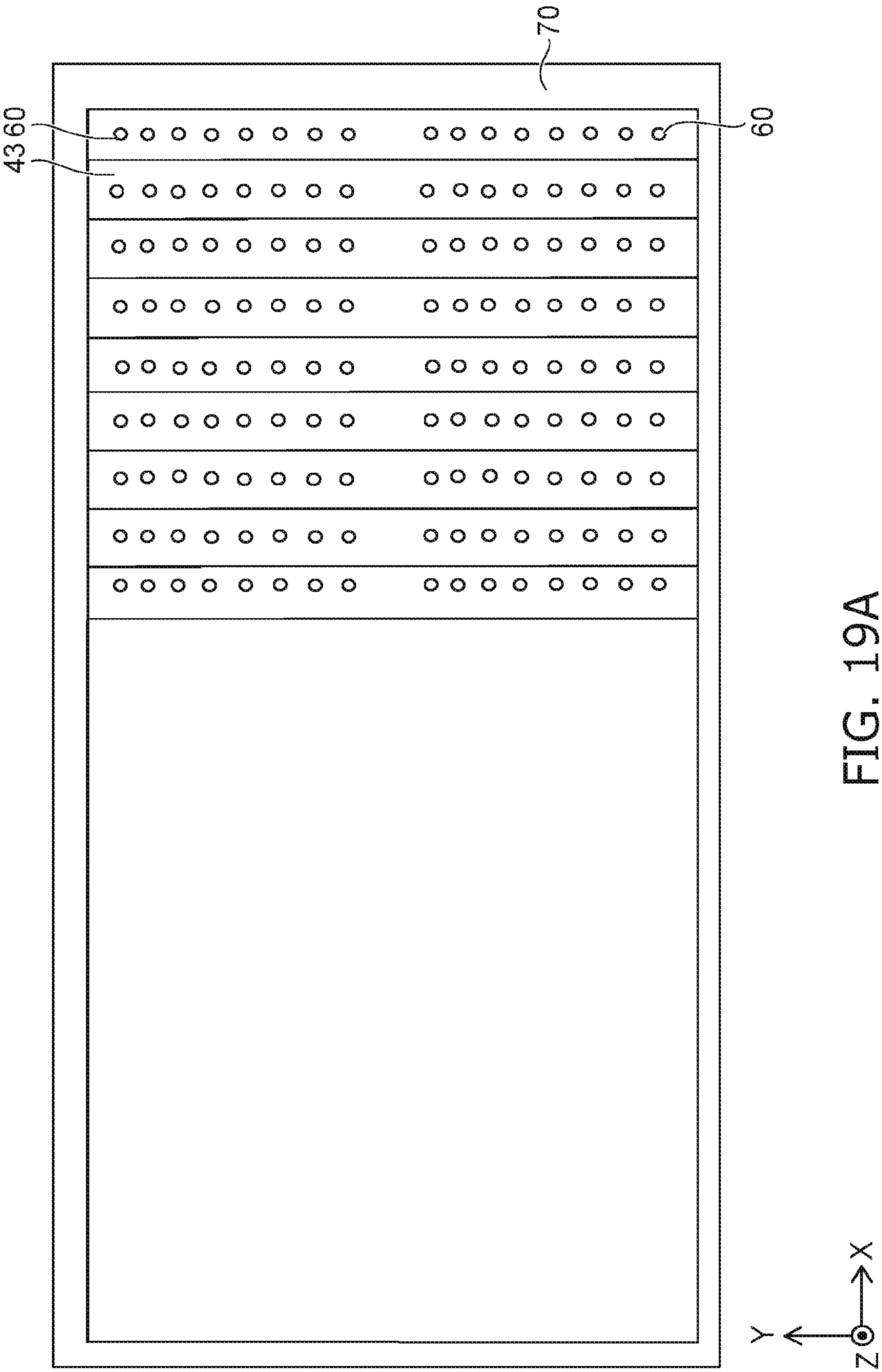
Figure 19B:
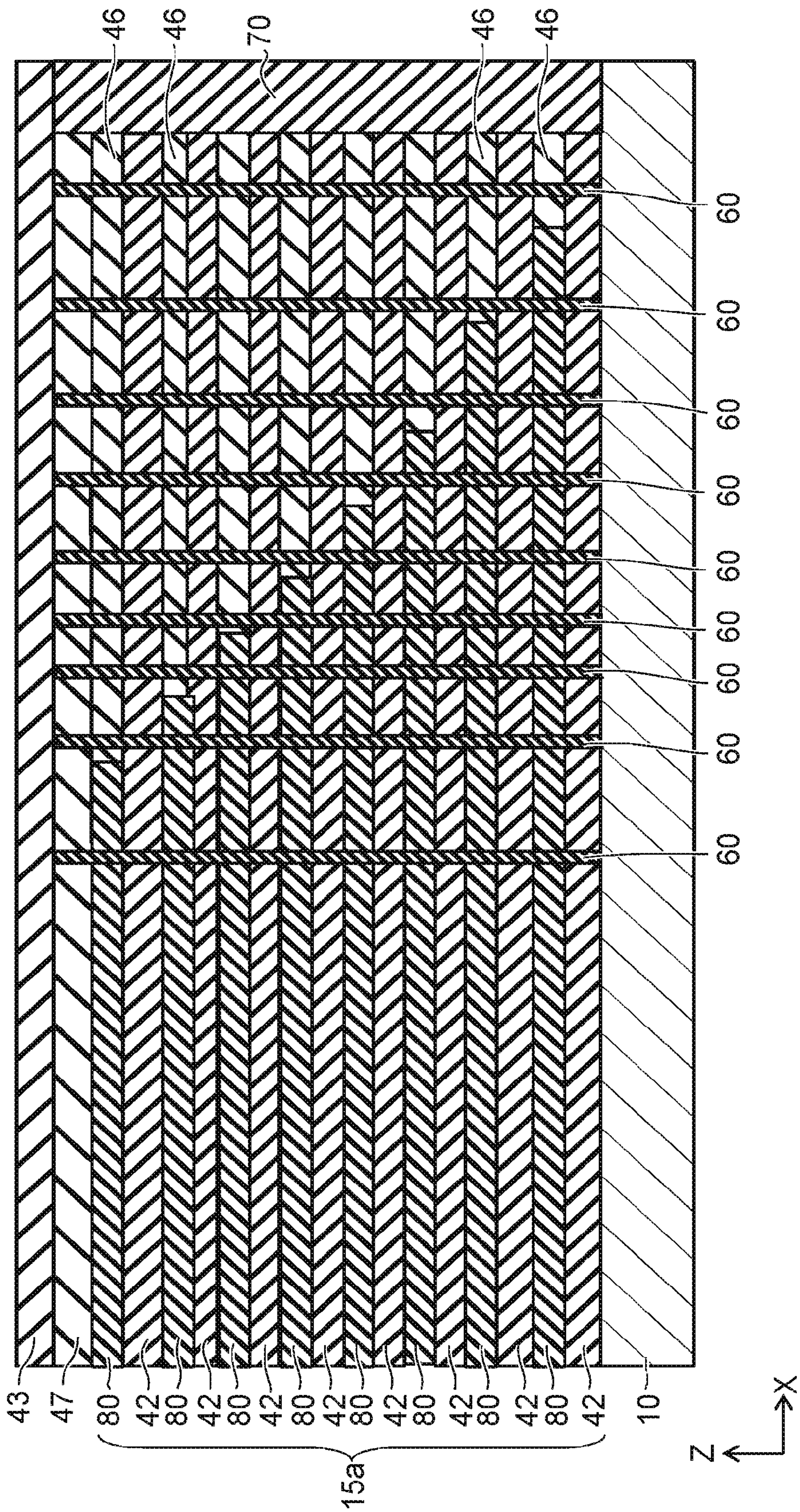

As shown in FIGS. 19A and 19B, a part of the insulating film 86 and a part of the insulating film 88 are removed, for example, using a CMP (Chemical Mechanical Polishing) method. The insulating layer 82 is planarized; and the insulating films 86 and 88 in the wide part TR1 of the trench TR are planarized therewith. Thereby, the insulating layers 46, 47 and an insulating film 70 are formed. The insulating film 70 surrounds the periphery of the stacked body 15*a*. As shown in FIG. 18B, it is difficult for the insulating film 88 formed on the insulating film 86 to have an uneven surface above the wide part TR1. Thereby, it is easy to planarize the insulating layer 82, the insulating films 86 and 88.

Subsequently, an insulating layer 43 is formed on the insulating layer 47 by depositing silicon oxide.

Figure 20A:
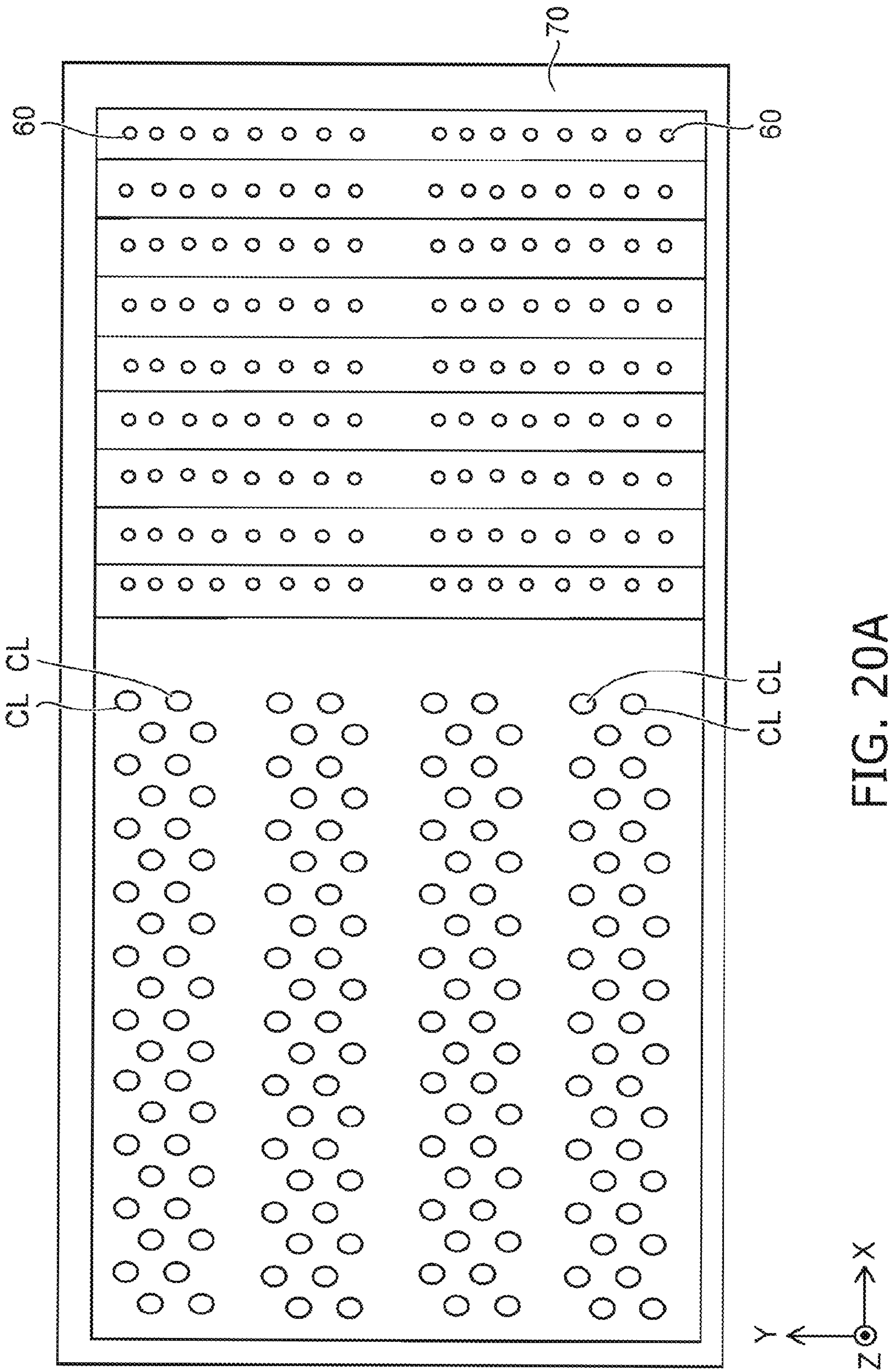
Figure 20B:
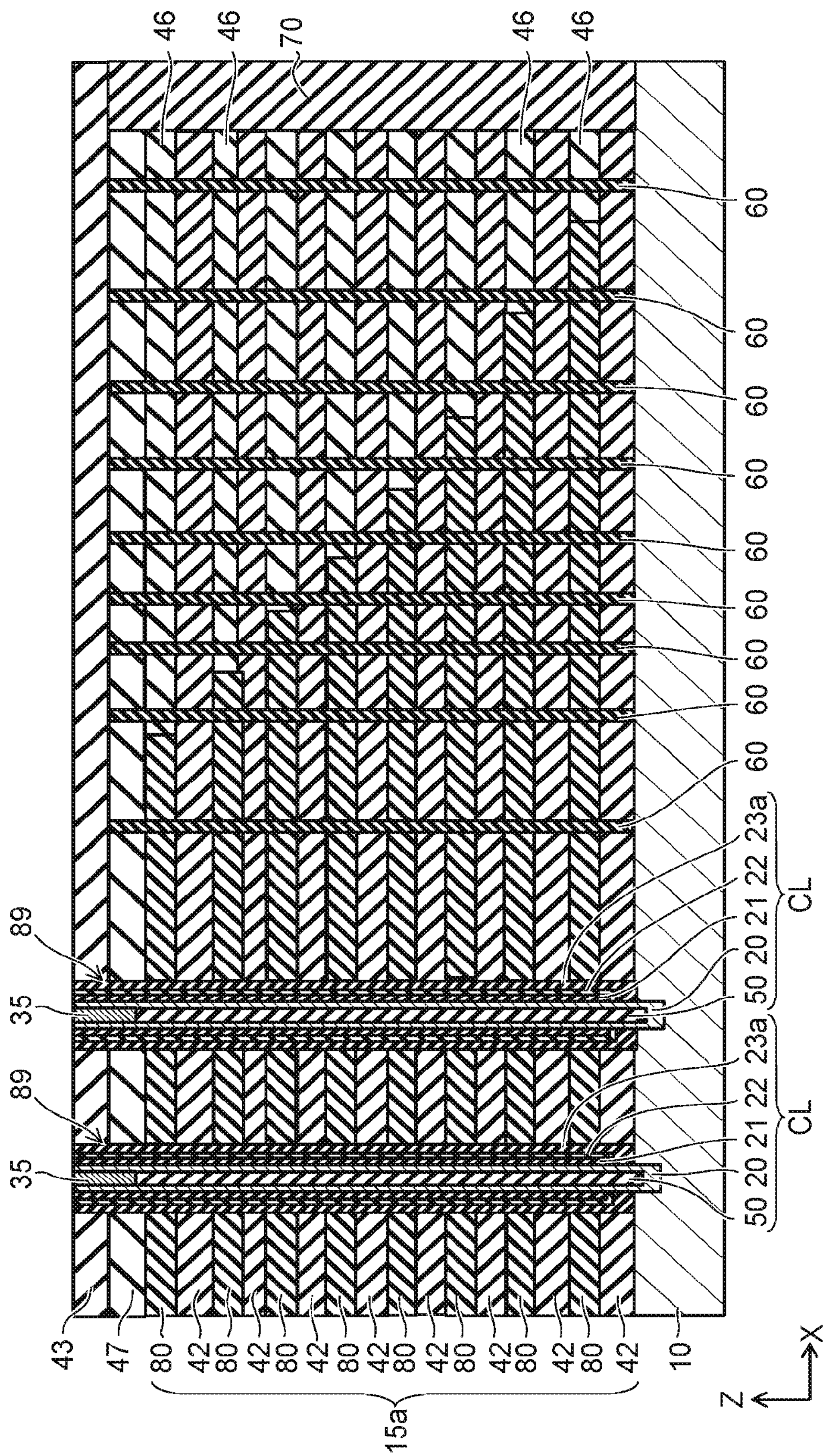

As shown in FIGS. 20A and 20B, a plurality of memory holes 89 are formed in the stacked body 15*a*, for example, using RIE. The memory hole 89 extends in the Z-direction, pierces the stacked body 15*a*, and reaches the substrate 10. For example, the plurality of memory holes 89, each having a circular shape, are disposed in a staggered arrangement in a plan view seen in the Z-direction.

Subsequently, for example, using the CVD method, an oxide film 23*a* is formed on the inner surface of the memory hole 89 by depositing silicon oxide; a charge storage film 22 is formed by depositing silicon nitride; and a tunneling insulator film 21 is formed by depositing silicon oxide. Then, parts of the tunneling insulator film 21, the charge storage film 22 and the oxide film 23*a* on the bottom surface of the memory hole 89 are removed using RIE; and thereby the substrate 10 is exposed. Subsequently, a semiconductor body 20 is formed by depositing silicon, and a core 50 is formed by depositing silicon oxide. The semiconductor body 20 is in contact with the substrate 10. Thus, a columnar body CL is formed. Then, a top portion of the core 50 is removed by etching back, and a plug portion 35 is formed by embedding impurity doped silicon. The columnar body CL is formed in the memory cell region Rm of the memory cell array MCA.

Figure 21A:
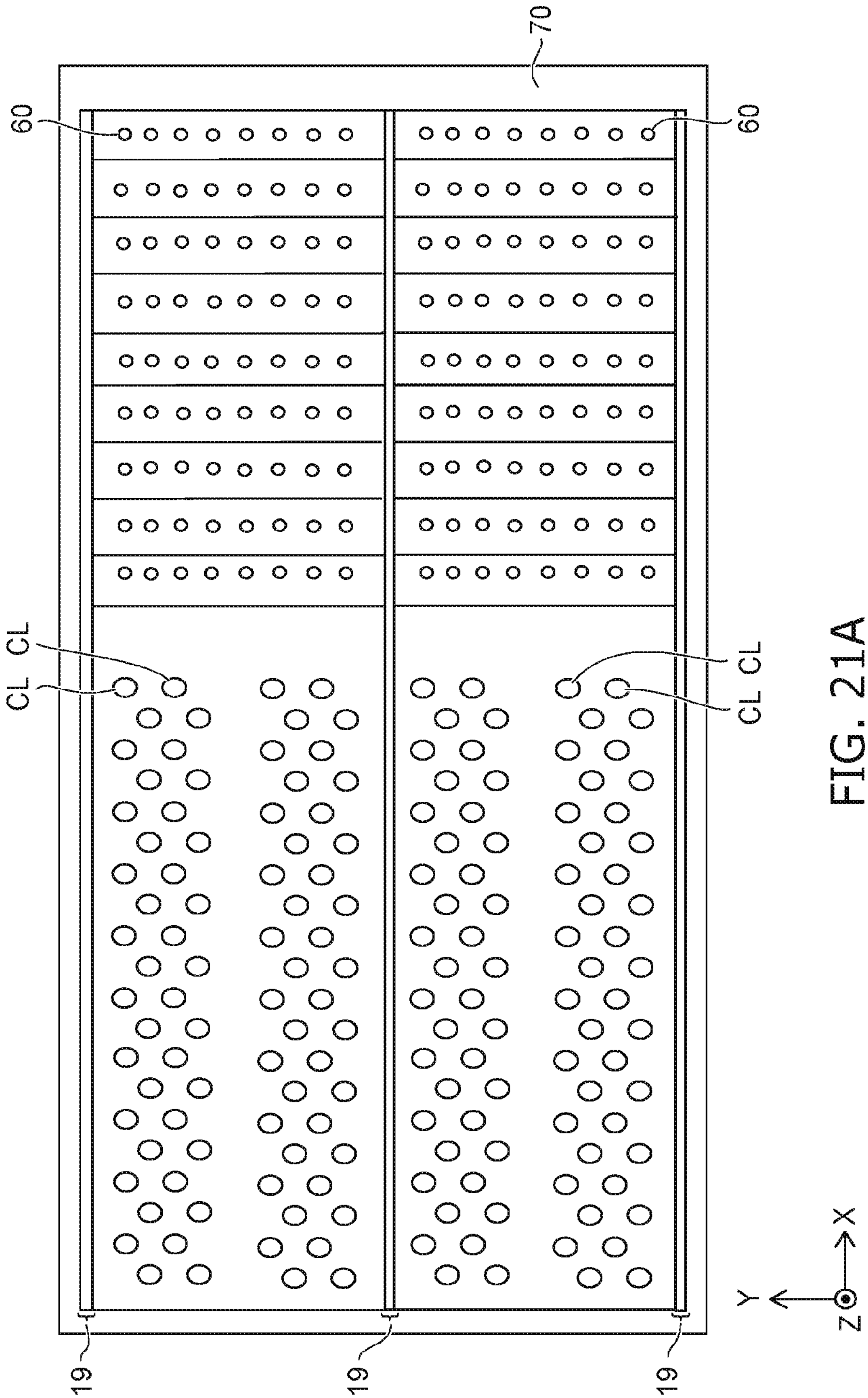
Figure 21B:
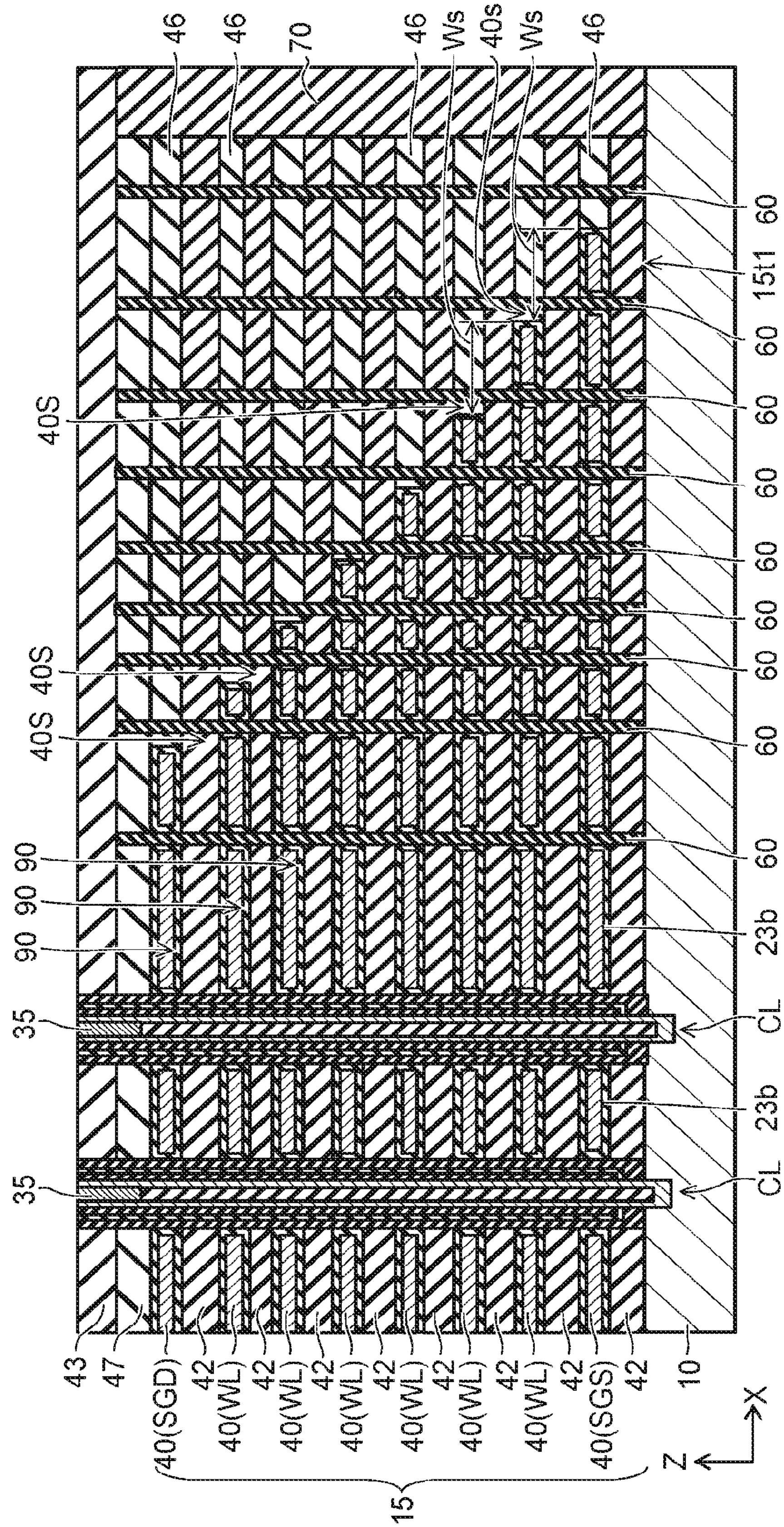

As shown in FIGS. 21A and 21B, a plurality of slits 19 extending in the X-direction are formed in the stacked body 15*a*, for example, using RIE. The slit 19 pierces the stacked body 15*a*. Thereby, the stacked body 15*a* is divided into a plurality of stacked bodies extending in the X-direction by the plurality of slits 19.

Subsequently, the sacrifice layers 80 are removed by wet-etching through the slits 19. In the case where the sacrifice layers 80 are made of silicon nitride, phosphoric acid is used for the etchant of the wet-etching, and the wet-etching is implemented using hot phosphoric acid. Hollow spaces 90 are formed by removing the sacrifice layers 80 through the slits 19. Then, a oxide film 23*b* is formed by depositing aluminum oxide through the plurality of slits 19, and then, the hollow spaces 90 are filled with a conductive layer such as tungsten deposited therein. Thereby, electrode layers 40 are formed, which include the selection gate SGD on the drain side, the selection gate SGS on the source side, and the word line WL. The sacrifice layers 80 are replaced by the electrode 40, and a stacked body 15 is formed between slits 19. The electrode layers 40 are formed into stairs at an end portion 15*t*1 of the stacked body 15, and a step 40*s* having the width W4 is formed in each electrode layer 40. Then, an insulating film (not shown), which extends in the Z-direction and the X-direction, is formed on a side wall of the slit 19 so as to electrically isolate each electrode layer 40 in the stacked body 15 from the slit 19.

Figure 22A:
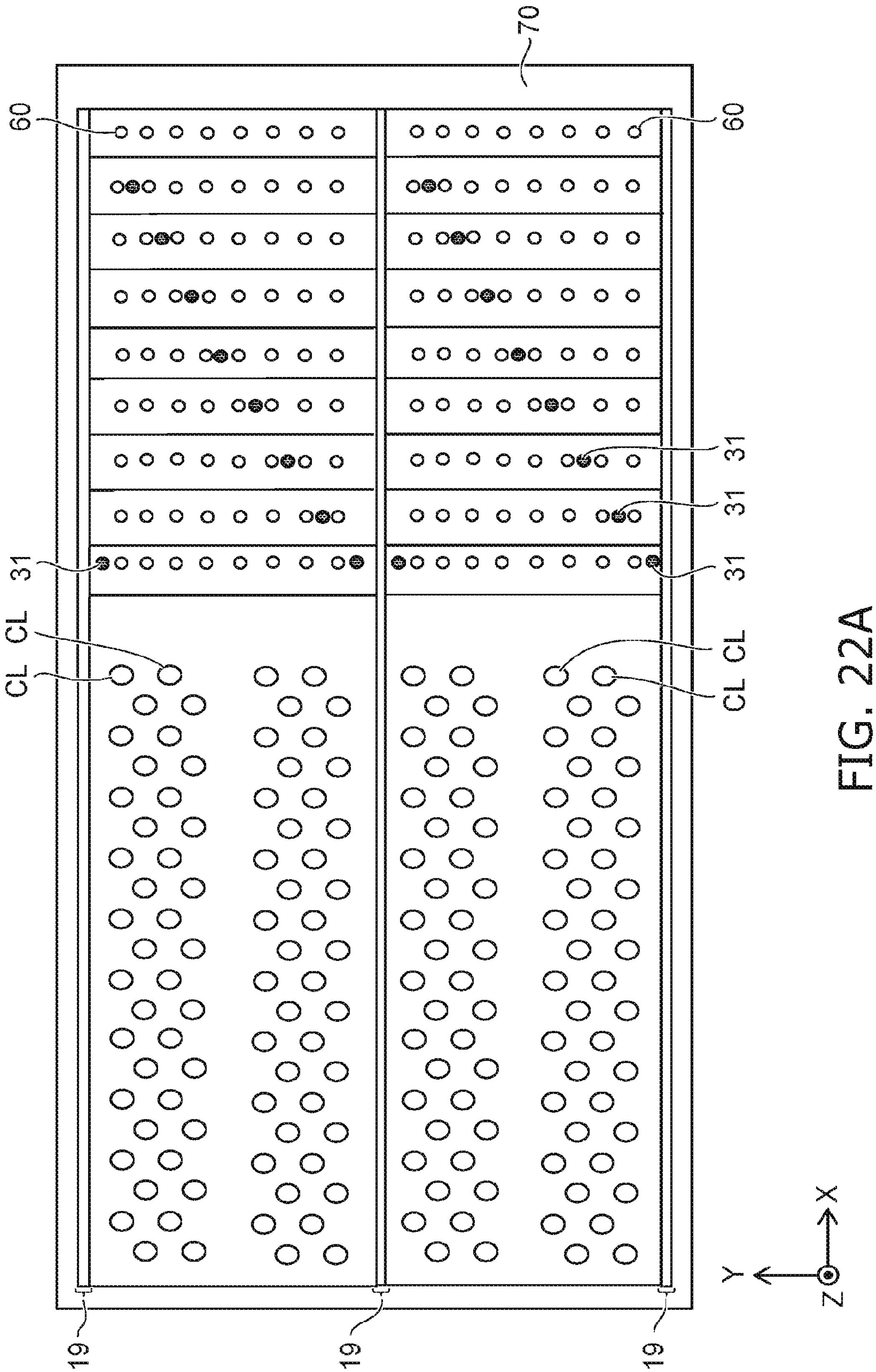
Figure 22B:
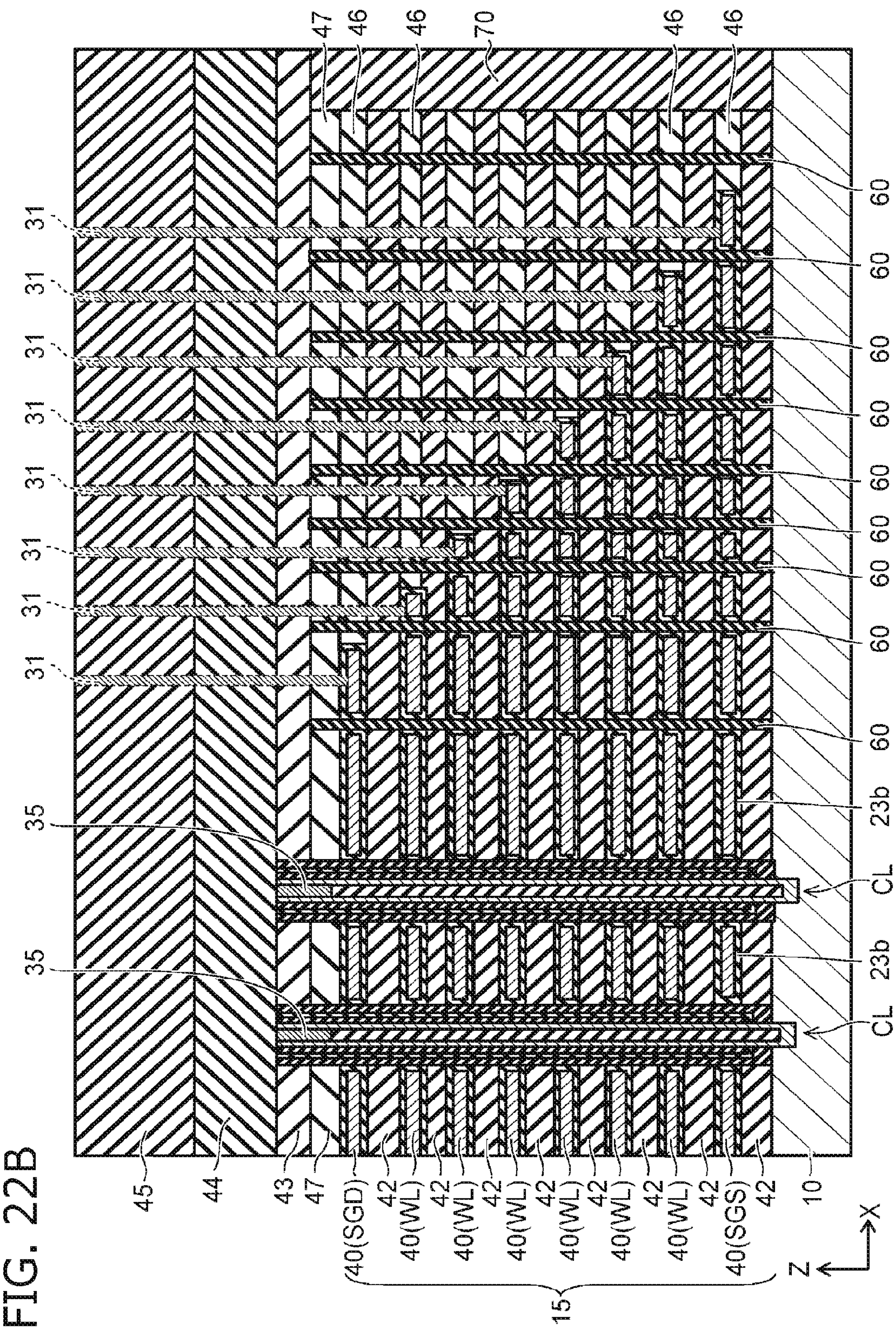

As shown in FIGS. 22A and 22B, insulating layers 44 and 45 are formed by depositing silicon oxide on the insulating layer 43, for example, using the CVD method.

Then, contact holes, which pierce the insulating layers 42, 43, 44, 45, 46 and 47, are formed in the end portion 15*t*1 of the stacked body 15, and contact plugs 31 are formed by embedding metallic material such as tungsten and like in the contact holes. A bottom end of the contact plug 31 is connected to the electrode layer 40.

Figure 23A:
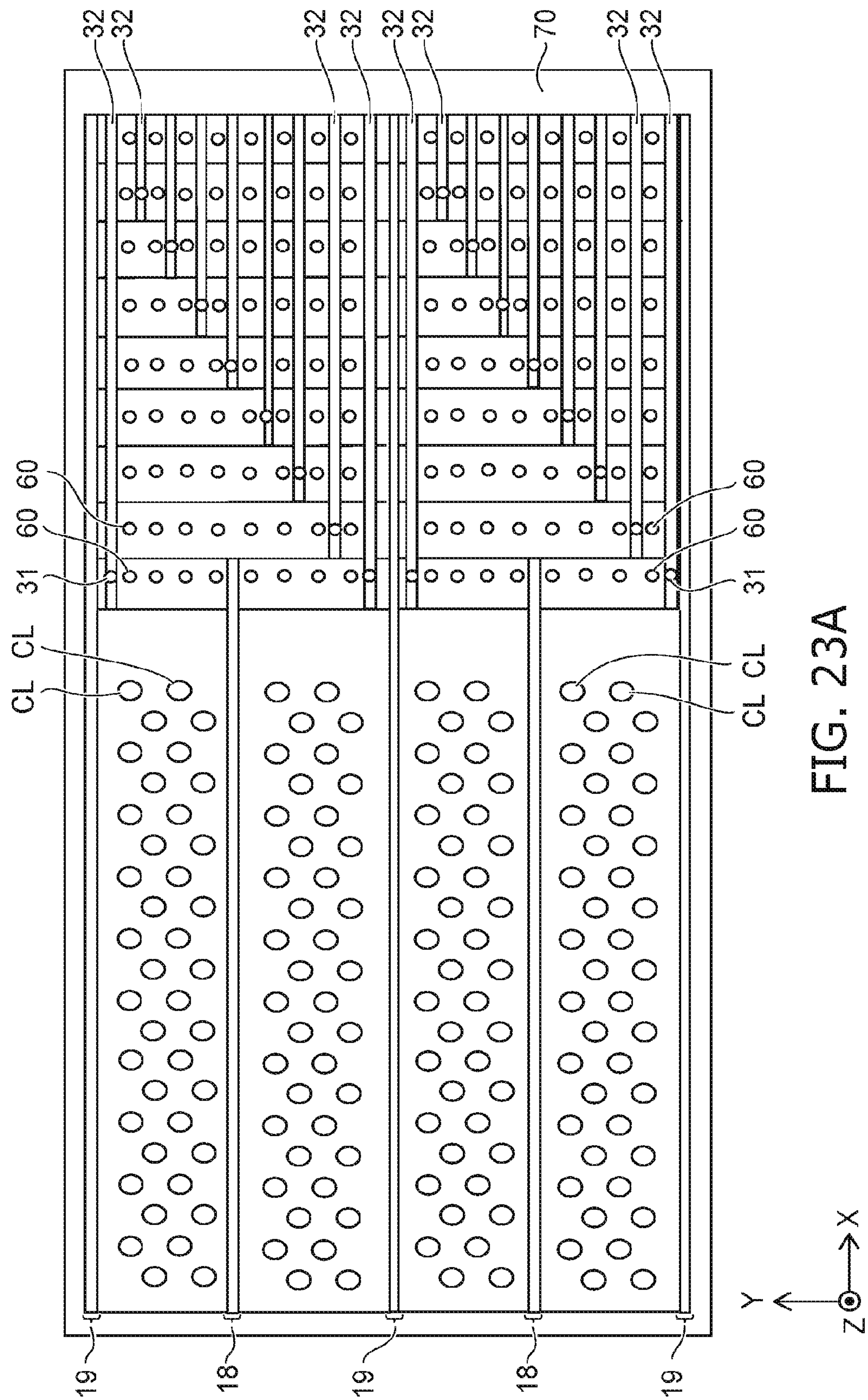
Figure 23B:
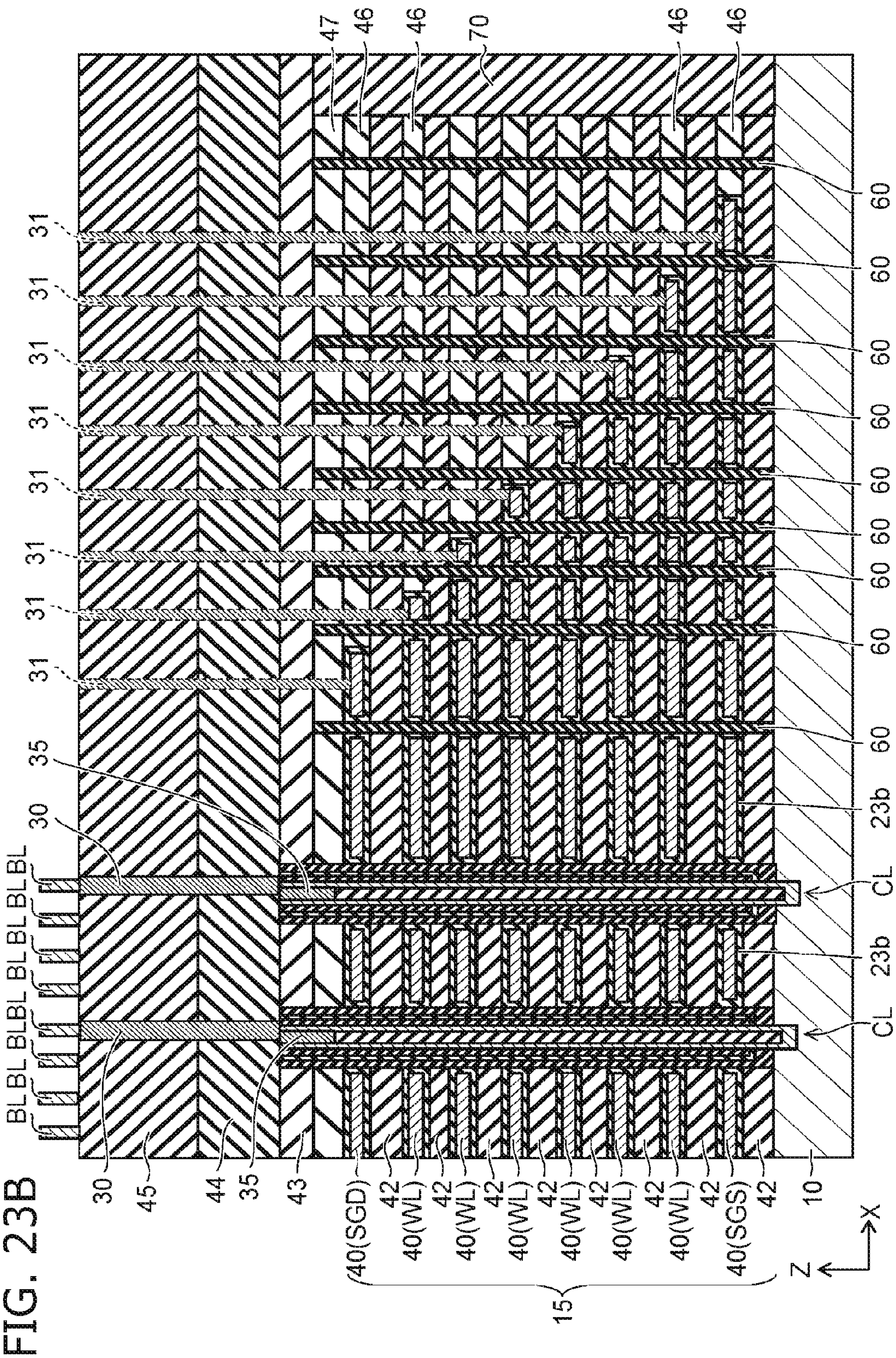

As shown in FIGS. 23A and 23B, a plurality of slits 18 extending in the X-direction are formed in the stacked body 15, for example, using RIE. The slit 18 is formed in the stacked body 15 with a depth enough to reach the selection gate SGD on the drain side that is the uppermost layer, and pierces the insulating layers 43, 44, 45, 46, 47 and the selection gate SGD on the drain side. Then, a silicon oxide layer is deposited in the slit 18, making it possible to electrically isolate selection gates SGD on the drain side from each other in the Y-direction. Subsequently, contact holes, which pierce the insulating layers 44 and 45, are formed; and a contact plug 30 connected to the plug portion 35 is formed by embedding metallic material such as tungsten in the contact hole. Then, bit lines BL connected to contact plugs 30 are formed, and, upper interconnections 32 connected to contact plugs 31 are formed.

The semiconductor memory device 1 according to the first embodiment is manufactured as mentioned above.

Hereinafter, some advantages of the first embodiment are described.

Figure 24A:
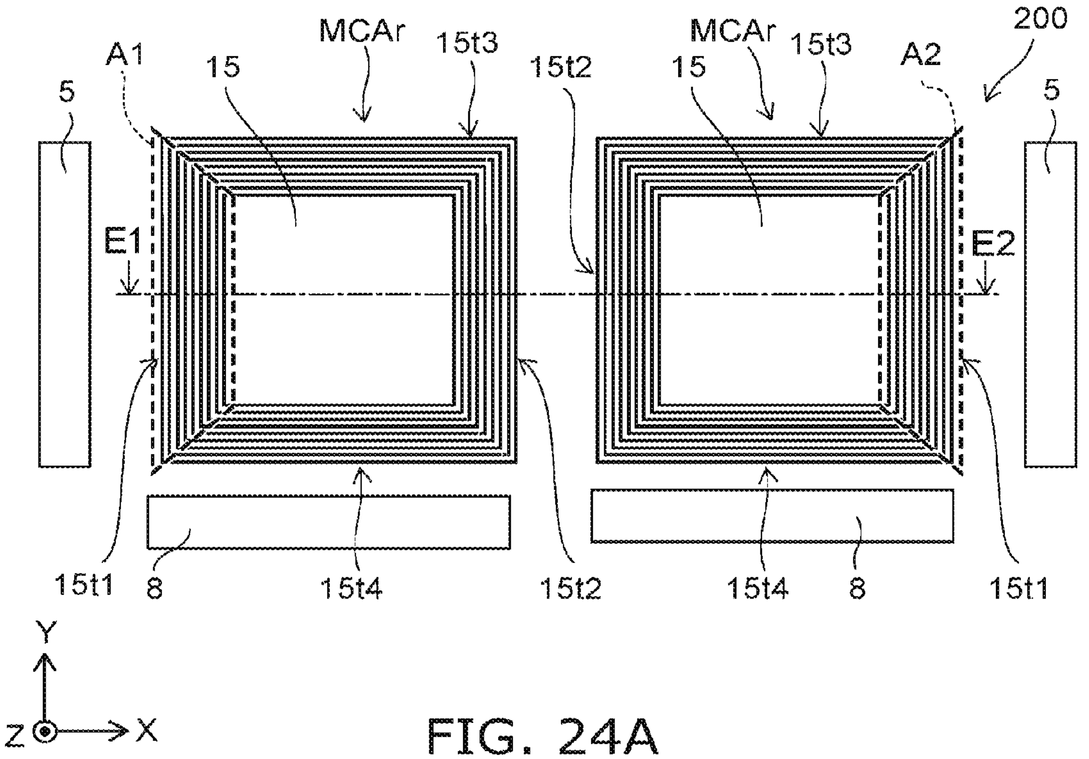
FIGS. 24A and 24B are a plan view and a cross-sectional view showing a semiconductor memory device according to a reference example.
Figure 24B:
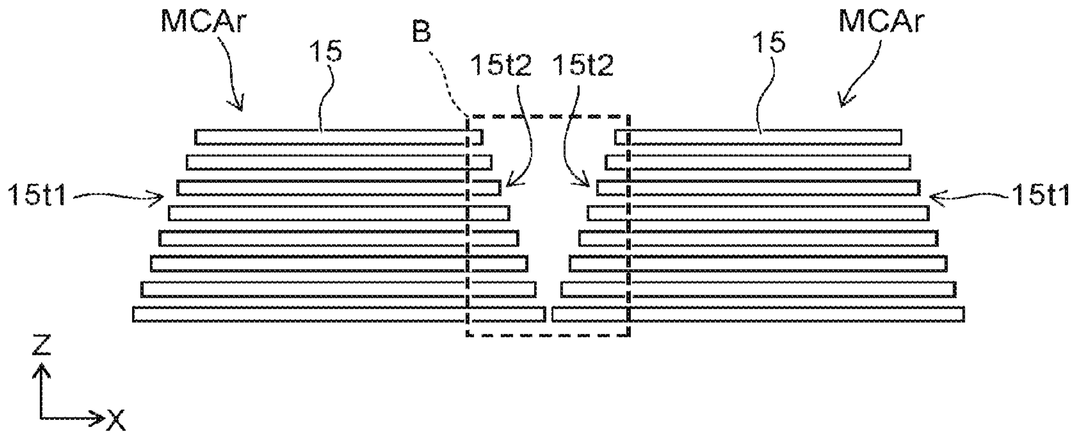

FIGS. 24A and 24B are plan and cross-sectional views showing a semiconductor memory device of a reference example. FIG. 24A is the plan view of a memory cell array. FIG. 24B is the cross-sectional view showing an X-Z cross-section take along E1-E2 line in FIG. 24A.

In a semiconductor memory device having the three dimensional structure, an end portion of a memory cell array is formed into stairs by etching a portion of a stacked body; and the end portion is electrically connected to a peripheral circuit via upper interconnections provided over steps. The end portion of the stairs shape is formed by repeating a step of etching the resist thereon for adjusting the etching amount of the stacked body and a step of etching the stacked body downward, using photolithography.

In the case where the end portion of stairs shape is formed by the repetition of such etching steps, the resist etching (i.e. resist slimming) is implemented in the X-direction, the Y-direction and reverse directions thereof. Thereby, as shown in FIGS. 24A and 24B, the end portions 15_t_1, 15_t_2, 15_t_3 and 15_t_4 of the stairs shape are formed in each stacked body 15 in the memory cell array MCAr of the semiconductor memory device 200.

As shown in the regions A1 and A2 of FIG. 24A, when the upper interconnects 32 are provided over the end portion 15_t_1 of the stairs shape in each stacked body 15 so as to be connected to the peripheral circuit, the end portions 15_t_2, 15_t_3 and 15_t_4 of the stairs shape in each stacked body 15 become dummy patterns. Such dummy pattern make the area of the semiconductor memory device 200 enlarged in X-Y directions comparing the case without the dummy pattern. For example, when the end portion 15_t_2 is formed into stairs, an area in the X-Y directions of the region (a region B in FIG. 24B) in which the end portions 15_t_2 face each other is enlarged in comparing with the case where the end portion 15_t_2 is not formed into stairs.

Furthermore, enlarging regions of the end portions 15_t_2, 15_t_3 and 15_t_4 of the stairs shape (i.e. dummy patterns) with respect to the region of the semiconductor memory device 200 means enlarging the region including steps 40_s_ formed in the end portions 15_t_2, 15_t_3 and 15_t_4 with respect to the region of the semiconductor memory device 200. Thus, it becomes difficult to planarize the surface over the end portions 15_t_2, 15_t_3 and 15_t_4 by forming an insulating layer and like thereon in comparing with the case where the end portions 15_t_2, 15_t_3 and 15_t_4 are not formed into stairs.

In the first embodiment, the insulating film 70 is provided in the memory cell array MCA of the semiconductor memory device 1 so as to surround the electrode layers 40 of the stairs shape in the stacked body 15. Thereby, when the electrode layers 40 are formed into stairs in the end portion 15_t_1 of the stacked body 15, it becomes possible to form the electrode layers 40 into stairs in the end portion 15_t_1 of the stacked body 15 without forming the dummy pattern. Thus, the semiconductor memory device 1 may have a small area in the X-Y directions.

Further, it is possible to reduce an area in the X-Y direction of the region in which the dummy patterns (e.g. the end portions 15_t_2) face each other. For example, when comparing regions shown in FIGS. 5B and 24B, in which the end portions 15_t_2 face each other, the area in the X-Y directions of the region in which the end portions 15_t_2 face each other in FIG. 5B becomes smaller than the area in the X-Y directions of the region in which the end portions 15_t_2 face each other in FIG. 24B. Thereby, as shown in FIG. 5B, it becomes possible in the semiconductor memory device 1 to reduce the area in the X-Y directions.

As the first embodiment, since the electrode layers 40 are formed into stairs in the end portion 15_t_1 without forming the dummy pattern, it is possible to make the region including steps 40_s_ small with respect to the region of the semiconductor memory device 1 comparing with the case of forming the dummy patterns. When the region including the steps 40_s_ is small, it becomes possible to easily implement the planarization process over the steps 40_s_.

Second Embodiment

Figure 25:
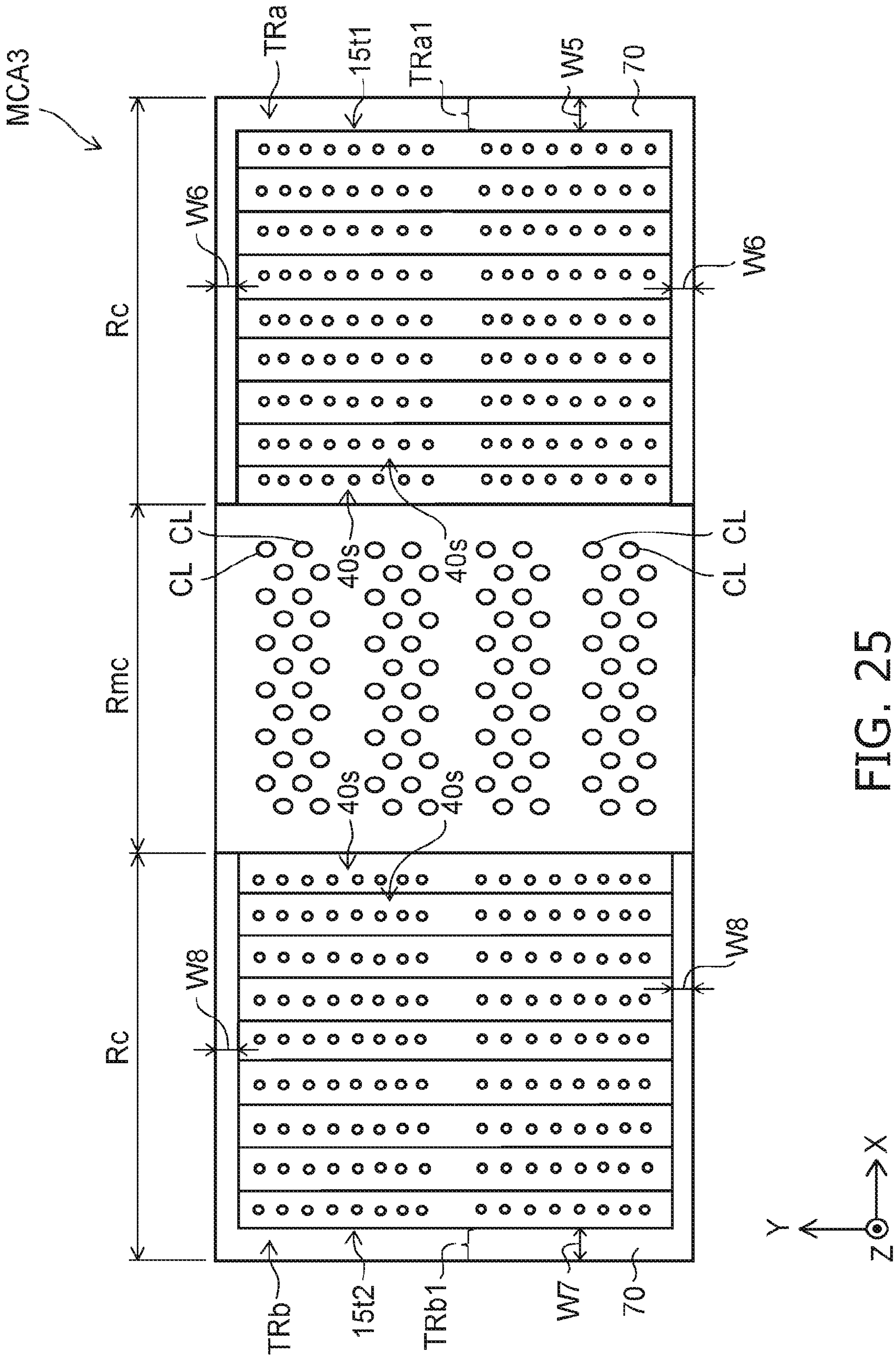
FIG. 25 is a plan view of a part of the semiconductor memory device according to a second embodiment.

FIG. 25 is a plan view of a part of a semiconductor memory device according to a second embodiment.

Figure 26:
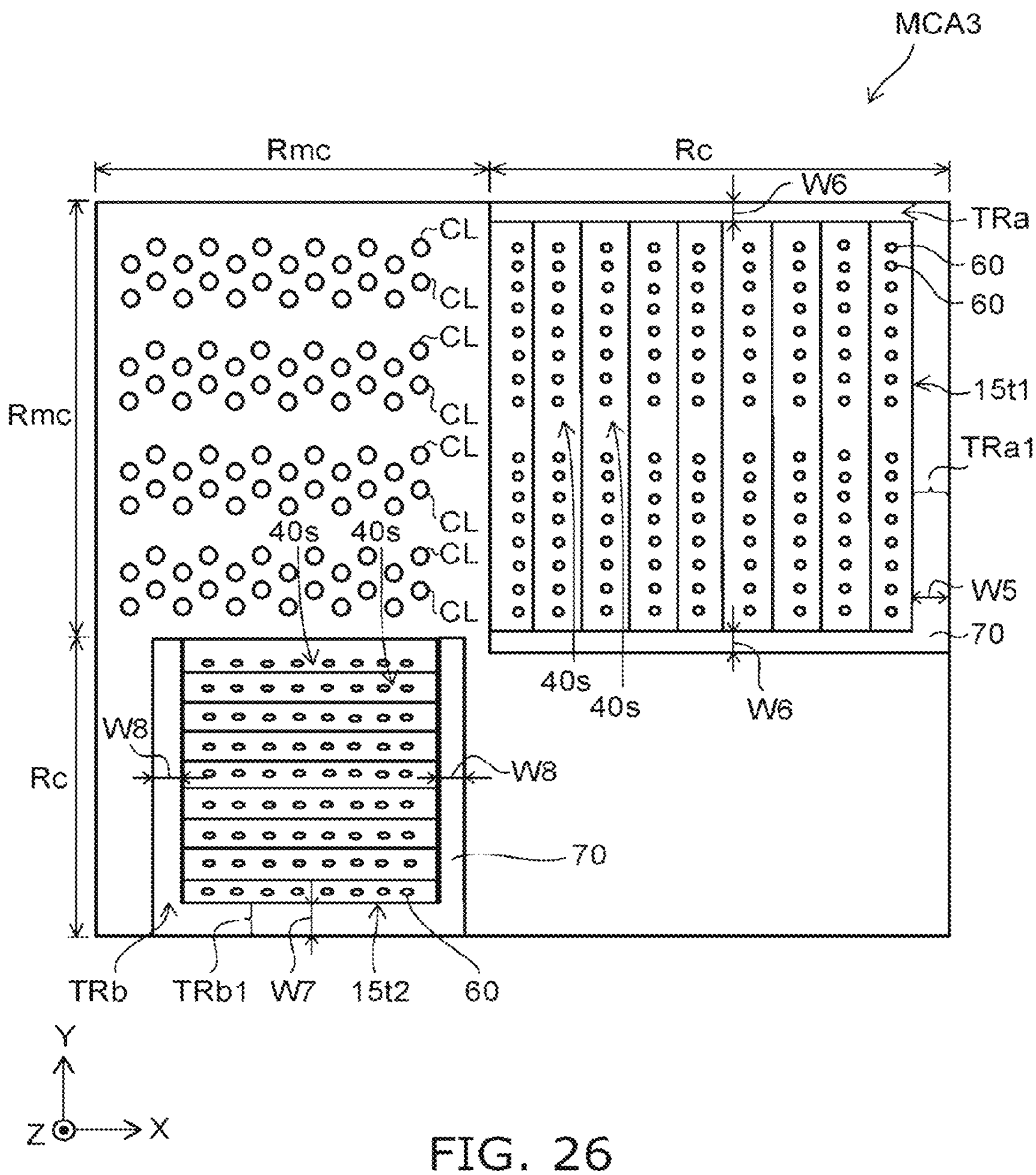
FIG. 26 is a plan view of a part of another semiconductor memory device according to the second embodiment.

FIG. 26 is a plan view of a part of another semiconductor memory device according to the second embodiment.

FIGS. 25 and 26 are plan views of a memory cell array MCA3 of the semiconductor memory device 100. It should be noted that illustrating bit lines BL, contact plug 31 and upper interconnections 32 are omitted in FIGS. 25 and 26.

The second embodiment is different in a number of end portions from the first embodiment, in which electrode layers 40 are formed into stairs. Constitutions other than this are the same as those in the first embodiment, and precise descriptions thereof are omitted.

As shown in FIG. 25, in the contact region Rc of the memory cell array MCA 3, electrode layers 40 in the stacked body 15 are formed into stairs; and a step 40_s_ is formed in each electrode layer 40. The electrode layers 40 are formed into stairs in the end portions 15_t_1 and 15_t_2 of the stacked body 15. The end portion 15_t_1 is positioned at an end in the X-direction, and the end portion 15_t_2 is positioned at an end in a reverse direction of the X-direction. A trench TRa is provided to surround the end portion 15_t_1; and a trench TRb is provided to surround the end portion 15_t_2.

The Trench TRa includes a wide part TRa1 that extends in the Y-direction in the vicinity of the end portion 15_t_1 of the stacked body 15. In the trench TRa, a width W5 of the wide part TRa1 is larger than a width W6 of a part other than the wide part TRa1.

The Trench TRb includes a wide part TRb1 that extends in the Y-direction in the vicinity of the end portion 15_t_2 of the stacked body 15. In the trench TRb, a width W7 of the wide part TRb1 is larger than a width W8 of a part other than the wide part TRb1.

An insulating film 70 is provided in the trenches TRa and TRb.

Whereas the number of the end portion in the electrode layers 40 are formed into stairs is 1 in the first embodiment, the number of such an end portion is 2 in the second embodiment. For example, the electrode layers 40 may be formed into stairs in the end portion **15*t*1 positioned at the end in the X-direction and in 15*t*2 positioned at the end in the reverse direction of the Y-direction, as shown in FIG. 26. In this case, the width W5 of the wide part TRa1 is larger than the width W6 of the part other than the wide part TRa1 in the trench TRa surrounding the end portion 15*t*1. The width W7 of the wide part TRb1 is larger than the width W8 of the part other than the wide part TRb1 in the trench TRb surrounding the end portion 15*t*2**.

Figure 27:
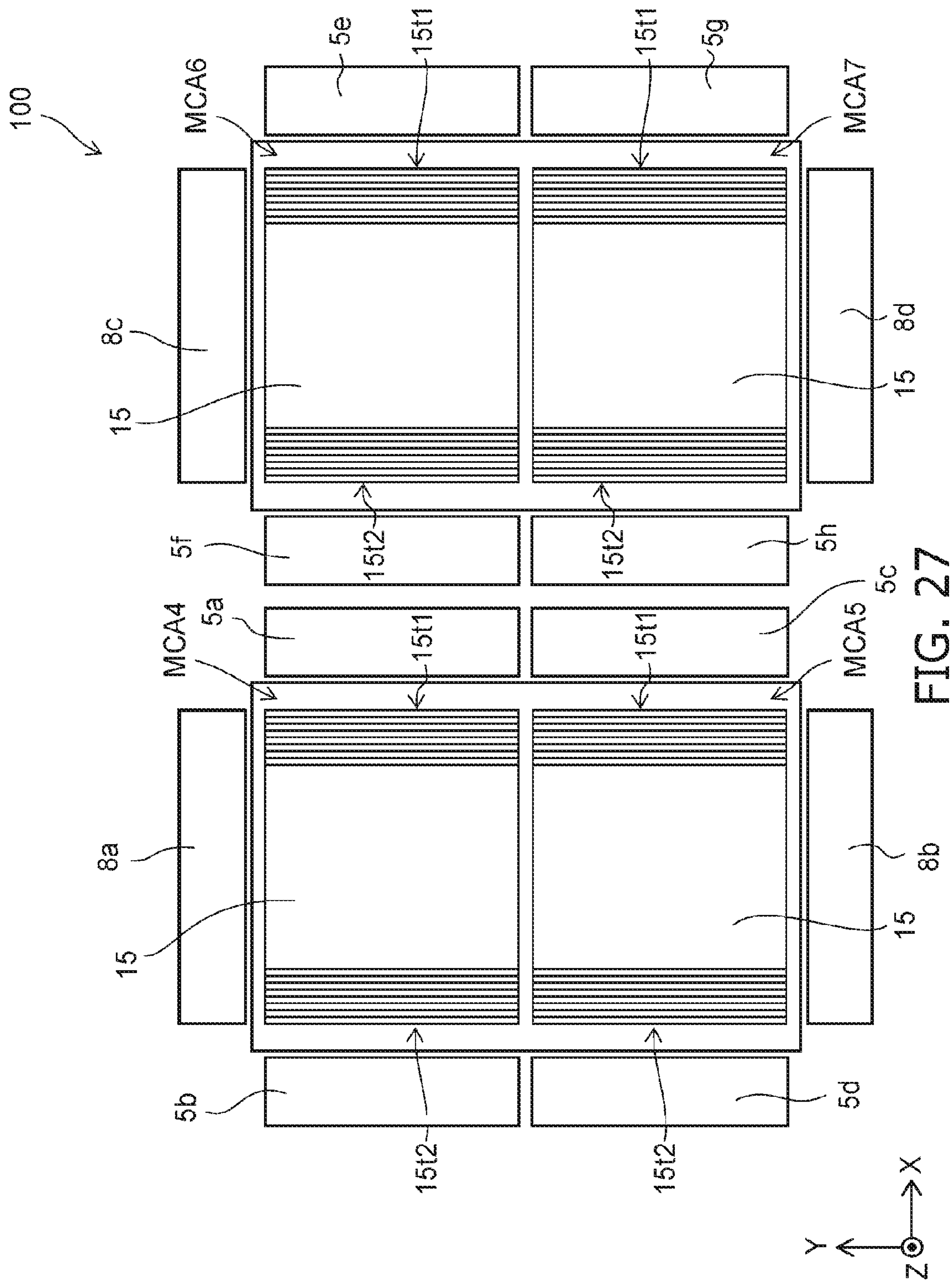
FIG. 27 is a plan view showing the semiconductor memory device according to the second embodiment.

FIG. 27 is a plan view of the semiconductor memory device 100.

In FIG. 27, two chips are disposed side by side in the X-direction, each of which includes a memory region and a peripheral region.

As shown in FIG. 27, memory cell arrays MCA4 and MCA5 are provided in the memory region; and low decoders **5*a* to 5*d*, sense amplifiers 8*a* and 8*b* are provided in the peripheral region. The low decoders 5*a*, 5*b* and the sense amplifier 8*a* are electrically connected to the memory cell array MCA4; and the low decoders 5*c*, 5*c* and the sense amplifier 8*b* are electrically connected to the memory cell array MCA5**.

Memory cell arrays MCA6 and MCA7 are provided in the memory region; and low decoders **5*e* to 5*h*, sense amplifiers 8*c* and 8*d* are provided in the peripheral region. The low decoders 5*e*, 5*f* and the sense amplifier 8*c* are electrically connected to the memory cell array MCA6; and the low decoders 5*g*, 5*h* and the sense amplifier 8*d* are electrically connected to the memory cell array MCA7**.

In the memory cell arrays MCA4 and MCA5, end portions **15*t*1 and 15*t*2 of a stacked body 15 are position at both ends in the X-direction. Electrode layers 40 are formed into stairs in the end portions 15*t*1 and 15*t*2**.

In the memory cell arrays MCA6 and MCA7, end portions **15*t*1 and 15*t*2 of a stacked body 15 are position at both ends in the X-direction. Electrode layers 40 are formed into stairs in the end portions 15*t*1 and 15*t*2**.

Hereinafter, a manufacturing method of the semiconductor memory device according to the second embodiment is described.

FIGS. 28 to 32 are views showing the manufacturing method of the semiconductor memory device according to the second embodiment.

The manufacturing method of the semiconductor memory device according to the second embodiment is different in the method for forming the trenches TRa and TRb from the manufacturing method of the semiconductor memory device according to the first embodiment. Since the processes of the downward etching and the lateral etching in each of the trenches TRa and TRb are the same as described in FIGS. 12A and 12B to 16A and 16B, drawings and descriptions corresponding thereto are omitted. Since the processes after the downward etching and the lateral etching are the same as described in FIGS. 17A and 17B to 23A and 23B, drawings and descriptions corresponding thereto are omitted.

FIGS. 28 to 32 are plan views showing the manufacturing method of the memory cell array MCA3 of the semiconductor memory device 1. Planes shown in FIGS. 28 to 32 are equivalent to a plane in FIG. 26.

Figure 28:
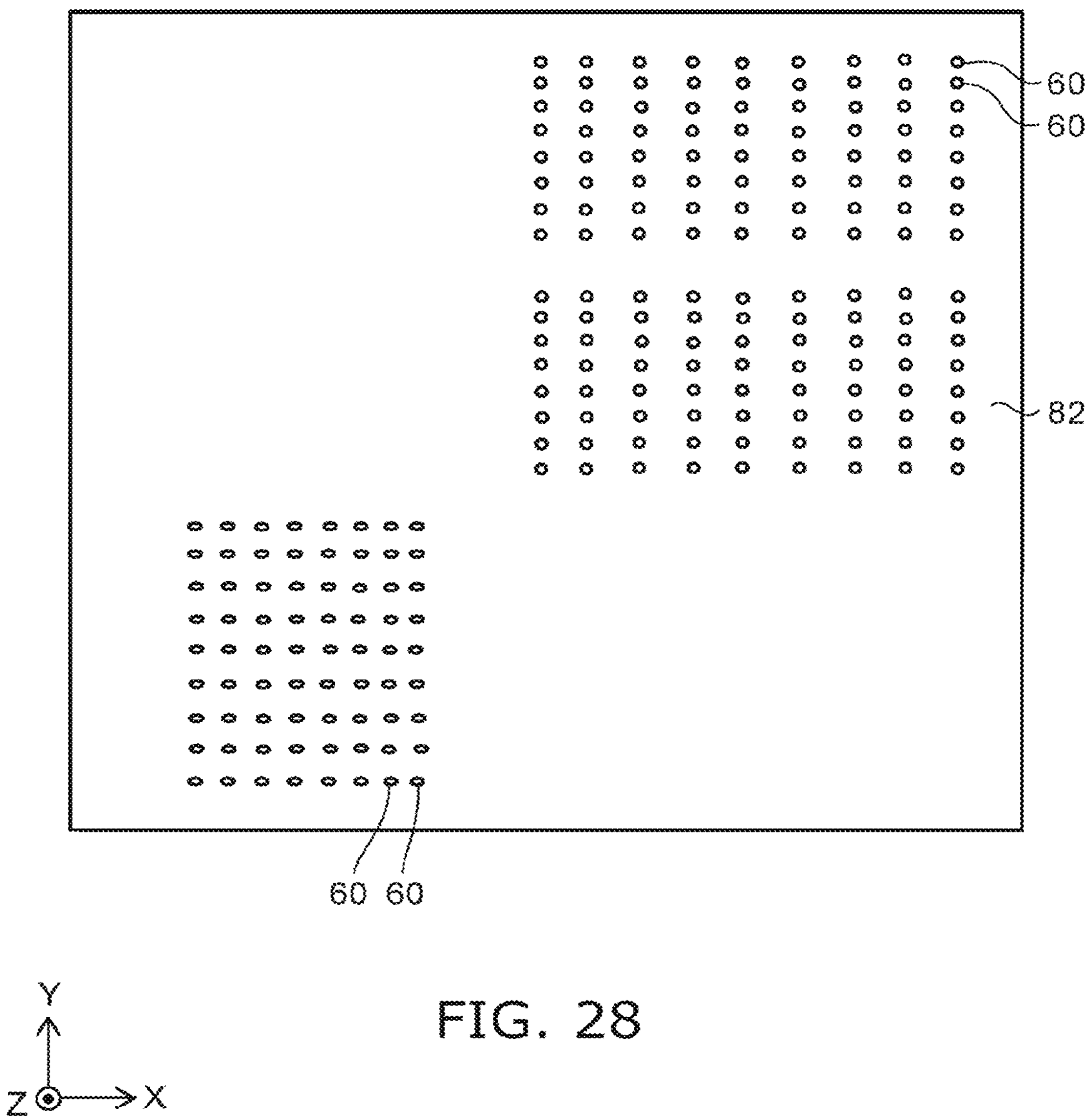
FIGS. 28 to 32 are views showing a manufacturing method of the semiconductor memory device according to the second embodiment.

As shown in FIG. 28, a stacked body **15*a* is formed on a substrate 10 by alternately stacking an insulating layer 42 and a sacrifice layer 80 in the Z-direction. Subsequently, an insulating layer 82 is formed on the stacked body 15*a* by depositing silicon oxide. Then, columnar members 60 are formed in the stacked body 15*a* and the insulating layer 82**.

Figure 29:
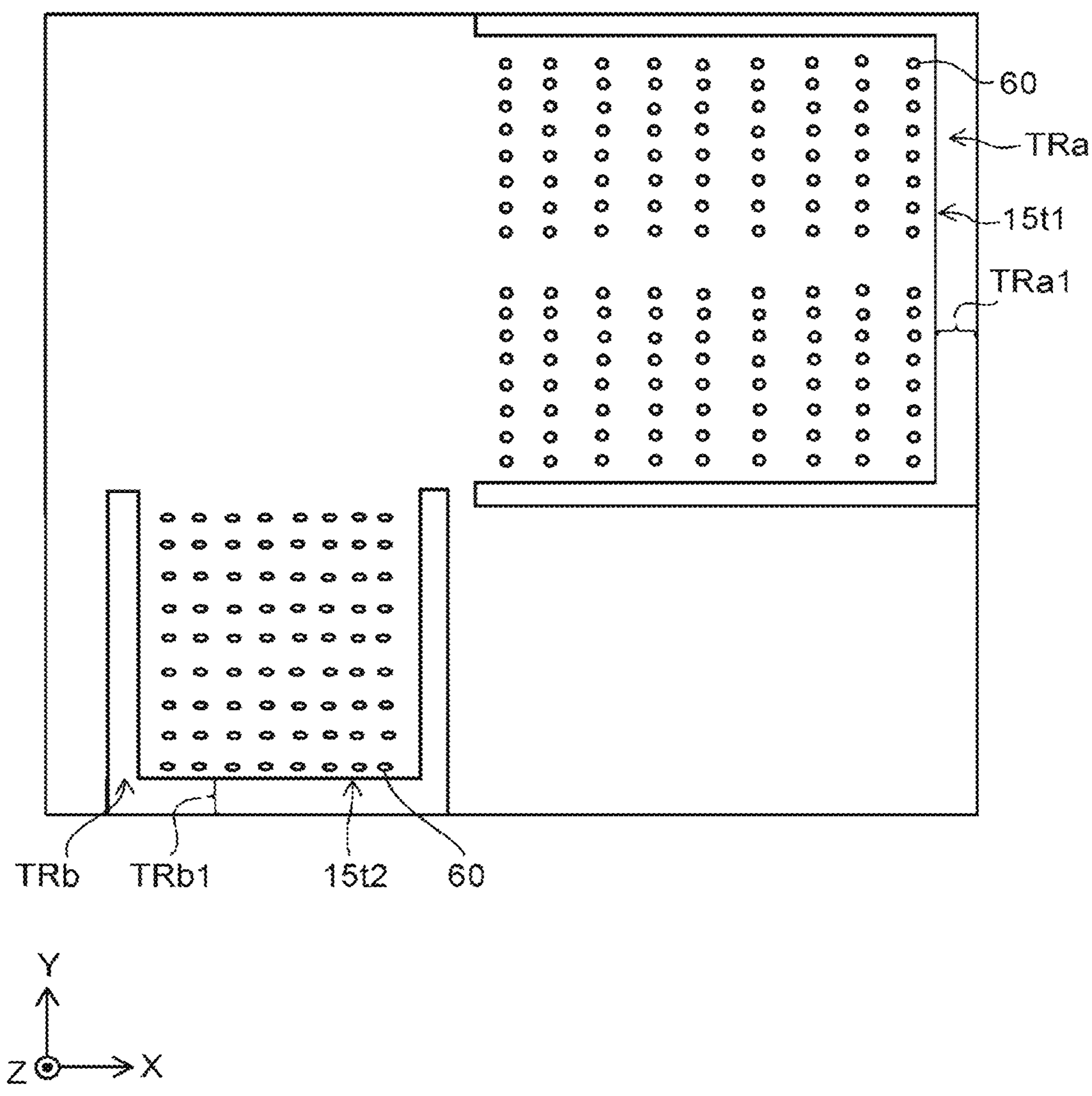

As shown in FIG. 29, trenches TRa and TRb are formed in the stacked body **15*a* using photolithography and RIE. The trench TRa is formed to surround an end portion 15*t*1; and the trench TRb is formed to surround an end portion 15*t*2**.

The trench TRa includes a wide part TRa1 extending in the Y-direction in the vicinity of the end portion **15*t*1 of the stacked body 15. The trench TRb includes a wide part TRb1 extending in the X-direction in the vicinity of the end portion 15*t*2 of the stacked body 15**.

Figure 30:
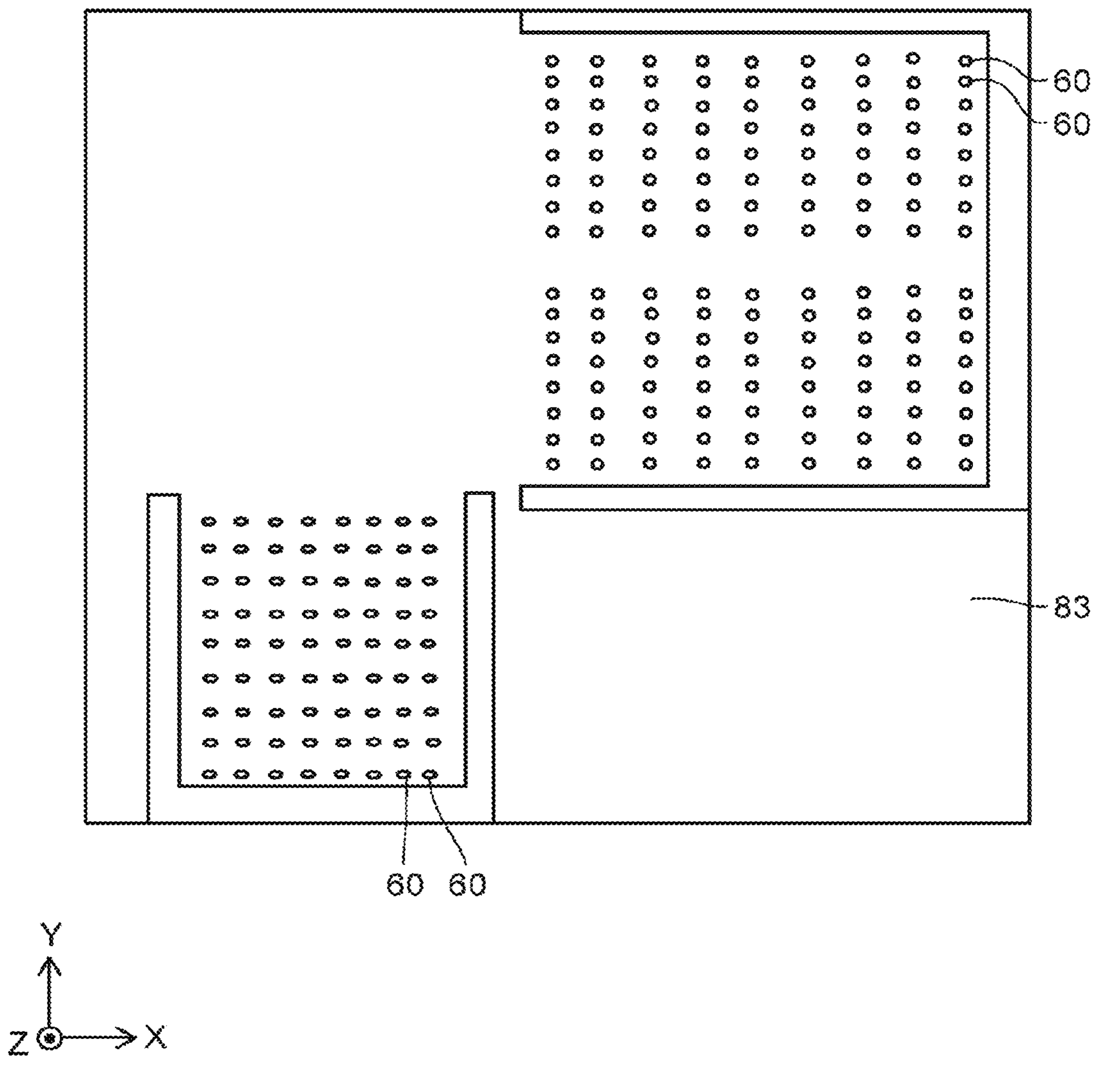

As shown in FIG. 30, a protection film 83 is formed over the whole surface. The protection film 83 is formed on the insulating film 82, on the inner wall and the bottom surface of the wide part TRa1 of the trench TRa, and on the inner wall and the bottom surface of the wide part TRb1 of the trench TRb.

Figure 31:
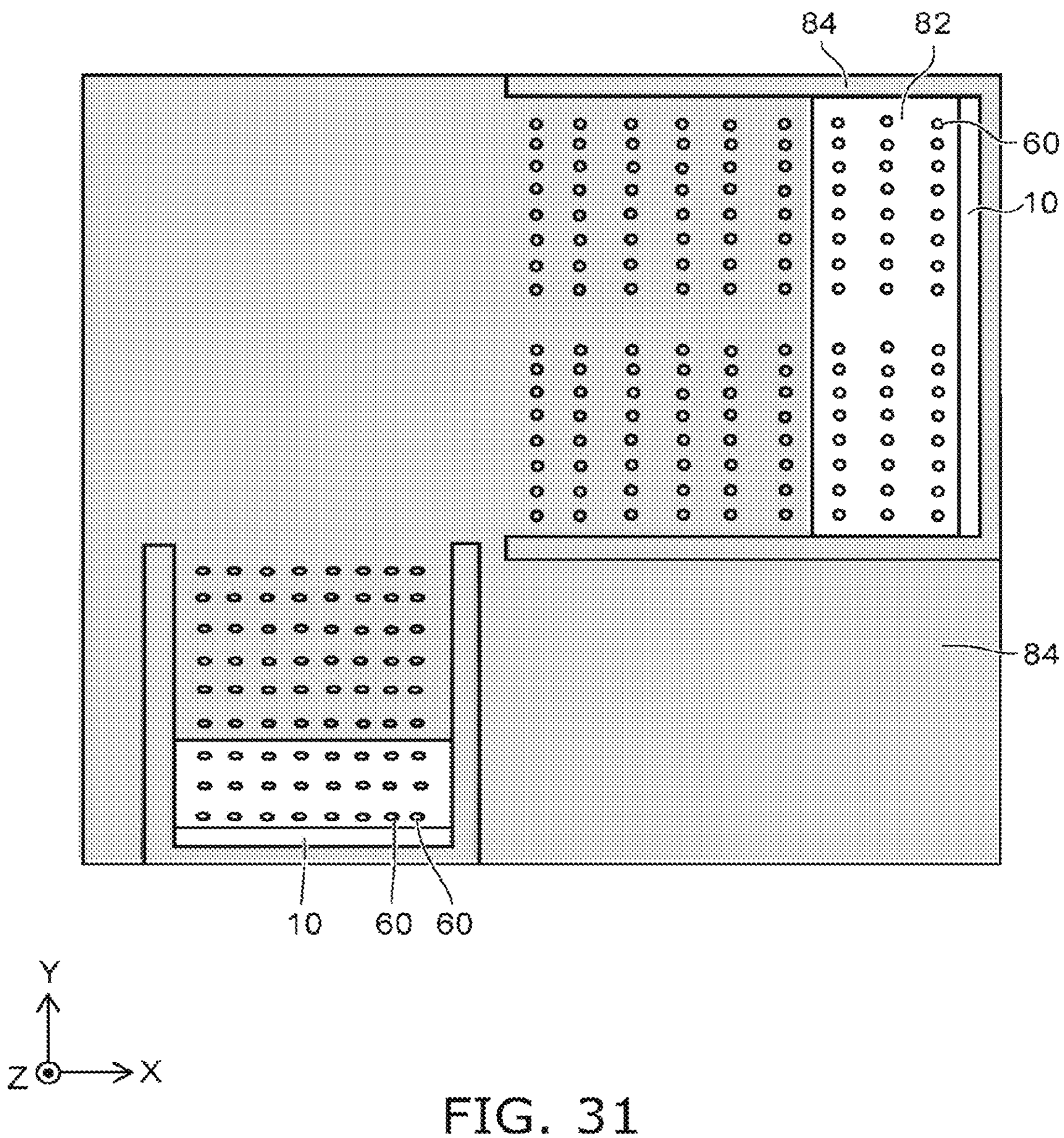

As shown in FIG. 31, after a resist 84 is formed on a part of the protection film 83, for example, using photolithography, other part of the protection film 83 that is not covered with the resist 84 is removed using RIE. The removed protection film 83 is formed on a part of the insulating layer 82, on a part of the inner wall and a part of the bottom surface in the wide part TRa1 of the trench TRa, and on a part of the inner wall and a part of the bottom surface in the wide part TRb1 of the trench TRb. The part on which the resist 84 is formed is shown darkly in FIG. 31 compared with the other part on which the resist 84 is not formed.

Figure 32:
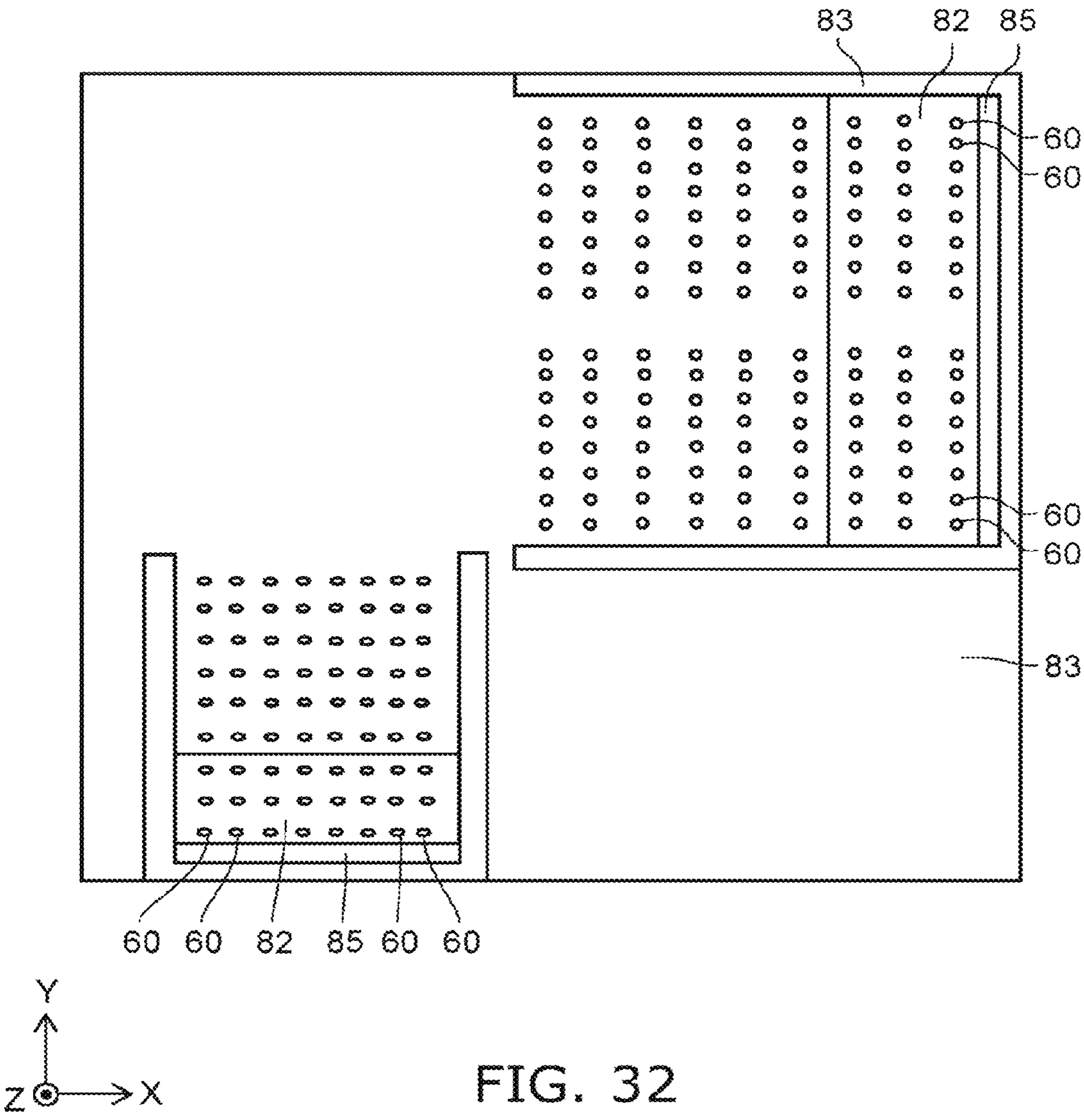

As shown in FIG. 32, after the resist 84 is removed, a film 85 is embedded in the wide part TRa1 of the trench TRa and the wide part TRb1 of the trench TRb. Subsequently, the film 85 is set back downward by etching so that a top surface **85*a* of the film 85 is almost in plane with a top surface 82*a* of the insulating layer 82**.

Then, the processes of the downward etching of the film 85 and the lateral etching of the sacrifice layers 80 are repeated in each of the trenches TRa and TRb as described in FIGS. 12A and 12B to FIGS. 16A and 16B. For example, in the case where the stacked number of the insulating layer 42 and the stacked number of the sacrifice layer 80 are 8, such a downward etching and a lateral etching are implemented 8 times. Thereby, the sacrifice layers 80 in the stacked body **15*a* are formed into stairs, and a step 80*s* is formed in each sacrifice layer 80**.

Then, memory holes 89 are formed in the stacked body **15*a*, and a plurality of columnar bodies CL are formed in the memory holes 89. Subsequently, a plurality of slits 19 are formed in the stacked body 15*a*; the sacrifice layers 80 are removed through the plurality of slits 19; and electrode layers 40 are formed by embedding a conductive layer in hollow spaces 90. Thereby, a stacked body 15 is formed. The electrode layers 40 are formed into stairs in the end portions 15*t*1 and 15*t*2 of the stacked body 15, and a step 40*s* having a width Ws is formed in each of the electrode layers 40**.

As mentioned above, the semiconductor memory device 1 according to the second embodiment is manufactured.

Advantages of the second embodiment are the same as the advantages of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor memory device, comprising:

forming a stacked body on a substrate by alternately stacking a first insulating layer and a first layer;

forming a first trench in the stacked body, the first trench surrounding a part of the stacked body;

forming a protection film and a first film in the first trench;

removing a first portion of the first film by etching in a first direction opposite to a stacking direction of the stacked body;

removing a part of the first layer by etching in a second direction crossing the stacking direction, the first layer being exposed by the removal of the first portion of the first film;

removing a second portion of the first film by etching in the first direction;

further removing a part of the first layer and a part of another first layer by etching in the second direction, the another first layer being exposed by the removal of the second portion of the first film; and embedding an insulating film in hollow spaces provided by the removal of the parts of the first layer and the another first layer, the first trench having a first portion and a second portion, the first portion extending in a third direction crossing the second direction with a first width in the second direction, the second portion extending in the second direction with a second width in the third direction, the second width being smaller than the first width, the first width being not less than 3 times a thickness of the protection film, and the second width being not more than 2 times the thickness of the protection film.

2. The method according to claim 1, further comprising:

forming stairs in an end portion of the stacked body by repeating the etching in the first direction and the etching in the second direction, wherein the number of repetitions of the etchings coincides with the number of steps in the stairs.

3. The method according to claim 1, further comprising:

forming stairs in an end portion of the stacked body by repeating the etching in the first direction and the etching in the second direction with the same number of repetitions as a number of first layers to provide the stairs with the same number of steps as the number of repetitions; and removing the first film in the first trench, wherein the insulating film is formed in the hollow spaces after the removal of the first layers in the hollow spaces and the first trench after the removal of the first film in the first trench.

4. The method according to claim 1, wherein a setback distance in the second direction of the first layer exposed by the removal of the first portion of the first film is almost the same as a setback distance in the second direction of the another first layer exposed by the removal of the second portion of the first film.

5. The method according to claim 1, wherein a setback distance in the first direction of the first film is almost the same as a total thickness of the first insulating layer and the first layer.

6. The method according to claim 1, further comprising:

forming a second trench in the stacked body, the second trench surrounding a part of the stacked body;

forming a second film in the second trench;

removing a first portion of the second film by etching in the first direction;

removing a part of the first layer by etching in a fourth direction crossing the stacking direction, the first layer being exposed by the removal of the first portion of the second film;

removing a second portion of the second film by etching in the first direction; and further removing a part of the first layer and a part of another first layer by etching in the fourth direction, the another first layer being exposed by the removal of the second portion of the second film.

7. The method according to claim 1, further comprising:

forming stairs in an end portion of the stacked body by repeating the etching in the first direction and the etching in the second direction, wherein the insulating film is embedded in the hollow spaces provided next to the stairs.

* * * * *